(12) United States Patent
Okimoto et al.

(10) Patent No.: US 12,144,108 B2
(45) Date of Patent: Nov. 12, 2024

(54) WIRING BOARD AND METHOD FOR MANUFACTURING WIRING BOARD

(71) Applicant: DAI NIPPON PRINTING CO., LTD., Tokyo-to (JP)

(72) Inventors: Naoko Okimoto, Tokyo-to (JP); Kenichi Ogawa, Tokyo-to (JP); Mitsutaka Nagae, Tokyo-to (JP); Makiko Sakata, Tokyo-to (JP); Toru Miyoshi, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 567 days.

(21) Appl. No.: 17/290,633

(22) PCT Filed: Oct. 31, 2019

(86) PCT No.: PCT/JP2019/042916
§ 371 (c)(1),
(2) Date: Apr. 30, 2021

(87) PCT Pub. No.: WO2020/091010
PCT Pub. Date: May 7, 2020

(65) Prior Publication Data
US 2021/0385946 A1    Dec. 9, 2021

(30) Foreign Application Priority Data

Oct. 31, 2018  (JP) .................. 2018-206039
Apr. 10, 2019  (JP) .................. 2019-075182

(51) Int. Cl.
*H05K 1/02*    (2006.01)
*H05K 3/10*    (2006.01)

(52) U.S. Cl.
CPC ......... *H05K 1/0283* (2013.01); *H05K 1/0277* (2013.01); *H05K 3/10* (2013.01);
(Continued)

(58) Field of Classification Search
CPC .............. H05K 1/0283; H05K 3/10; H05K 2203/0271; H05K 2203/1461;
(Continued)

(56) References Cited

U.S. PATENT DOCUMENTS

2004/0192082 A1   9/2004  Wagner et al.
2008/0157235 A1*  7/2008  Rogers ............... H01L 21/8258
                                                                257/415
(Continued)

FOREIGN PATENT DOCUMENTS

CN    107211529 A     9/2017
JP    2007-281406 A   10/2007
(Continued)

OTHER PUBLICATIONS

Aug. 5, 2022 Extended European Search Report issued in European Patent Application No. 19878894.5.
(Continued)

*Primary Examiner* — Steven T Sawyer
(74) *Attorney, Agent, or Firm* — Oliff PLC

(57) ABSTRACT

A wiring board includes a substrate, wiring, and a reinforcing part. The substrate is stretchable, and includes a first surface and a second surface located opposite to the first surface. The wiring is located at the first surface side of the substrate. The reinforcing part overlaps the wiring when viewed in a direction normal to the first surface of the substrate. The substrate has a control region and a non-control region. The control region overlaps the reinforcing part. The non-control region does not overlap the reinforcing part. The non-control region is positioned to sandwich the control region in a direction orthogonal to the direction in which the wiring extends.

20 Claims, 30 Drawing Sheets

(52) U.S. Cl.
CPC .................. *H05K 2201/057* (2013.01); *H05K 2201/09045* (2013.01); *H05K 2201/2009* (2013.01); *H05K 2203/0271* (2013.01); *H05K 2203/1461* (2013.01)

(58) Field of Classification Search
CPC ........... H05K 2201/057; H05K 1/0393; H05K 2201/0154; H05K 2201/09045; H05K 2201/2009; H05K 1/0271; H05K 1/0313; H05K 2201/0145; H05K 1/0277
See application file for complete search history.

(56) References Cited

U.S. PATENT DOCUMENTS

| | | | | |
|---|---|---|---|---|
| 2014/0218872 | A1* | 8/2014 | Park | H05K 1/0283 |
| | | | | 216/13 |
| 2014/0299362 | A1 | 10/2014 | Park et al. | |
| 2015/0173186 | A1* | 6/2015 | Na | H05K 1/0283 |
| | | | | 29/850 |
| 2015/0289364 | A1 | 10/2015 | Ilkko et al. | |
| 2018/0249576 | A1 | 8/2018 | Ogura | |
| 2020/0291273 | A1* | 9/2020 | Kwon | H01B 1/24 |
| 2021/0267050 | A1* | 8/2021 | Obata | H05K 3/4611 |

FOREIGN PATENT DOCUMENTS

| | | |
|---|---|---|
| JP | 5851457 B2 | 2/2016 |
| JP | 2016-143557 A | 8/2016 |
| JP | 2016-219543 A | 12/2016 |
| WO | 2019/074105 A1 | 4/2019 |
| WO | 2019/074111 A1 | 4/2019 |

OTHER PUBLICATIONS

Dec. 10, 2019 Search Report issued in International Patent Application No. PCT/JP2019/042916.
Dec. 28, 2023 Office Action issued in Korean Patent Application No. 10-2021-7016016.
Dec. 29, 2023 Office Action issued in Chinese Patent Application No. 201980072099.7.
Aug. 29, 2024 Office Action issued in Korean Application No. 2021-7016016.

* cited by examiner

|  | BEFORE JOINING | | | AFTER JOINING AND CONTRACTION | | | |
| --- | --- | --- | --- | --- | --- | --- | --- |
|  | FIRST DIRECTION [mm] | SECOND DIRECTION [mm] | RATIO | FIRST DIRECTION [mm] | SECOND DIRECTION [mm] | RATIO | DIRECTION OF RIDGES |
| SAMPLE 1 | 5 | 5 | 1.00 | 4.5 | 4 | 0.89 | IRREGULAR |
| SAMPLE 2 | 5 | 10 | 2.00 | 4.5 | 7.1 | 1.58 | REGULAR |
| SAMPLE 3 | 5 | 20 | 4.00 | 4.6 | 13.8 | 3.00 | REGULAR |
| SAMPLE 4 | 5 | 30 | 6.00 | 4.5 | 20.4 | 4.53 | REGULAR |
| SAMPLE 5 | 2 | 2 | 1.00 | 1.6 | 1.7 | 1.06 | IRREGULAR |
| SAMPLE 6 | 2 | 3 | 1.50 | 1.8 | 2.2 | 1.22 | REGULAR |
| SAMPLE 7 | 2 | 4 | 2.00 | 1.8 | 2.5 | 1.39 | REGULAR |
| SAMPLE 8 | 2 | 5 | 2.50 | 1.9 | 3.3 | 1.74 | REGULAR |
| SAMPLE 9 | 2 | 10 | 5.00 | 1.8 | 6.5 | 3.61 | REGULAR |
| SAMPLE 10 | 2 | 20 | 10.00 | 1.8 | 12.5 | 6.94 | REGULAR |
| SAMPLE 11 | 2 | 30 | 15.00 | 1.9 | 18 | 9.47 | REGULAR |
| SAMPLE 12 | 1 | 2 | 2.00 | 1 | 1.3 | 1.30 | REGULAR |
| SAMPLE 13 | 1 | 3 | 3.00 | 0.9 | 2 | 2.22 | REGULAR |
| SAMPLE 14 | 1 | 5 | 5.00 | 0.9 | 3.1 | 3.44 | REGULAR |
| SAMPLE 15 | 1 | 10 | 10.00 | 0.9 | 6.6 | 7.33 | REGULAR |
| SAMPLE 16 | 0.5 | 1 | 2.00 | 0.4 | 0.6 | 1.50 | REGULAR |
| SAMPLE 17 | 0.5 | 5 | 10.00 | 0.4 | 3.1 | 7.75 | REGULAR |
| SAMPLE 18 | 0.5 | 10 | 20.00 | 0.4 | 6.5 | 16.25 | REGULAR |
| SAMPLE 19 | 0.5 | 20 | 40.00 | 0.5 | 12.5 | 25.00 | REGULAR |
| SAMPLE 20 | 0.5 | 30 | 60.00 | 0.5 | 18.5 | 37.00 | REGULAR |

Fig. 53

WIRING BOARD AND METHOD FOR MANUFACTURING WIRING BOARD

BACKGROUND OF THE INVENTION

Technical Field

Embodiments of the present disclosure relate to a wiring board including a stretchable part and wiring, and a method for manufacturing the wiring board.

Background Art

Electronic devices capable of deformation such as stretching are now being researched. For example, PTL 1 discloses a stretchable wiring board that includes a substrate, and wiring disposed on the substrate. PTL 1 employs a manufacturing method that involves disposing a circuit on a substrate that is elongated in advance, and then relaxing the substrate after the circuit is formed.

CITATION LIST

Patent Literature

PTL 1: Japanese Unexamined Patent Application Publication No. 2007-281406

SUMMARY OF THE INVENTION

If the substrate is elongated by applying tensile stress to the substrate in a first direction and a second direction, and then the substrate is relaxed after wiring is disposed on the substrate, a plurality of wrinkles aligned in the first and second directions are generated on the wiring board including the substrate and the wiring. In this case, wrinkles generated in the first direction, and wrinkles generated in the second direction interfere with each other. This makes it difficult to control the wrinkles.

It is an object of the present disclosure to provide a wiring board and a wiring-board manufacturing method that are capable of effectively addressing the above-mentioned problem.

An embodiment of the present disclosure relates to a wiring board including a substrate, wiring, and a reinforcing part. The substrate is stretchable, and includes a first surface and a second surface located opposite to the first surface. The wiring is located at the first surface side of the substrate. The reinforcing part overlaps the wiring when viewed in a direction normal to the first surface of the substrate. The substrate includes a control region that overlaps the reinforcing part, and a non-control region that does not overlap the reinforcing part, the non-control region being positioned to sandwich the control region in a direction orthogonal to a direction in which the wiring extends.

In the wiring board according to an embodiment of the present disclosure, the reinforcing part may have a greater flexural rigidity or a greater elastic modulus than the substrate.

In the wiring board according to an embodiment of the present disclosure, the reinforcing part may be located at the first surface side of the substrate. In this case, the wiring may be located between the substrate and the reinforcing part. The wiring may be located between the substrate and the wiring.

An embodiment of the present disclosure relates to a wiring board including a substrate, wiring, and a covering part. The substrate is stretchable, and includes a first surface and a second surface located opposite to the first surface. The wiring is located at the first surface side of the substrate. The covering part covers the substrate from the first surface side of the substrate. The covering part has a portion having at least a first thickness and covering the wiring, and a second portion having a thickness smaller than the first thickness. When viewed in a direction normal to the first surface of the substrate, the substrate includes a control region and a non-control region, the control region overlapping the portion of the covering part having at least the first thickness, the non-control region overlapping the portion of the covering part having the thickness smaller than the first thickness, the non-control region being positioned to sandwich the control region in a direction orthogonal to a direction in which the wiring extends.

In the wiring board according to an embodiment of the present disclosure, the covering part may have a greater flexural rigidity or a greater elastic modulus than the substrate.

In the wiring board according to an embodiment of the present disclosure, the dimension of the control region in the direction in which the wiring extends may be greater, for example, 1.5 times or more greater than the dimension of the control region in the direction orthogonal to the direction in which the wiring extends.

In the wiring board according to an embodiment of the present disclosure, the control region may include a plurality of ridges located at the first surface side of the substrate, the plurality of ridges extending across the control region in a direction transverse to the direction in which the wiring extends, the plurality of ridges being arranged in the direction in which the wiring extends, and the non-control region may include a plurality of intersecting ridge groups located at the first surface side of the substrate, the plurality of intersecting ridge groups each including a plurality of ridges that extend in different directions and cross each other.

In the wiring board according to an embodiment of the present disclosure, the ridges in the control region may have a width greater than a width of the ridges in the non-control region.

In the wiring board according to an embodiment of the present disclosure, the ridges in the control region may have an amplitude greater than an amplitude of the ridges in the non-control region.

In the wiring board according to an embodiment of the present disclosure, the control region may include a plurality of ridges located at the second surface side of the substrate. The ridge located at the second surface side of the substrate may have an amplitude smaller than an amplitude of the ridge located at the first surface side of the substrate.

In the wiring board according to an embodiment of the present disclosure, the substrate may include a thermoplastic elastomer, a silicone rubber, a urethane gel, or a silicone gel.

The wiring board according to an embodiment of the present disclosure may further include a support substrate. The support substrate may have a greater elastic modulus than the substrate, and support the wiring. The support substrate may be located between the wiring and the first surface of the substrate, and support the wiring. Alternatively, the support substrate may be located between the substrate and the reinforcing part.

In the wiring board according to an embodiment of the present disclosure, the support substrate may include polyethylene naphthalate, polyimide, polycarbonate, acrylic resin, or polyethylene terephthalate.

The wiring board according to an embodiment of the present disclosure may further include an electronic component electrically connected to the wiring.

An embodiment of the present disclosure relates to a method for manufacturing a wiring board, the method including an elongation step of elongating a substrate by applying tensile stress to the substrate in a first direction and in a second direction transverse to the first direction, the substrate being stretchable, a wiring step of disposing wiring at a location adjacent to a first surface of the substrate that is in an elongated state, and a contraction step of removing the tensile stress from the substrate. The wiring board includes a reinforcing part, the reinforcing part overlapping the wiring when viewed in a direction normal to the first surface of the substrate. The substrate includes a control region that overlaps the reinforcing part overlapping the wiring, and a non-control region that does not overlap the reinforcing part, the non-control region being positioned to sandwich the control region in a direction orthogonal to a direction in which the wiring extends.

In the method according to an embodiment of the present disclosure for manufacturing a wiring board, the reinforcing part may have a greater flexural rigidity or a greater elastic modulus than the substrate.

An embodiment of the present disclosure relates to a method for manufacturing a wiring board, the method including an elongation step of elongating a substrate by applying tensile stress to the substrate in a first direction and in a second direction transverse to the first direction, the substrate being stretchable, a wiring step of disposing wiring at a location adjacent to a first surface of the substrate that is in an elongated state, and a contraction step of removing the tensile stress from the substrate. The wiring board includes a covering part that covers the substrate and the wiring from the first surface side of the substrate. The covering part has a portion having at least a first thickness and covering the wiring, and a second portion having a thickness smaller than the first thickness. When viewed in a direction normal to the first surface of the substrate, the substrate includes a control region and a non-control region, the control region overlapping the portion of the covering part having at least the first thickness, the non-control region overlapping the portion of the covering part having the thickness smaller than the first thickness, the non-control region being positioned to sandwich the control region in a direction orthogonal to a direction in which the wiring extends.

In the method according to an embodiment of the present disclosure for manufacturing a wiring board, the covering part may have a greater flexural rigidity or a greater elastic modulus than the substrate.

In the method according to an embodiment of the present disclosure for manufacturing a wiring board, the dimension of the control region in the direction in which the wiring extends may be greater, for example, 1.5 times or more greater than the dimension of the control region in the direction orthogonal to the direction in which the wiring extends.

The method according to an embodiment of the present disclosure for manufacturing a wiring board may further include a wiring preparation step of disposing the wiring on a support substrate. The wiring step may include a joining step of joining the support substrate on which the wiring is disposed, to the substrate in its elongated state from the first surface side.

Embodiments of the present disclosure make it possible to prevent or inhibit wrinkles extending in different directions from interfering with each other in a region of the substrate where the wiring is disposed.

BRIEF DESCRIPTION OF THE DRAWINGS

FIG. 53 illustrates the respective dimensions of samples of a reinforcing part according to Example 10.

DETAILED DESCRIPTION OF THE INVENTION

The configuration of a wiring board according to embodiments of the present disclosure, and a method for manufacturing the wiring board are described in detail below with reference to the drawings. The embodiments described below are intended to be exemplary embodiments of the present disclosure, and not to be construed as limiting the present disclosure to such embodiments. Furthermore, terms such as "board", "substrate", "sheet", and "film" as used herein are not to be distinguished from each other solely based on their names. For example, the term "board" may conceptually include those parts that can be referred to as substrate, sheet, or film. Furthermore, with regard to, for example, terms such as "parallel" or "orthogonal" and values such as those representing length or angle that are used to define shapes or geometric conditions as well as their extent or degree, these terms and values are not bound by their strict meanings but are to be construed as including a range of shapes and values such that similar functions can be expected. In the figures to which reference is made in the following description of the embodiments, identical or functionally similar features are in some cases designated with identical or like reference signs, and descriptions of such features are not repeated. In some cases, the figures are not drawn to exact scale or proportion for the convenience of illustration, or some features are omitted from the figures.

An embodiment of the present disclosure is now described below with reference to FIGS. 1 to 9.

(Wiring Board)

Figure 1:
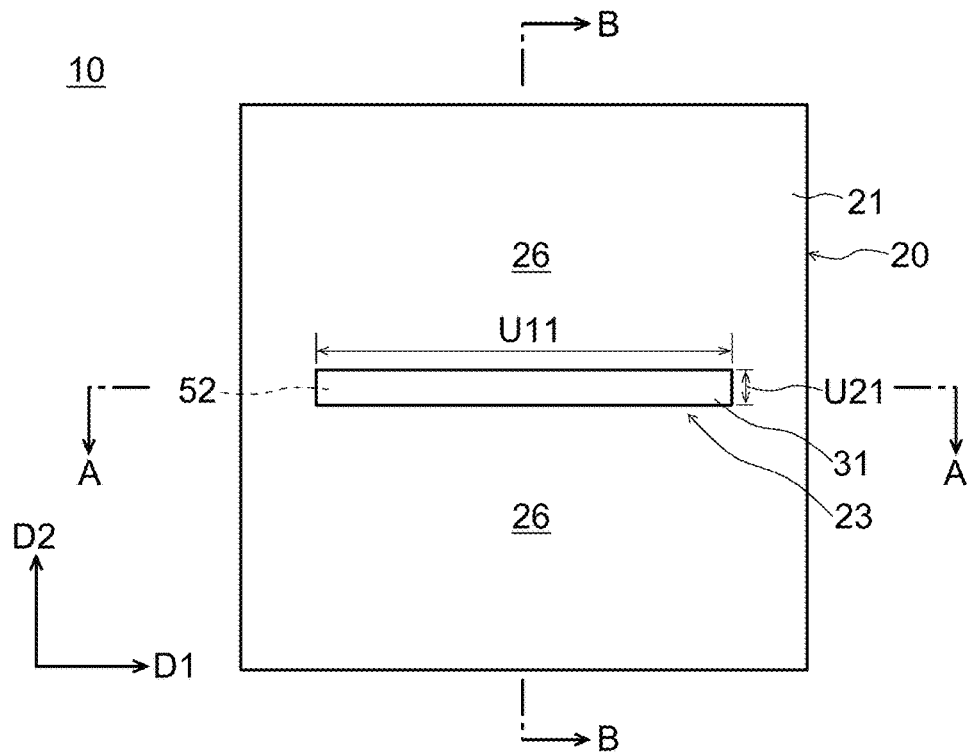
FIG. 1 is a plan view of a wiring board according to an embodiment.
Figure 2:
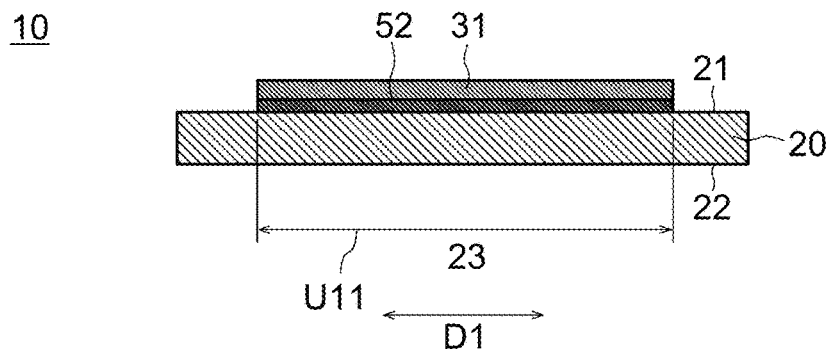
FIG. 2 is a cross-sectional view, taken along a line A-A, of the wiring board illustrated in FIG. 1.
Figure 3:
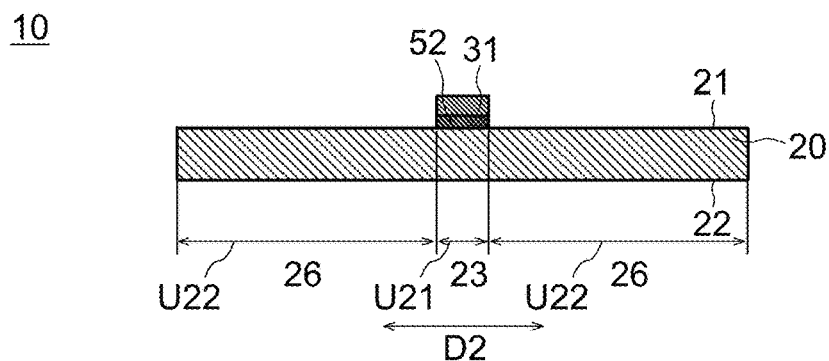
FIG. 3 is a cross-sectional view, taken along a line B-B, of the wiring board illustrated in FIG. 1.

First, a wiring board 10 according to the embodiment is described. FIG. 1 is a plan view of a wiring board 10. FIG. 2 is a cross-sectional view, taken along a line A-A, of the wiring board 10 illustrated in FIG. 1. FIG. 3 is a cross-sectional view, taken along a line B-B, of the wiring board 10 illustrated in FIG. 1.

The wiring board 10 illustrated in FIG. 1 includes at least a substrate 20, wiring 52, and a reinforcing part 31. Various components of the wiring board 10 are described below.

[Substrate]

The substrate 20 is a part designed to be stretchable in at least two directions. The substrate 20 includes a first surface 21 located toward the wiring 52, and a second surface 22 located opposite to the first surface 21. In the example in FIG. 1, when viewed in a direction normal to the first surface 21, the substrate 20 has the shape of a rectangle including a pair of edges extending in a first direction D1, and a pair of edges extending in a second direction D2. In the following description, viewing the wiring board 10 or a component of the wiring board 10 in a direction normal to the first surface 21 is also referred to simply as "plan view".

The first direction D1 and the second direction D2 may be orthogonal to each other as illustrated in FIG. 1, or may not be orthogonal to each other (not illustrated). Tensile stress is applied to the substrate 20 in, for example, the first direction D1 and the second direction D2.

The substrate 20 has a thickness of, for example, greater than or equal to 10 μm and less than or equal to 10 mm, and more preferably greater than or equal to 20 μm and less than or equal to 3 mm. Forming the substrate 20 with a thickness of greater than or equal to 10 μm helps to ensure sufficient durability of the substrate 20. Forming the substrate 20 with a thickness of less than or equal to 10 mm helps to ensure sufficient wearing comfort of the wiring board 10. Making the substrate 20 too thin may in some cases lead to reduced stretchability of the substrate 20.

Stretchability of the substrate 20 refers to a property of the substrate 20 that allows the substrate 20 to elongate or contract, that is, a property that allows the substrate 20 to elongate from its normal, non-elongated state, and restore its original form when released from the elongated state. A non-elongated state refers to the state of the substrate 20 under no applied tensile stress. In the embodiment, a stretchable substrate is capable of elongation from its non-elongated state without breaking of 1% or more, more preferably 20% or more, and further more preferably 75% or more. Using the substrate 20 with such a capability allows the entire wiring board 10 to have stretchability. The stretchability further allows the wiring board 10 to be used for products or applications that require a high degree of stretchability, such as for attachment to a part of a human body such as an arm. Generally, it is said that products designed to be attached under a human arm need to have a stretchability of 72% in the vertical direction and a stretchability of 27% in the horizontal direction. It is said that products designed to be attached to a human knee, elbow, buttock, ankle, or side need to have a stretchability of greater than or equal to 26% and less than or equal to 42% in the vertical direction. It is said that products designed to be attached to other parts of a human body need to have a stretchability of less than 20%.

Preferably, the difference between the shape of the substrate 20 in its non-elongated state, and the shape of the substrate 20 upon return to its non-elongated state after elongation from a non-elongated state is small. This difference is referred to also as a shape change in the following description. The substrate 20 undergoes a shape change in terms of area ratio of less than or equal to 20%, more preferably less than or equal to 10%, and still more preferably less than or equal to 5%. Using the substrate 20 with a small shape change allows for easier control of ridges that form in a control region 23 as will be described later.

An exemplary parameter that can be used to represent the stretchability of the substrate 20 is the elastic modulus of the substrate 20. The substrate 20 has an elastic modulus of, for example, less than or equal to 10 MPa, and more preferably less than or equal to 1 MPa. Using the substrate 20 with such an elastic modulus allows stretchability to be imparted to the entire wiring board 10. In the following description, the elastic modulus of the substrate 20 is referred to also as first elastic modulus. The substrate 20 may have a first elastic modulus of greater than or equal to 1 kPa.

An exemplary method that can be employed to calculate the first elastic modulus of the substrate 20 is to conduct tensile testing in compliance with JIS K6251 by use of a sample of the substrate 20. Another exemplary method that can be employed is to measure the elastic modulus of a sample of the substrate 20 by using nanoindentation in compliance with ISO 14577. The nanoindentation may use a nano indenter as a measuring instrument. Conceivable methods for preparing a sample of the substrate 20 include a method of removing a portion of the substrate 20 as a sample from the wiring board 10, and a method of removing a portion of the substrate 20 as a sample before the wiring board 10 is formed by using the substrate 20. Another exemplary method that can be employed to calculate the first elastic modulus of the substrate 20 is to analyze the material constituting the substrate 20, and calculate the first elastic modulus of the substrate 20 based on an existing database of materials. The elastic modulus according to the present application is defined as elastic modulus under the environment of 25° C.

Another exemplary parameter that can be used to represent the stretchability of the substrate 20 is the flexural rigidity of the substrate 20. Flexural rigidity is the product of the second moment of area of a part of interest, and the elastic modulus of a material constituting the part of interest, and expressed in units of $N \cdot m^2$ or $Pa \cdot m^4$. The second moment of area of the substrate 20 is calculated based on a cross-section of a portion of the substrate 20 overlapping the wiring 52, taken along a plane orthogonal to the direction of stretching or contraction of the wiring board 10.

Exemplary materials for the substrate 20 may include elastomers. Other exemplary suitable materials for the substrate 20 may include cloth such as woven fabric, knitted fabric, or nonwoven fabric. Exemplary suitable elastomers may include common thermoplastic elastomers and thermosetting elastomers, specific examples of which may include polyurethane-based elastomers, styrene-based elastomers, nitrile-based elastomers, olefin-based elastomers, polyvinyl chloride-based elastomers, ester-based elastomers, amide-based elastomers, 1,2-BR elastomers, fluorine-based elastomers, silicone rubber, urethane rubber, fluorine rubber, polybutadiene, polyisobutylene, polystyrene-butadiene, and polychloroprene. Urethane-based elastomers are preferred from the viewpoint of mechanical strength and wear resistance. The substrate 20 may contain silicone such as polydimethylsiloxane. Silicone is preferred as a material for the substrate 20 for its superior heat resistance, chemical resistance, and incombustibility.

[Wiring]

The wiring 52 is an electrically conductive part that is long and narrow when viewed in plan. In the example in FIG. 1, the wiring 52 extends in the first direction D1 in which a pair of edges of the substrate 20 extend.

According to the embodiment, the wiring 52 is located at the first surface 21 side of the substrate 20. As illustrated in FIGS. 2 and 3, the wiring 52 may be in contact with the first surface 21 of the substrate 20. Although not illustrated, another part may be interposed between the first surface 21 of the substrate 20, and the wiring 52.

The wiring 52 is made of a material that allows the wiring 52 to follow the stretching and contraction of the substrate 20 by utilizing the elimination and creation of ridges that will be described later. The material of the wiring 52 may or may not be intrinsically stretchable.

Exemplary suitable materials for the wiring 52 that are intrinsically non-stretchable may include metals such as gold, silver, copper, aluminum, platinum, or chromium, and alloys containing such metals. For the wiring 52 made of an intrinsically non-stretchable material, a metal film is usable as the wiring 52.

If the wiring 52 is made of an intrinsically stretchable material, the material may have, for example, a stretchability similar to the stretchability of the substrate 20. An exemplary intrinsically stretchable material that is usable for the wiring 52 is a conductive composition containing conductive particles and an elastomer. The conductive particles may be any conductive particles that are usable for the wiring, examples of which include gold, silver, copper, nickel, palladium, platinum, and carbon particles. Among these, silver particles are preferably used.

Preferably, the wiring 52 is designed to be tolerant to deformation. For example, the wiring 52 has a base material, and a plurality of conductive particles dispersed within the base material. In this case, using a deformable material such as resin as the base material helps to ensure that as the substrate 20 stretches or contracts, the wiring 52 can also deform. By designing the distribution and shape of the conductive particles such that the contact between the conductive particles is maintained as the wiring 52 undergoes deformation, the conductivity of the wiring 52 can be maintained.

As exemplary base materials for the wiring 52, common thermoplastic elastomers and thermosetting elastomers are usable, examples of which may include styrene-based elastomers, acrylic-based elastomers, olefin-based elastomers, urethane-based elastomers, silicone rubber, urethane rubber, fluorine rubber, nitrile rubber, polybutadiene, and polychloroprene. Among these, resins, rubbers, or other such materials containing urethane-based or silicone-based structures are preferred for their stretchability, durability, or other characteristics. Exemplary suitable materials for the conductive particles of the wiring 52 may include silver, copper, gold, nickel, palladium, platinum, and carbon particles. Among these, silver particles are preferably used.

The wiring 52 may have any thickness that allows the wiring 52 to withstand the stretching or contraction of the substrate 20. The thickness of the wiring 52 is selected as appropriate in accordance with the material of the wiring 52 or other factors.

For instance, if the wiring 52 is made of a non-stretchable material, the wiring 52 may have a thickness within a range of greater than or equal to 25 nm and less than or equal to 100 µm, preferably within a range of greater than or equal to 50 nm and less than or equal to 50 µm, and more preferably within a range of greater than or equal to 100 nm and less than or equal to 5 µm.

If the wiring 52 is made of a stretchable material, the wiring 52 may have a thickness within a range of greater than or equal to 5 µm and less than or equal to 60 µm, preferably within a range of greater than or equal to 10 µm and less than or equal to 50 µm, and more preferably within a range of greater than or equal to 20 µm and less than or equal to 40 µm.

The wiring 52 has a thickness of, for example, greater than or equal to 50 µm and less than or equal to 10 mm.

The width of the wiring 52 is suitably selected according to the value of resistance required for the wiring 52. The wiring 52 has a width of, for example, greater than or equal to 1 µm, and preferably greater than or equal to 50 µm. The wiring 52 may have a width of, for example, less than or equal to 10 mm, preferably less than or equal to 1 mm. According to the embodiment, the wiring 52 has the same width as a width U21 of the control region 23 described later that is defined by the reinforcing part 31.

The method for forming the wiring 52 is suitably selected according to the material of the wiring 52 or other factors. One exemplary method includes forming a metal layer on the substrate 20 or on a support substrate 40 described later by vapor deposition, sputtering, or other methods, and then patterning the metal layer by photolithography. If the wiring 52 is made of an intrinsically stretchable material, the wiring 52 may be formed by, for example, a method that includes printing, by a common printing method, the above-mentioned conductive composition containing conductive particles and an elastomer in the form of a pattern on the substrate 20 or on the support substrate 40. Of the above-mentioned methods, the printing method, which allows for superior material efficiency and low-cost manufacture, may be preferably used.

Reference is now made to the dimensions of the wiring 52 in plan view. As described above, the wiring 52 has a long and narrow shape in plan view. The term "long and narrow shape" means, for example, that if the wiring 52 extends in the first direction D1 as illustrated in FIG. 1, the wiring 52 has, in the first direction D1 in which the wiring 52 extends, a dimension U11 greater than a dimension U21 of the wiring 52 in the second direction D2 orthogonal to the first direction D1. For example, the dimension U11 of the wiring 52 is greater than or equal to 1.1 times the dimension U21. The dimension U11 of the wiring 52 may be greater than or equal to 1.5 times the dimension U21, or may be greater than or equal to 2 times the dimension U21.

[Reinforcing Part]

The reinforcing part 31 is used to prevent or inhibit the wiring 52 from developing wrinkles extending in the same direction as the wiring 52 when the substrate 20 is contracted after being elongated. The reinforcing part 31 is positioned to at least partially overlap the wiring 52 in plan view. According to the embodiment, the reinforcing part 31 is located at the first surface 21 side of the substrate 20. More specifically, the reinforcing part 31 is stacked over the wiring 52 at a location adjacent to the first surface 21. In this case, the reinforcing part 31 may be in contact with the wiring 52, or another layer such as an insulating layer may be interposed between the wiring 52 and the reinforcing part 31. The term "overlap" means that two components overlap each other when viewed in a direction normal to the first surface 21 of the substrate 20.

Although not illustrated, in one example, the reinforcing part 31 may be located at the second surface 22 side of the substrate 20. In another example, the reinforcing part 31 may be embedded in the substrate 20 between the first surface 21 and the second surface 22.

The reinforcing part 31 may have an elastic modulus greater than the first elastic modulus of the substrate 20. The reinforcing part 31 may have an elastic modulus of, for example, greater than or equal to 1 GPa and less than or equal to 500 GPa, and more preferably greater than or equal to 10 GPa and less than or equal to 300 GPa. An excessively low elastic modulus of the reinforcing part 31 may in some cases make it difficult to suppress wrinkles extending in the same direction as the wiring 52. An excessively high elastic modulus of the reinforcing part 31 may cause structural breakage such as fracturing or cracking to occur in the reinforcing part 31 upon stretching or contraction of the substrate 20. The elastic modulus of the reinforcing part 31 may be greater than or equal to 1.1 times and less than or equal to 5000 times, and more preferably greater than or equal to 10 times and less than or equal to 3000 times the first elastic modulus of the substrate 20. In the following description, the elastic modulus of the reinforcing part 31 is referred to also as second elastic modulus.

The second elastic modulus of the reinforcing part 31 is calculated by a method that is suitably determined according to the configuration of the reinforcing part 31. For example, the method for calculating the second elastic modulus of the reinforcing part 31 may or may not be the same as the above-mentioned method for calculating the elastic modulus of the substrate 20. The same applies to the method for calculating the elastic modulus of the support substrate 40 described later. One exemplary method that can be used to calculate the elastic modulus of the reinforcing part 31 or the support substrate 40 is to conduct tensile testing in compliance with ASTM D882 by use of a sample of the reinforcing part 31 or a sample of the support substrate 40.

If the second elastic modulus of the reinforcing part 31 is greater than the first elastic modulus of the substrate 20, a metallic material is usable as a material constituting the reinforcing part 31. The metallic material may be, for example, copper, aluminum, or stainless steel. Exemplary suitable materials for the reinforcing part 31 may include common thermoplastic elastomers, and acrylic-based, urethane-based, epoxy-based, polyester-based, vinyl ether-based, polyene thiol-based or silicone-based oligomers and polymers. If any one of these resins is used as a material for the reinforcing part 31, the reinforcing part 31 may have transparency. The reinforcing part 31 may have light blocking property, for example, ultraviolet blocking property. For example, the reinforcing part 31 may be black. The reinforcing part 31 may have the same color as the substrate 20. The reinforcing part 31 has a thickness of, for example, greater than or equal to 1 μm and less than or equal to 3 mm, and more preferably greater than or equal to 10 μm and less than or equal to 500 μm.

The characteristics of the reinforcing part 31 may be represented by flexural rigidity instead of elastic modulus. The second moment of area of the reinforcing part 31 is calculated based on the cross-section of the reinforcing part 31 taken along a plane orthogonal to the direction in which the wiring 52 extends. The reinforcing part 31 may have a flexural rigidity that is greater than or equal to 1.1 times, more preferably greater than or equal to 2 times, and still more preferably greater than or equal to 10 times the flexural rigidity of the substrate 20.

The method for forming the reinforcing part 31 is suitably selected according to the material of the reinforcing part 31 or other factors. One exemplary method includes forming the wiring 52 on the substrate 20 or on the support substrate 40 described later, and then printing, by a printing method, a material constituting the reinforcing part 31 on the wiring 52.

Reference is now made to the shape of the reinforcing part 31 in plan view. In FIGS. 2 and 3, reference sign U11 denotes the dimension of the reinforcing part 31 in the first direction D1 in which the wiring 52 extends. Reference sign U21 denotes the dimension of the reinforcing part 31 in the second direction D2, which is orthogonal to the first direction D1 in which the wiring 52 extends. The dimension U11 is greater than the dimension U21. For example, the dimension U11 is greater than or equal to 1.1 times the dimension U21. The dimension U11 may be greater than or equal to 1.5 times the dimension U21, or may be greater than or equal to 2 times the dimension U21. The reinforcing part 31 thus has an anisotropy such that the reinforcing part 31 extends in a specific direction. This allows anisotropy to be imparted also to wrinkles that are generated in a portion of the substrate 20 overlapping the reinforcing part 31 upon contraction of the substrate 20. In other words, this helps to prevent or inhibit wrinkles from being generated in a disorderly manner in the portion of the substrate 20 overlapping the reinforcing part 31. As described above, the reinforcing part 31 serves to control the direction in which wrinkles are generated on the substrate 20. In the following description, a region of the substrate 20 that overlaps the reinforcing part 31 is referred to also as control region 23. A region of the substrate 20 that does not overlap the reinforcing part 31 is referred to also as non-control region 26.

In plan view, the control region 23 has the same dimensions as the reinforcing part 31. For example, as with the reinforcing part 31, the control region 23 has the dimension U11 in the first direction D1, and the dimension U21 in the second direction D2.

As illustrated in FIGS. 1 and 3, the non-control region 26 is positioned to sandwich the control region 23 in the second direction D2, which is orthogonal to the first direction D1 in which the wiring 52 and the control region 23 extend. The non-control region 26 has a dimension U22 in the second direction D2 that is greater than the dimension U21 of the control region 23 in the second direction D2. For example, the dimension U22 is greater than or equal to 1.1 times the dimension U21. The dimension U22 may be greater than or equal to 1.5 times the dimension U21, or may be greater than or equal to 2 times the dimension U21.

Figure 4:
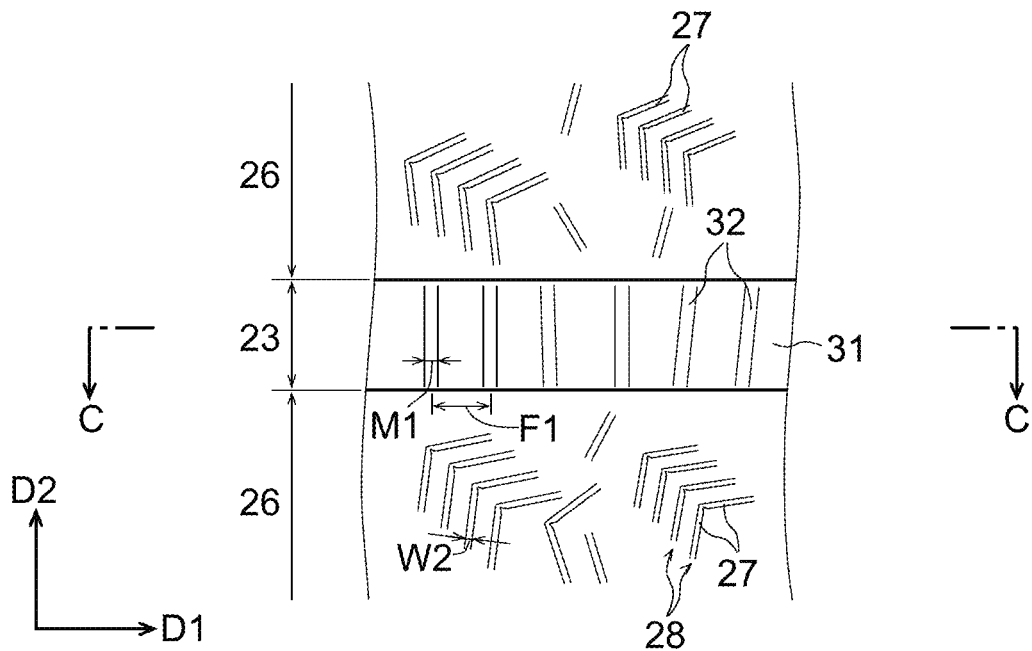
FIG. 4 is an enlarged plan view of control and non-control regions of a wiring board.

Wrinkles that are generated on the substrate 20 are described below in detail with reference to FIG. 4. FIG. 4 is an enlarged plan view of the control region 23 and the non-control region 26 of the wiring board 10.

According to the embodiment, as will be described later, with the substrate 20 in its elongated state due to tensile stress applied to the substrate 20 in two different directions, the wiring 52 is disposed at a location adjacent to the first surface 21 of the substrate 20, and then the tensile stress is removed from the substrate 20. For example, tensile stress is applied to the substrate 20 in the first direction D1 and the second direction D2. When the tensile stress is removed, the substrate 20 contracts in the first direction D1 and the second direction D2. In this case, wrinkles resulting from the contraction of the substrate 20 in the first direction D1, and wrinkles resulting from the contraction of the substrate 20 in the second direction D2 both appear in the non-control region 26. For example, as illustrated in FIG. 4, a plurality of ridges 27 appear in the non-control region 26, the ridges 27 extending in different directions and crossing each other. Each ridge 27 tends to have a greater amplitude and a smaller radius of curvature in a portion of the ridge 27 that intersects another ridge 27 than in other portions of the ridge 27. In the following description, the ridges 27 that extend in different directions and cross each other are referred to also as intersecting ridge group 28. The non-control region 26 may include a plurality of intersecting ridge groups 28.

The control region 23 has an anisotropy such that the control region 23 extends in the first direction D1 as described above. Further, the control region 23 is sandwiched by adjacent portions of the non-control region 26 in the second direction D2, which is transverse to the direction in which the control region 23 extends. Thus, wrinkles resulting from the contraction of the substrate 20 in the second direction D2, which is transverse to the direction in which the control region 23 extends, are unlikely to appear in the control region 23. This means that wrinkles resulting from the contraction of the substrate 20 in the first direction D1 appear in the control region 23. For example, as illustrated in FIG. 4, a plurality of ridges 32 appear in the control region 23, the ridges 32 extending in a direction transverse to the first direction D1 and being arranged in the first direction D1. The ridges 32 may extend across the control region 23 in the direction transverse to the first direction D1 in which the wiring 52 extends.

By controlling the direction in which wrinkles generated in the control region 23 extend, it is possible to prevent or inhibit appearance, in the control region 23, of the ridges 32 that extend in different directions and cross each other. This helps to prevent or inhibit the ridges 32 appearing in the control region 23 from locally increasing in amplitude. This also helps to prevent or inhibit the ridges 32 appearing in the control region 23 from decreasing in radius of curvature. This helps to prevent or inhibit the wiring 52 located in the control region 23 from sustaining damage such as fracturing.

Figure 5:
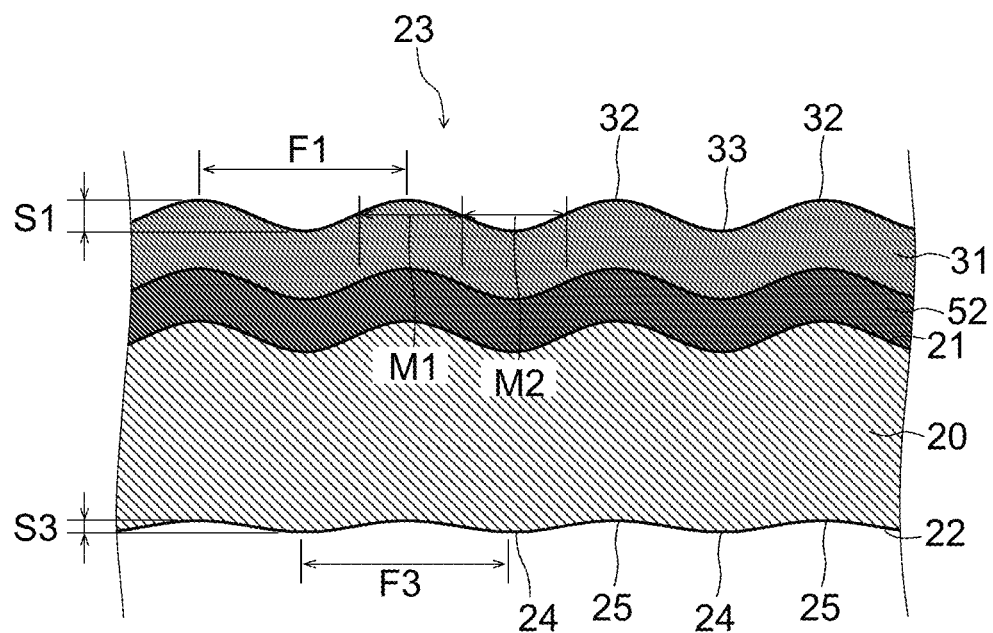
FIG. 5 is a cross-sectional view, taken along a line C-C, of the control region illustrated in FIG. 4.

The ridges 32 in the control region 23 are described below in more detail with reference to FIG. 5. FIG. 5 is a cross-sectional view, taken along a line C-C, of the control region 23 illustrated in FIG. 4.

As illustrated in FIG. 5, the ridges 32 are raised portions of a surface of the wiring board 10 that is located at the first surface 21 side of the substrate 20, the raised portions being raised in a direction normal to the first surface 21. The ridges 32 are arranged in the first direction D1 in which the wiring 52 extends. As illustrated in FIG. 5, a valley 33 is present between each two ridges 32 that are adjacent to each other in the direction in which the wiring 52 extends. In the following description, an area where the ridges 32 and the valleys 33 are arranged repeatedly in a specific direction is referred to also as bellows-shaped part.

In FIG. 5, reference sign S1 denotes the amplitude, in a direction normal to the first surface 21 of the substrate 20, of the ridges 32 arranged in the direction in which the wiring 52 extends. The amplitude S1 is, for example, greater than or equal to 1 μm, and more preferably greater than or equal to 10 μm. Making the amplitude S1 greater than or equal to 10 μm allows the wiring 52 to readily deform following stretching of the substrate 20. The amplitude S1 may be, for example, less than or equal to 500 μm.

The amplitude S1 is calculated as follows, for example. The distance, in the direction normal to the first surface 21, between each ridge 32 and the corresponding valley 33 that are adjacent to each other is measured over a certain range of area in the direction in which the wiring 52 extends, and the mean of such distances is found as the amplitude S1. The "certain range of area in the longitudinal direction of the wiring 52" is, for example, 10 mm. A measuring instrument used to measure distance may be a non-contact type measuring instrument employing a laser microscope or other devices, or may be a contact type measuring instrument. Alternatively, distance may be measured based on an image such as a cross-section photograph. The same applies to the method for calculating an amplitude S3 described later.

In FIG. 5, reference sign F1 denotes the cycle of the ridges 32 arranged in the direction in which the wiring 52 extends. The cycle F1 of the ridges 32 is calculated by measuring, over a certain range of area in the direction in which the wiring 52 extends, the interval between individual ridges 32 in the direction in which the wiring 52 extends, and finding the mean of such intervals. The cycle F1 is, for example, greater than or equal to 10 μm, and more preferably greater than or equal to 100 μm. Making the cycle F1 greater than or equal to 10 μm helps to ensure that the ridges 32 extending in different directions do not cross each other. The cycle F1 is, for example, less than or equal to 100 mm, and more preferably less than or equal to 10 mm.

As described above, with respect to the first direction D1 in which the wiring 52 and the reinforcing part 31 extend, the control region 23 deforms such that the ridges 32 arranged in the first direction D1 appear in the control region 23. One conceivable reason for this is that the dimension U11 of the control region 23 in the first direction D1 is sufficiently large relative to the cycle F1 of the ridges 32. The dimension U11 of the control region 23 in the first direction D1 may be, for example, greater than or equal to 2 times, greater than or equal to 5 times, greater than or equal to 7 times, greater than or equal to 10 times, or greater than or equal to 15 times the cycle F1 of the ridges 32. A conceivable reason why the ridges 32 are not arranged in the second direction D2 transverse to the first direction D1 is that the dimension U21 of the control region 23 in the second direction D2 is not large enough to allow a plurality of ridges 32 to be arranged in a stable manner. The dimension U21 of the control region 23 in the second direction D2 may be, for example, less than or equal to 20 times, less than or equal to 10 times, less than or equal to 7 times, less than or equal to 5 times, or less than or equal to 3 times the cycle F1 of the ridges 32.

As illustrated in FIG. 5, a plurality of ridges 24 and a plurality of valleys 25, which are arranged in the direction in which the wiring 52 extends, may appear also on a surface of the wiring board 10 located at the second surface 22 side of the substrate 20. In the example illustrated in FIG. 5, each ridge 24 located at the second surface 22 side appears at a location overlapping the corresponding valley 33 located at the first surface 21 side, and each valley 25 located at the second surface 22 side appears at a location overlapping the corresponding ridge 32 located at the first surface 21 side.

In FIG. 5, reference sign S3 denotes the amplitude, in the direction normal to the second surface 22 of the substrate 20, of the ridge 24 that appears on a surface of the wiring board 10 located at the second surface 22 side of the substrate 20 and are arranged in the direction in which the wiring 52 extends. The amplitude S3 of the ridge 24 located at the second surface 22 side may or may not be the same as the amplitude S1 of the ridge 32 located at the first surface 21 side. For example, the amplitude S3 of the ridge 24 located at the second surface 22 side may be less than the amplitude S1 of the ridge 32 located at the first surface 21 side. For example, the amplitude S3 of the ridge 24 located at the second surface 22 side may be less than or equal to 0.9 times, less than or equal to 0.8 times, or less than or equal to 0.6 times the amplitude S1 of the ridge 32 located at the first surface 21 side. Further, the amplitude S3 of the ridge 24 located at the second surface 22 side may be greater than or equal to 0.1 times, or greater than or equal to 0.2 times the amplitude S1 of the ridge 32 located at the first surface 21 side. When it is stated herein that "the amplitude S3 of the ridge 24 located at the second surface 22 side is less than the amplitude S1 of the ridge 32 located at the first surface 21 side", this conceptually includes cases where no ridges appear on a surface of the wiring board 10 located at the second surface 22 side.

In FIG. 5, reference sign F3 denotes the cycle of the ridges 24 that appear on a surface of the wiring board 10 located at the second surface 22 side of the substrate 20 and are arranged in the direction in which the wiring 52 extends. As illustrated in FIG. 5, the cycle F3 of the ridges 24 located at the second surface 22 side may be the same as the cycle F1 of the ridges 32 located at the first surface 21 side.

In FIG. 5, reference signs M1 and M2 respectively denote the width of the ridge 32 and the width of the valley 33 in the direction in which the wiring 52 extends when the wiring board 10 is in its non-tensioned state. In the example illustrated in FIG. 5, the width M1 of the ridge 32 and the width M2 of the valley 33 are substantially equal. The ratio of the ridges 32 in the bellows-shaped part with the wiring board 10 in its non-tensioned state is represented by reference sign X1. The ratio X1 is calculated as M1/(M1+M2). The ratio X1 is, for example, greater than or equal to 0.40 and less than or equal to 0.60.

Figure 6:
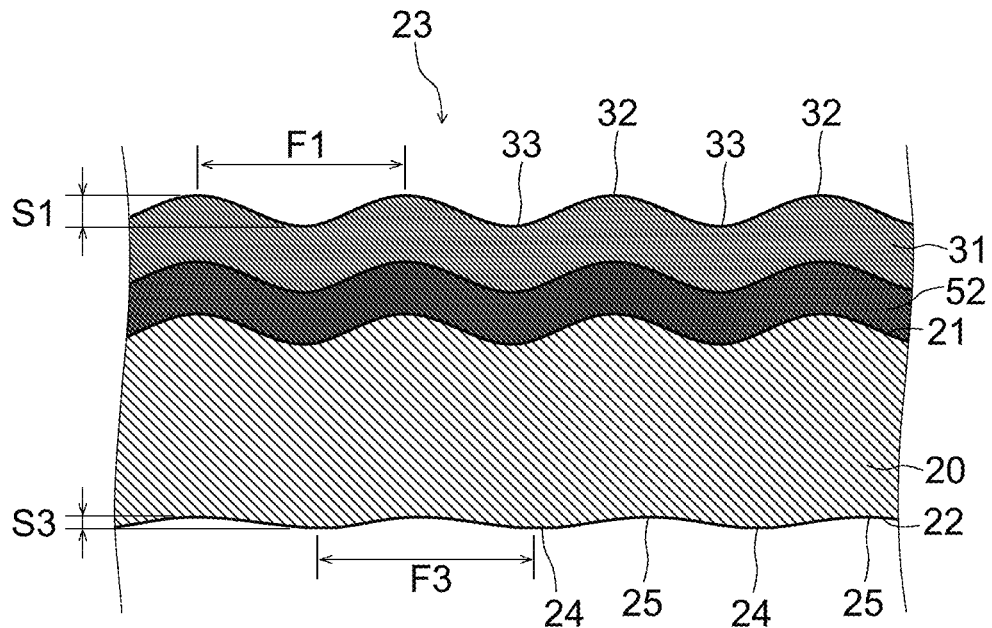
FIG. 6 is another exemplary cross-sectional view, taken along the line C-C, of the control region illustrated in FIG. 4.

FIG. 6 is another exemplary cross-sectional view, taken along the line C-C, of the control region 23 illustrated in FIG. 4. As illustrated in FIG. 6, the cycle F3 of the ridges 24 located at the second surface 22 side may be greater than the cycle F1 of the ridges 32 located at the first surface 21 side. For example, the cycle F3 of the ridges 24 located at the second surface 22 side may be greater than or equal to 1.1 times, greater than or equal to 1.2 times, greater than or equal to 1.5 times, or greater than or equal to 2.0 times the cycle F1 of the ridges 32 located at the first surface 21 side. When it is stated herein that "the cycle F3 of the ridges 24 located at the second surface 22 side is greater than the cycle F1 of the ridges 32 located at the first surface 21 side", this conceptually includes cases where no ridges appear on a surface of the wiring board 10 located at the second surface 22 side.

Figure 7:
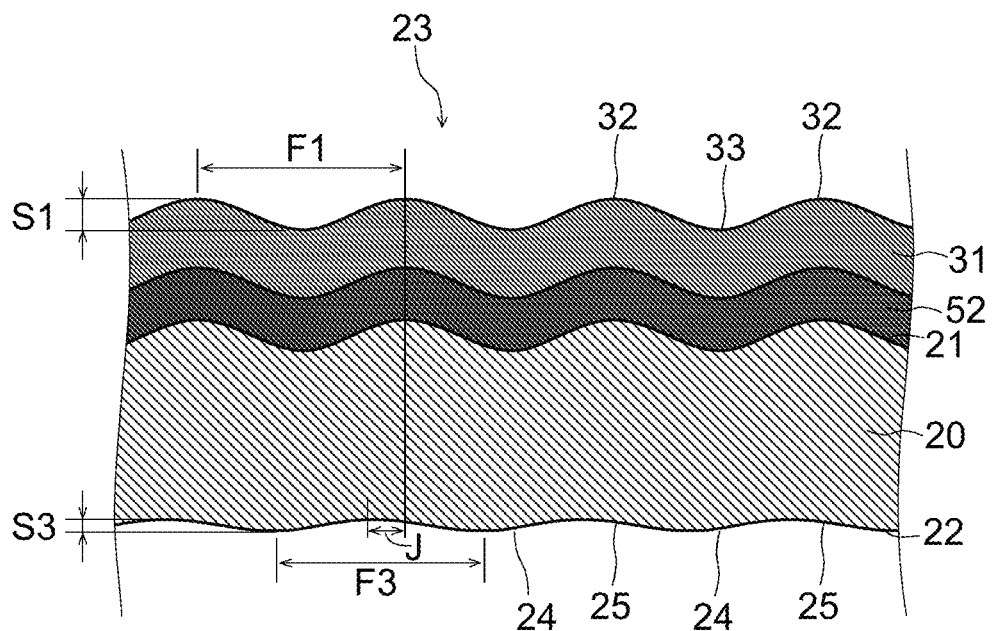
FIG. 7 is another exemplary cross-sectional view, taken along the line C-C, of the wiring board illustrated in FIG. 4.

FIG. 7 is another exemplary cross-sectional view, taken along the line C-C, of the control region 23 illustrated in FIG. 4. As illustrated in FIG. 7, the ridges 24 and the valleys 25 located at the second surface 22 side may be shifted in position by an amount J from where the corresponding valleys 33 and the corresponding ridges 32 located at the first surface 21 side. The amount of shift J may be, for example, greater than or equal to 0.1×F1, or greater than or equal to 0.2×F1.

Figure 8A:
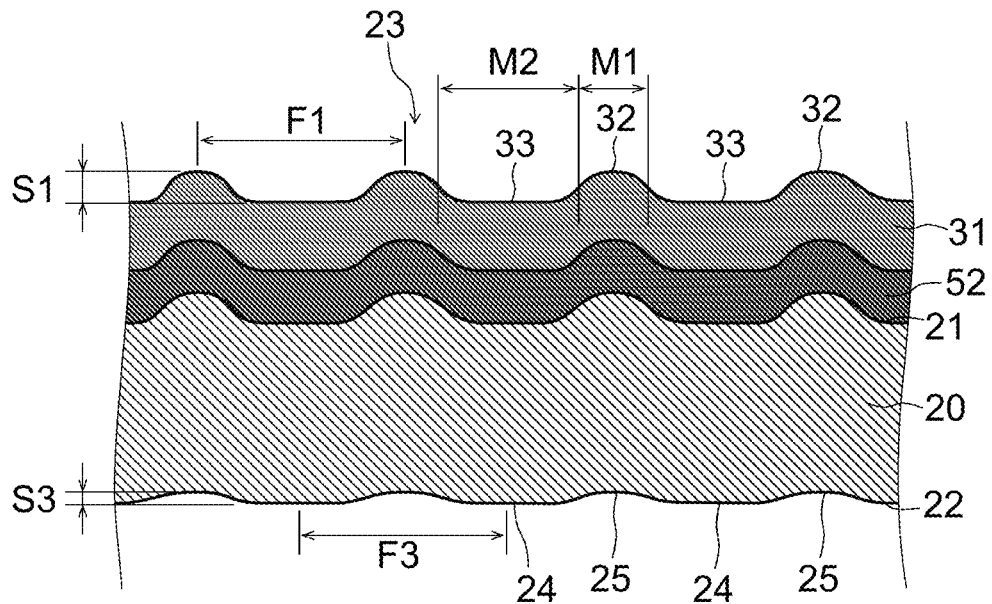
FIG. 8A is another exemplary cross-sectional view, taken along the line C-C, of the control region illustrated in FIG. 4.

FIG. 8A is another exemplary cross-sectional view, taken along the line C-C, of the control region 23 illustrated in FIG. 4. As illustrated in FIG. 8A, the area between each two ridges 32 that are adjacent to each other in the direction in which the wiring 52 extends may define a flat surface. In this case, the amplitude S1 is calculated as follows, for example. The distance, in the direction normal to the first surface 21, between the flat surface and each of adjacent ridges 32 is measured over a certain range of area in the direction in which the wiring 52 extends, and the mean of such distances is found as the amplitude S1.

In FIG. 8A, reference sign M1 denotes the width of the ridge 32 in the direction in which the wiring 52 extends. The width M1 is, for example, greater than or equal to 1 μm, and more preferably greater than or equal to 10 μm. Making the width M1 greater than or equal to 1 μm helps to prevent or inhibit a decrease in the radius of curvature of the ridge 32.

As illustrated in FIG. 8A, when the wiring board 10 is in its non-tensioned state, the width M1 of the ridge 32 in the direction in which the wiring 52 extends may be less than the width M2 of the valley 33. The width M1 of the ridge 32 may be greater than or equal to 0.3 times, greater than or equal to 0.4 times, greater than or equal to 0.5 times, or greater than or equal to 0.6 times the width M2 of the valley 33. Further, the width M1 of the ridge 32 may be less than or equal to 0.9 times, less than or equal to 0.8 times, or less than or equal to 0.7 times the width M2 of the valley 33. In calculating the width M1 of the ridge 32 and the width M2 of the valley 33, the ridge 32 and the valley 33 are discriminated from each other with the midpoint of the amplitude S1 of the bellows-shaped part defined as their boundary.

Figure 8B:
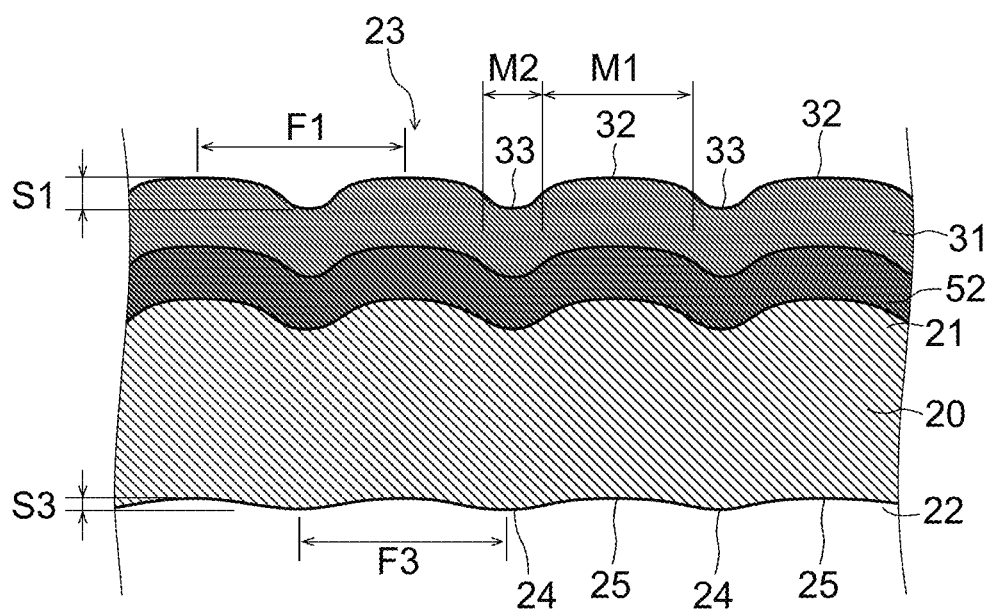
FIG. 8B is another exemplary cross-sectional view, taken along the line C-C, of the control region illustrated in FIG. 4.

As illustrated in FIG. 8B, when the wiring board 10 is in its non-tensioned state, the width M2 of the valley 33 in the direction in which the wiring 52 extends may be less than the width M1 of the ridge 32. The width M2 of the valley 33 may be greater than or equal to 0.05 times, greater than or equal to 0.1 times, greater than or equal to 0.2 times, or greater than or equal to 0.3 times the width M1 of the ridge 32. Further, the width M2 of the valley 33 may be less than or equal to 0.9 times, less than or equal to 0.8 times, or less than or equal to 0.7 times the width M1 of the ridge 32.

The larger the sum of the rigidities of the wiring 52, the reinforcing part 31, and other components located at the first surface 21 side of the substrate 20, the smaller the ratio of the width M2 of the valley 33 to the width M1 of the ridge 32, and consequently, the more likely the overall geometry becomes one depicted in FIG. 8B. Conversely, the smaller the sum of the rigidities of the wiring 52, the reinforcing part 31, and other components located at the first surface 21 side of the substrate 20, the smaller the ratio of the width M1 of the ridge 32 to the width M2 of the valley 33, and consequently, the more likely the overall geometry becomes one depicted in FIG. 8A.

Preferably, the width M1 of the ridge 32 appearing in the control region 23 is greater than the width W2 of the ridge 27 appearing in the non-control region 26. The width M1 of the ridge 32 in the control region 23 may be greater than or equal to 1.1 times, greater than or equal to 1.2 times, greater than or equal to 1.5 times, or greater than or equal to 2.0 times the width W2 of the ridge 27 in the non-control region 26.

(Method for Manufacturing Wiring Board)

A method for manufacturing the wiring board 10 is described below with reference to FIG. 9A to FIG. 9D.

Figure 9A:
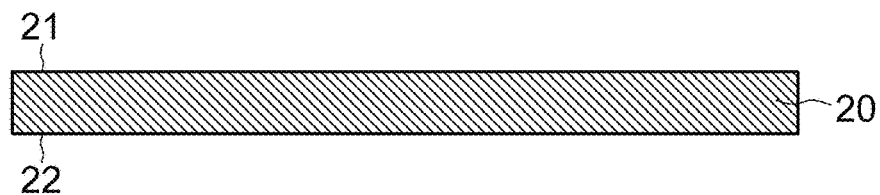
FIG. 9A illustrates a method for manufacturing a wiring board.
Figure 9B:
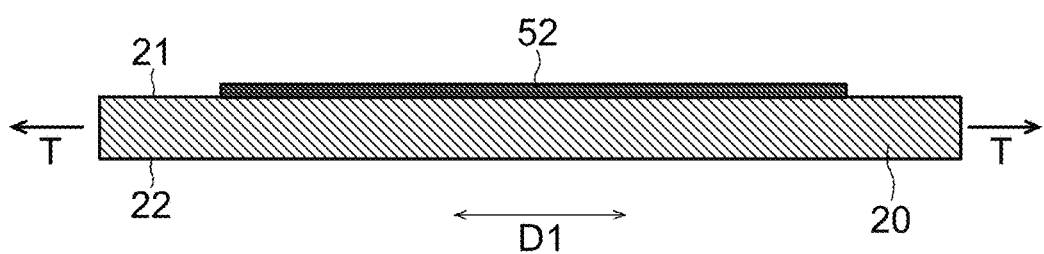
FIG. 9B illustrates a method for manufacturing a wiring board.

First, as illustrated in FIG. 9A, a substrate preparation step is performed. In the substrate preparation step, the substrate 20 having stretchability is prepared. Subsequently, as illustrated in FIG. 9B, an elongation step is performed. In the elongation step, the substrate 20 is elongated by applying a tensile stress T to the substrate 20 in the first direction D1 and in the second direction D2 transverse to the first direction D1. The substrate 20 has a stretch percentage of, for example, greater than or equal to 10% and less than or equal to 200% in the first direction D1 and the second direction D2. The stretching step may be performed with the substrate 20 heated, or may be performed with the substrate 20 at room temperature. If the substrate 20 is to be heated, the substrate 20 is heated to a temperature of, for example, greater than or equal to 50° C. and less than or equal to 100° C.

Figure 9C:
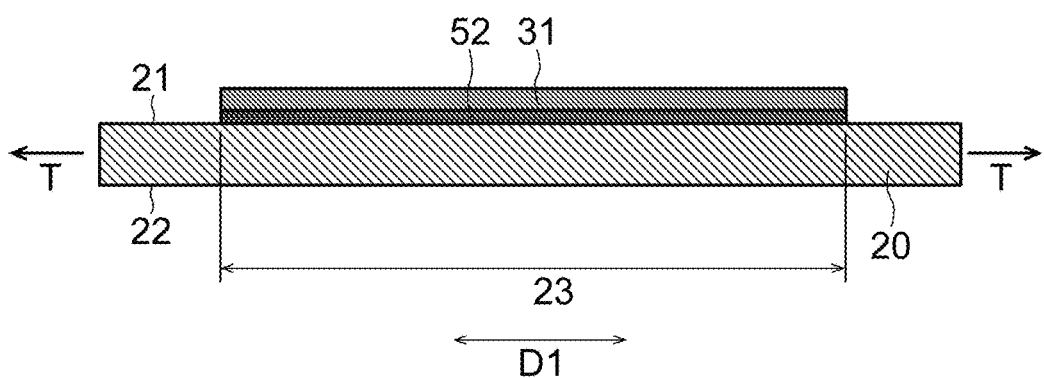
FIG. 9C illustrates a method for manufacturing a wiring board.
Figure 9D:
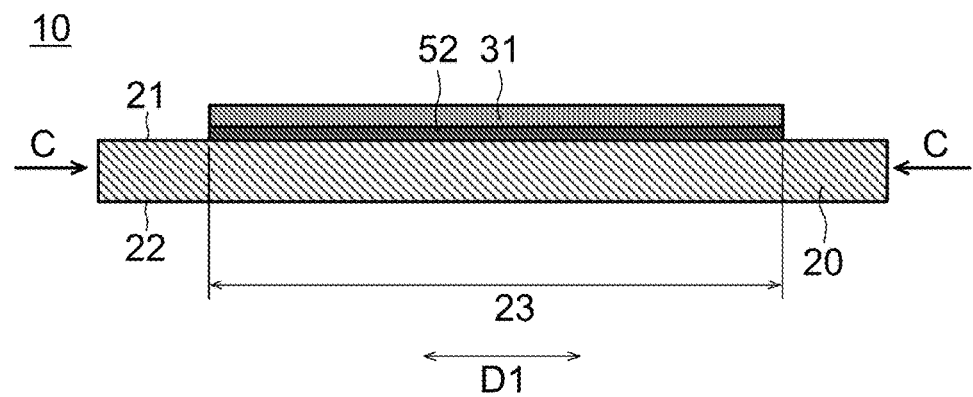
FIG. 9D illustrates a method for manufacturing a wiring board.

Subsequently, as illustrated in FIG. 9C, a wiring step is performed. In the wiring step, the wiring 52 is disposed on the first surface 21 of the substrate 20 that is being elongated due to the tensile stress T. For example, a conductive paste containing a base material and conductive particles is printed onto the first surface 21 of the substrate 20. Further, the reinforcing part 31 is disposed at the first surface 21 side of the substrate 20 that is being elongated due to the tensile stress T. For example, a material including resin that constitutes the reinforcing part 31 is printed onto the wiring 52 by screen printing or other methods.

Subsequently, a contraction step is performed. In the contraction step, the tensile stress T is removed from the substrate 20. Thus, as indicated by arrows C in FIG. 9D, the substrate 20 contracts in the first direction D1 in which the wiring 52 extends. The substrate 20 also contracts in the second direction D2 transverse to the first direction D1.

According to the embodiment, the substrate 20 has the control region 23, which overlaps the reinforcing part 31 overlapping the wiring 52, and the non-control region 26, which does not overlap the reinforcing part 31 and is positioned to sandwich the control region 23 in the second direction D2 orthogonal to the first direction D1 in which the wiring 52 extends. In this case, with respect to the first direction D1 in which the wiring 52 extends, as the substrate 20 contracts in the contraction step, the wiring 52 and the reinforcing part 31 deform following the contraction of the substrate 20, which gives rise to the appearance of the ridges 32 arranged in the first direction D1. This means that when the wiring board 10 is subjected to tensile stress in the first direction D1 during its use, the wiring 52 and the reinforcing part 31 are able to follow the stretching of the substrate 20 by deforming in a manner that reduces the amplitude of the ridges 32, in other words, in a manner that eliminates the ridges 32. This helps to prevent or inhibit the wiring 52 from increasing in overall length or decreasing in cross-sectional area as the substrate 20 is stretched. This in turn helps to prevent or inhibit the resistance of the wiring 52 from increasing due to the stretching of the wiring board 10. It is also possible to prevent or inhibit the wiring 52 from sustaining damage such as cracking.

In the contraction step, with respect to the second direction D2 orthogonal to the first direction D1 in which the wiring 52 extends, the presence of the reinforcing part 31 helps to prevent or inhibit the wiring 52 from deforming as the substrate 20 contracts. This helps to prevent or inhibit formation, in the control region 23, of other ridges extending in a direction different from the ridges 32 arranged in the first direction D1. This helps to prevent or inhibit wrinkles extending in different directions from interfering with each other in the control region 23. As a result, a local increase in the amplitude of the ridges 32 appearing in the control region 23, or a local disturbance in the cycle of the ridges 32 can be prevented or inhibited. For example, as supported by Examples described later, the standard deviation of the cycles of the ridges 32 can be made less than or equal to three-quarters, and more preferably less than or equal to one-half of the mean cycle. According to the embodiment, the ridges 32 form as a result of contraction of the substrate 20, and thus it is not easy to make the standard deviation of the cycles of the ridges 32 zero. The standard deviation of the cycles of the ridges 32 may be, for example, greater than or equal to $\frac{1}{50}$, greater than or equal to $\frac{1}{10}$, or greater than or equal to $\frac{1}{4}$ of the mean cycle. Further, a decrease in the radius of curvature of the ridges 32 appearing in the control region 23 can be prevented or reduced. This helps to prevent or inhibit the wiring 52 located in the control region 23 from sustaining damage such as fracturing. In the contraction step, the substrate 20 undergoes contraction in the non-control region 26 positioned to sandwich the control region 23 in the second direction D2. Thus, if the wiring board 10 is subjected to tensile stress in the second direction D2 during its use, the substrate 20 stretches in the non-control region 26, which also allows the wiring board 10 to elongate.

As described above, the embodiment allows the wiring board 10 to elongate in the first direction D1 and the second direction D2 during its use while preventing or inhibiting the wiring 52 located in the control region 23 from sustaining damage such as fracturing. The wiring board 10 can be thus used for applications that require the wiring board 10 to be stretchable in various directions.

Reference is now made to an exemplary effect obtained due to the ridges 32 appearing on the wiring 52 with respect to the value of resistance of the wiring 52. The value of resistance that the wiring 52 has in a first state, which is a state with no tensile stress applied to the substrate 20 in the first direction D1, is herein referred to as first resistance. The value of resistance that the wiring 52 has in a second state, which is a state with the substrate 20 elongated by 30% relative to the first state by application of tensile stress to the substrate 20 in the first direction D1, is referred to as second resistance. According to the embodiment, due to the presence of the ridges 32 that form on the wiring 52, the ratio of the absolute difference between the first resistance and the second resistance to the first resistance can be made less than or equal to 20%, more preferably less than or equal to 10%, and still more preferably less than or equal to 5%.

Figure 36:
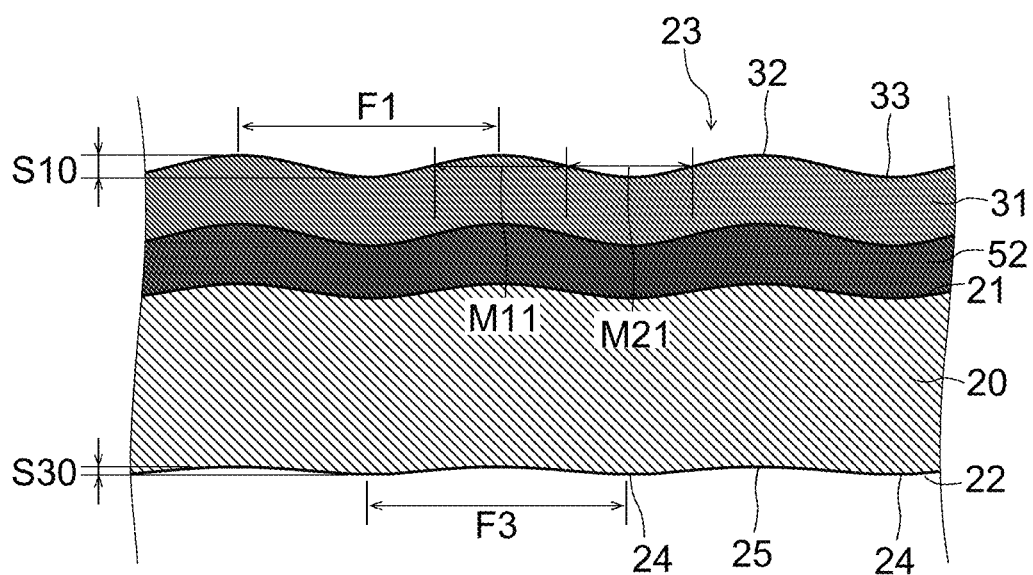
FIG. 36 is an enlarged cross-sectional view of a wiring board in its elongated state.

FIG. 36 is an enlarged cross-sectional view of the wiring board 10 with the wiring board 10 elongated by 25% relative to the first state by application of tension to the wiring board 10 in the first direction D1. In FIG. 36, reference sign S10 denotes the amplitude of the bellows-shaped part with the wiring board 10 elongated by 25%. Reference sign F1 denotes the cycle of the bellows-shaped part with the wiring board 10 elongated by 25%. The amplitude S10 of the bellow-shaped part of the wiring board 10 that is being elongated by 25% may be, for example, less than or equal to 0.8 times, less than or equal to 0.7 times, or less than or equal to 0.6 times the amplitude S1 of the bellows-shaped part of the wiring board 10 in its non-elongated state. The amplitude S10 may be, for example, greater than or equal to 0.2 times, greater than or equal to 0.3 times, or greater than or equal to 0.4 times the amplitude S1.

In FIG. 36, reference signs M11 and M21 denote the respective widths, in the direction in which the wiring 52 extends, of the ridge 32 and valley 33 of the bellows-shaped part of the wiring board 10 that is being elongated by 25%. As illustrated in FIG. 36, the width M11 of the ridge 32 and the width M21 of the valley 33 of the wiring board 10 that is being elongated by 25% are greater than the width M1 of the ridge 32 and the width M2 of the valley 33 of the wiring board 10 in its non-elongated state.

In elongating the wiring board 10, the respective widths of the ridge 32 and valley 33 of the bellows-shaped part may be increased while maintaining their relative ratios. The ratio of the ridges 32 in the bellows-shaped part with the wiring board 10 in its non-tensioned state is represented by reference sign X2. The ratio X2 is calculated as M11/(M11+M21). The ratio X2 is substantially equal to the above-mentioned ratio X1 for the wiring board 10 in its non-tensioned state, and is, for example, greater than or equal to 0.40 and less than or equal to 0.60. The absolute difference between the ratio X1 and the ratio X2 may be, for example, less than or equal to 0.20, less than or equal to 0.15, less than or equal to 0.10, less than or equal to 0.08, less than or equal to 0.06, or less than or equal to 0.04.

The following provides exemplary measurements of how much the amplitude of the bellows-shaped part of the wiring board 10 as well as the respective widths of the ridge 32 and the valley 33 change before and after the application of tension. In each of Case 1 and Case 2 below, the wiring 52 is made of copper, has a thickness of 1 μm, and has a width of 200 μm. The percent elongation of the substrate 20 in the wiring step described later is 60%. The percent elongation of the substrate 20 is 25% at the time when the amplitude of the bellows-shaped part as well as the respective widths of the ridge 32 and the valley 33 are measured with the wiring board 10 in its tensioned state.

(Case 1)
With no tension applied to the wiring board 10
    Amplitude S1 of the bellows-shaped part: 192 μm
    Width M1 of the ridge 32: 254 μm
    Width M2 of the valley 33: 286 μm
    Ratio X1 of ridges: 254/(254+286)=0.47
With the wiring board 10 elongated by 1.25 times by application of tension
    Amplitude S10 of the bellows-shaped part: 108 μm
    Width M11 of the ridge 32: 296 μm
    Width M21 of the valley 33: 370 μm
    Ratio X2 of ridges: 296/(296+370)=0.44
    S10/S1=0.56
(Case 2)
With no tension applied to the wiring board 10
    Amplitude S1 of the bellows-shaped part: 256 μm
    Width M1 of the ridge 32: 322 μm
    Width M2 of the valley 33: 318 μm
    Ratio X1 of ridges: 322/(322+318)=0.50
With the wiring board 10 elongated by 1.25 times by application of tension
    Amplitude S10 of the bellows-shaped part: 140 μm
    Width M11 of the ridge 32: 386 μm
    Width M21 of the valley 33: 418 μm
    Ratio X2 of ridges: 386/(386+418)=0.48
    S10/S1=0.54

Exemplary fields of application of the wiring board 10 may include healthcare, medical care, nursing, electronics, sports/fitness, beauty care, mobility, stock breeding/pets, amusement, fashion/apparel, security, military, distribution, education, building materials/furniture/decoration, environmental energy, forestry and fisheries, and robotics. For example, products designed for attachment to a part of a human body such as an arm are fabricated by using the wiring board 10 according to the present embodiment. The stretchability of the wiring board 10 helps to ensure, for example, tight contact of the wiring board 10 with a part of a human body when attached to the human body in its elongated state. This helps to provide superior wearing comfort. Further, due to the ability to prevent or inhibit the resistance of the wiring 52 from decreasing upon stretching of the wiring board 10, superior electrical characteristics of the wiring board 10 can be achieved. Moreover, the wiring board 10 is capable of elongation, which allows the wiring board 10 to be installed or incorporated in a manner that conforms not only to the body of a living creature such as a human being but also to a curved surface or a three-dimensional shape. Examples of the above-mentioned products may include vitals sensors, masks, hearing aids, toothbrushes, adhesive plasters, poultices, contact lenses, prosthetic arms, prosthetic legs, artificial eyes, catheters, gauze, medicine packs, bandages, disposable bioelectrodes, diapers, rehabilitation equipment, consumer electronics, displays, signage, personal computers, mobile phones, mouses, speakers, sportswear, wristbands, headbands, gloves, swimsuits, athletic supporters, balls, sports gloves, rackets, clubs, bats, fishing rods, relay batons/gymnastics items or grips thereof, physical training equipment, swim rings, tents, swimsuits, number clothes, goal nets, goal tapes, impregnated beauty masks, electrostimulation slimming products, heating packs, artificial nails, tattoos, seats for vehicles such as automobiles, airplanes, trains, ships, bicycles, baby strollers, drones, or wheelchairs, instrument panels, tires, interior materials, exterior materials, saddles, handles, roads, rails, bridges, tunnels, gas or water pipes, electric wires, tetrapods, rope collars, leashes, harnesses, animal tags, bracelets, belts, game consoles, haptics devices such as controllers, luncheon mats, tickets, dolls, stuffed toys, cheering goods, hats, clothes, glasses, shoes, insoles, socks, stockings, slippers, innerwear, scarfs, earmuffs, bags, accessories, finger rings, timepieces, neckties, personal ID recognition devices, helmets, packages, IC tags, PET bottles, stationery, books, pens, carpets, sofas, bedclothes, lightings, door knobs, vases, beds, mattresses, cushions, curtains, doors, windows, ceilings, walls, floors, wireless power antennas, batteries, plastic greenhouses, nets, robotic hands, and robot exteriors.

Various changes can be made to the embodiment described above. Modifications of the embodiment are described below with reference to the drawings as required. In the following description and the drawings used in the following description, features that may be similar in configuration to those of the above-mentioned embodiment are designated by the same reference signs as those used for the corresponding features in the above-mentioned embodiment, and descriptions of such features are not repeated. In the following description, when it is obvious that a modification provides the same operational effect as that provided by the embodiment mentioned above, a description of such an operational effect is omitted in some cases.

First Modification

Figure 10:
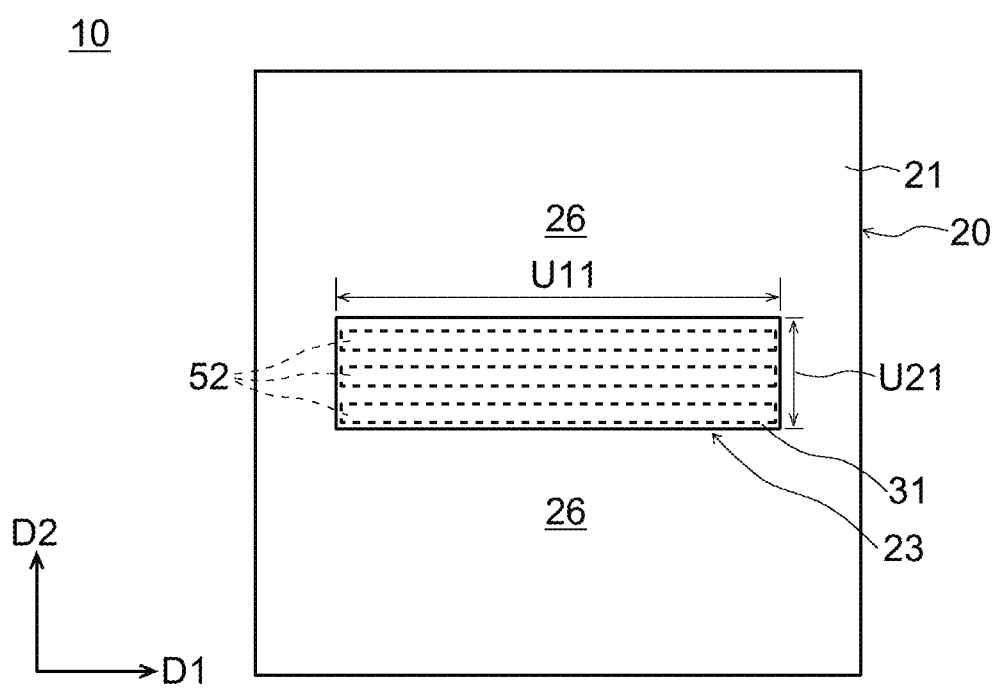
FIG. 10 is a plan view of a wiring board according to a first modification.

FIG. 10 is a plan view of the wiring board 10 according to a first modification. As illustrated in FIG. 10, the reinforcing part 31 defining the control region 23 may extend so as to overlap a plurality of pieces of the wiring 52 extending in the first direction D1 and arranged in the second direction D2. The configuration of the wiring board 10 illustrated in FIG. 10 also helps to prevent or inhibit appearance, in the control region 23, of the ridges 32 extending in different directions and crossing each other.

Second Modification

Figure 11:
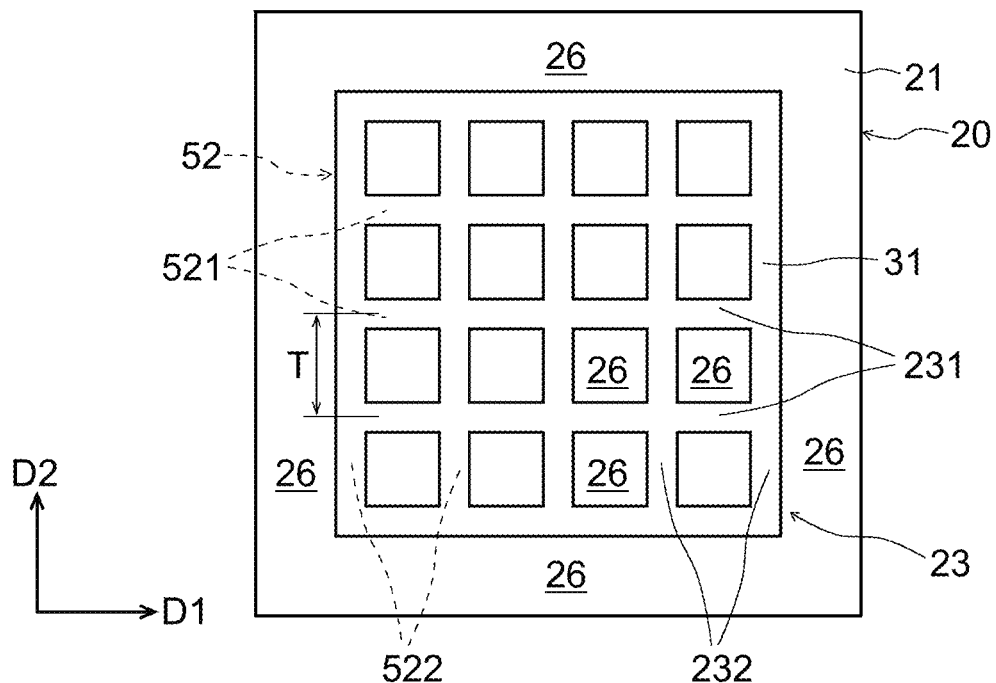
FIG. 11 is a plan view of a wiring board according to a second modification.

FIG. 11 is a plan view of the wiring board 10 according to a second modification. In the example illustrated in FIG. 11, the wiring 52 includes first wiring 521 extending in the first direction D1, and second wiring 522 extending in the second direction D2 transverse to the first direction D1. The first wiring 521 and the second wiring 522 may intersect each other. For example, as illustrated in FIG. 11, the first wiring 521 and the second wiring 522 may be arranged such that the wiring 52 defines a grid-like pattern.

As illustrated in FIG. 11, as with the wiring 52, the reinforcing part 31 likewise includes a portion extending in the first direction D1, and a portion extending in the second direction D2. In this case, the control region 23 defined by the reinforcing part 31 likewise includes a first control region 231 extending in the first direction D1, and a second control region 232 extending in the second direction D2 transverse to the first direction D1. According to the second modification, an area bounded by the first control region 231 and the second control region 232 defines the non-control region 26. The non-control region 26 is positioned to sandwich the second control region 232 in the first direction D1. Further, the non-control region 26 is positioned to sandwich the first control region 231 in the second direction D2.

Figure 12:
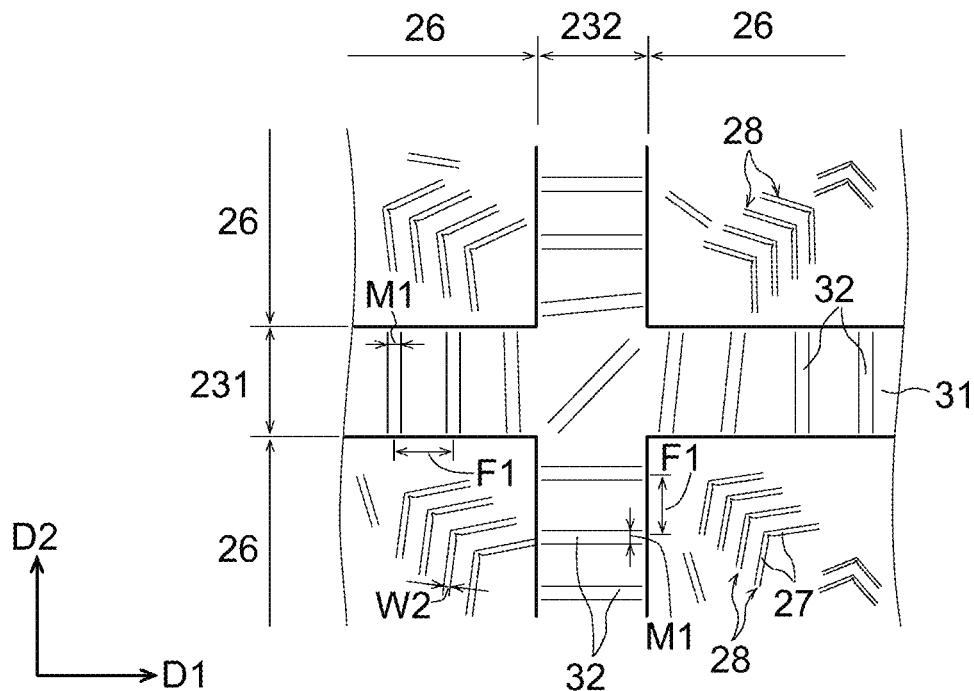
FIG. 12 is an enlarged plan view of control and non-control regions of the wiring board illustrated in FIG. 11.

FIG. 12 is an enlarged plan view of the control region 23 and the non-control region 26 of the wiring board 10 illustrated in FIG. 11.

According to the second modification as well, in a manufacturing process of the wiring board 10, with the substrate 20 in its elongated state due to tensile stress applied to the substrate 20 in two different directions, the wiring 52 is disposed on the first surface 21 of the substrate 20, and then the tensile stress is removed from the substrate 20. For example, tensile stress is applied to the substrate 20 in the first direction D1 and the second direction D2, and then the tensile stress is removed from the substrate 20. In this case, as with the above-mentioned embodiment, the ridges 27 extending in different directions and crossing each other appear in the non-control region 26 as illustrated in FIG. 12.

The control region 23 includes the first control region 231, which has an anisotropy such that the first control region 231 extends in the first direction D1, and the second control region 232, which has an anisotropy such that the second control region 232 extends in the second direction D2.

The first control region 231 is sandwiched by adjacent portions of the non-control region 26 in the second direction D2. Thus, wrinkles resulting from the contraction of the substrate 20 in the second direction D2 are unlikely to appear in the first control region 231. This means that wrinkles resulting from the contraction of the substrate 20 in the first direction D1 appear in the first control region 231. For example, as illustrated in FIG. 12, the ridges 32 extending in a direction transverse to the first direction D1 and arranged in the first direction D1 appear in the first control region 231. The ridge 32 may extend across the first control region 231 in the direction transverse to the first direction D1.

The second control region 232 is sandwiched by adjacent portions of the non-control region 26 in the first direction D1. Thus, wrinkles resulting from the contraction of the substrate 20 in the first direction D1 are unlikely to appear in the second control region 232. This means that wrinkles resulting from the contraction of the substrate 20 in the second direction D2 appear in the second control region 232. For example, as illustrated in FIG. 12, the ridges 32 extending in a direction transverse to the second direction D2 and arranged in the second direction D2 appear in the second control region 232. The ridge 32 may extend across the first control region 231 in the direction transverse to the second direction D2.

As illustrated in FIG. 12, the ridge 32 may also appear in a portion of the control region 23 where the first control region 231 and the second control region 232 cross each other. The ridge 32 may extend in any direction. For example, as illustrated in FIG. 12, the ridge 32 may extend in a direction different from both the first direction D1 and the second direction D2.

According to the second modification as well, by controlling the direction in which wrinkles appearing in the control region 23 including the first and second control regions 231 and 232 extend, it is possible to prevent or inhibit appearance, in the control region 23, of the ridges 32 that extend in different directions and cross each other. This helps to prevent or inhibit the ridges 32 appearing in the control region 23 from locally increasing in amplitude. This also helps to prevent or inhibit the ridges 32 appearing in the control region 23 from decreasing in radius of curvature. This helps to prevent or inhibit the wiring 52 located in the control region 23 from sustaining damage such as fracturing.

Third Modification

Figure 13:
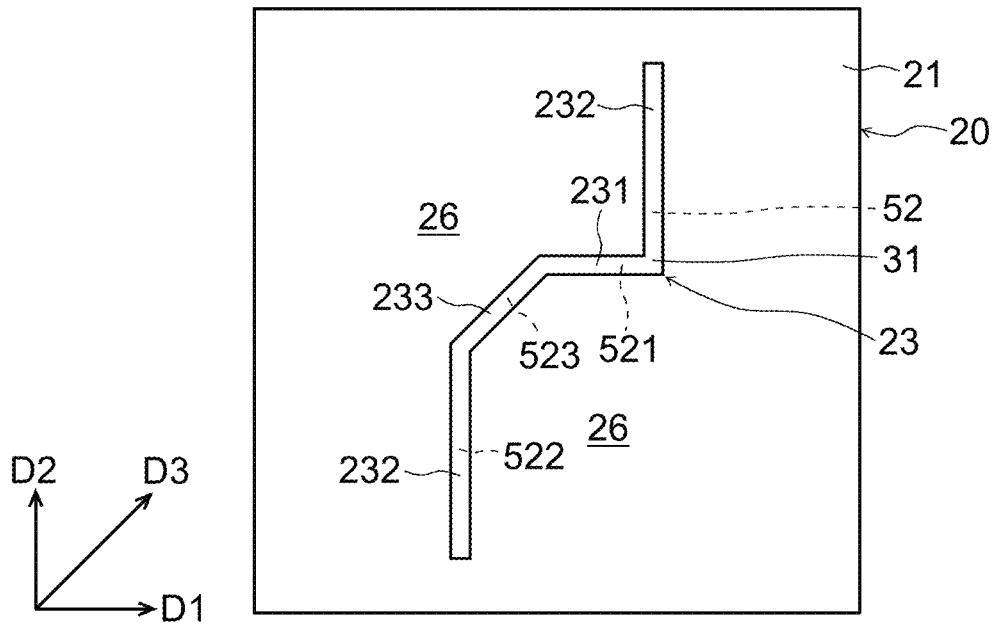
FIG. 13 is a plan view of a wiring board according to a third modification.

FIG. 13 is a plan view of the wiring board 10 according to a third modification. In the example illustrated in FIG. 13, the wiring 52 includes the first wiring 521 extending in the first direction D1, the second wiring 522 extending in the second direction D2 transverse to the first direction D1, and third wiring 523 located between the first wiring 521 and the second wiring 522 and extending in a third direction D3 transverse to the first direction D1 and to the second direction D2. In this case, as with the wiring 52, the reinforcing part 31 likewise includes a portion extending in the first direction D1, a portion extending in the second direction D2, and a portion extending in the third direction D3. Accordingly, the control region 23 defined by the reinforcing part 31 also includes the first control region 231 extending in the first direction D1, the second control region 232 extending in the second direction D2 transverse to the first direction D1, and a third control region 233 located between the first control region 231 and the second control region 232 and extending in the third direction D3 transverse to the first direction D1 and to the second direction D2.

As illustrated in FIG. 13, the non-control region 26 is positioned to sandwich the first control region 231 in the second direction D2 orthogonal to the first direction D1. The non-control region 26 is positioned to sandwich the second control region 232 in the first direction D1 orthogonal to the second direction D2. The non-control region 26 is positioned to sandwich the third control region 233 in a direction orthogonal to the third direction D3.

Figure 14:
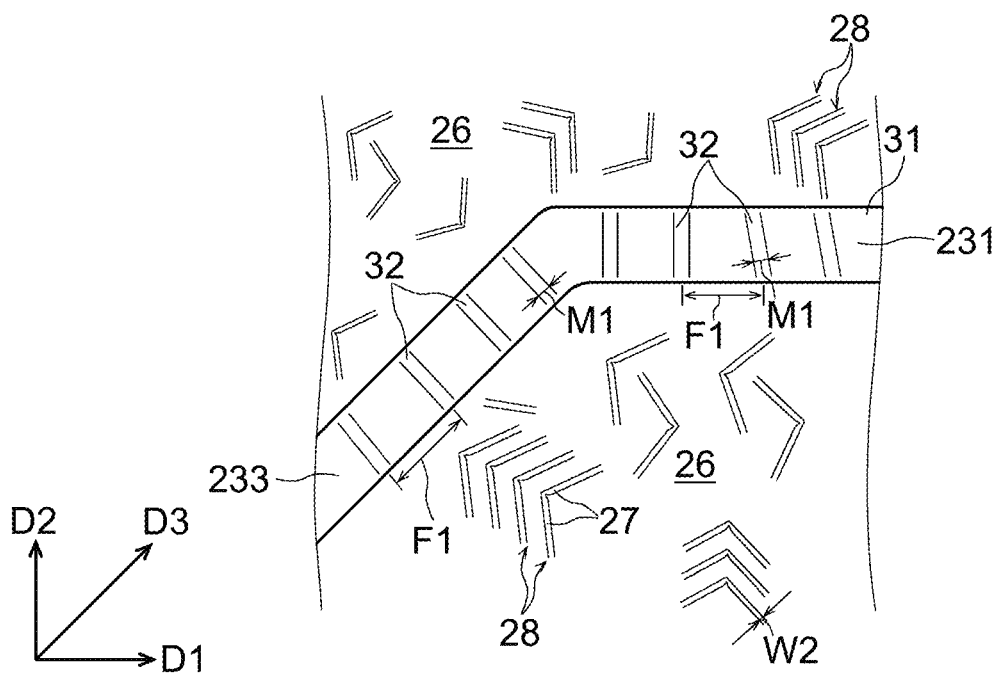
FIG. 14 is an enlarged plan view of control and non-control regions of the wiring board illustrated in FIG. 13.

FIG. 14 is an enlarged plan view of the control region 23 and the non-control region 26 of the wiring board 10 illustrated in FIG. 13.

According to the third modification as well, in a manufacturing process of the wiring board 10, with the substrate 20 in its elongated state due to tensile stress applied to the substrate 20 in two different directions, the wiring 52 is disposed on the first surface 21 of the substrate 20, and then the tensile stress is removed from the substrate 20. For example, tensile stress is applied to the substrate 20 in the first direction D1 and the second direction D2, and then the tensile stress is removed from the substrate 20. In this case, as with the above-mentioned embodiment, the ridges 27 extending in different directions and crossing each other appear in the non-control region 26 as illustrated in FIG. 14.

The control region 23 includes the first control region 231, which has an anisotropy such that the first control region 231 extends in the first direction D1, the second control region 232, which has an anisotropy such that the second control region 232 extends in the second direction D2, and the third control region 233, which has an anisotropy such that the third control region 233 extends in the third direction D3.

As with the second modification mentioned above, in the first control region 231, the ridges 32 extending in a direction transverse to the first direction D1 and arranged in the first direction D1 appear, and in the second control region 232, the ridges 32 extending in a direction transverse to the second direction D2 and arranged in the second direction D2 appear.

If tensile stress is applied to the substrate 20 in the first direction D1 and the second direction D2 and then the tensile stress is removed from the substrate 20, the substrate 20 contracts in the third direction D3, which is transverse to the first direction D1 and the second direction D2, and in a direction orthogonal to the third direction D3. The third control region 233 is sandwiched by adjacent portions of the non-control region 26 in the direction orthogonal to the third direction D3. Thus, wrinkles resulting from the contraction of the substrate 20 in the direction orthogonal to the third direction D3 are unlikely to appear in the third control region 233. This means that in the third control region 233, wrinkles resulting from the contraction of the substrate 20 in the third direction D3 appear. For example, as illustrated in FIG. 14, the ridges 32 extending in a direction transverse to the third direction D3 and arranged in the third direction D3 appear in the third control region 233. The ridge 32 may extend across the third control region 233 in the direction transverse to the third direction D3.

According to the third modification as well, by controlling the direction in which wrinkles appearing in the control region 23 including the first, second, and third control regions 231, 232, and 233 extends, it is possible to prevent or inhibit appearance, in the control region 23, of the ridges 32 that extend in different directions and cross each other. This helps to prevent or inhibit the ridges 32 appearing in the control region 23 from locally increasing in amplitude. This also helps to prevent or inhibit the ridges 32 appearing in the control region 23 from decreasing in radius of curvature. This helps to prevent or inhibit the wiring 52 located in the control region 23 from sustaining damage such as fracturing.

Fourth Modification

Figure 15:
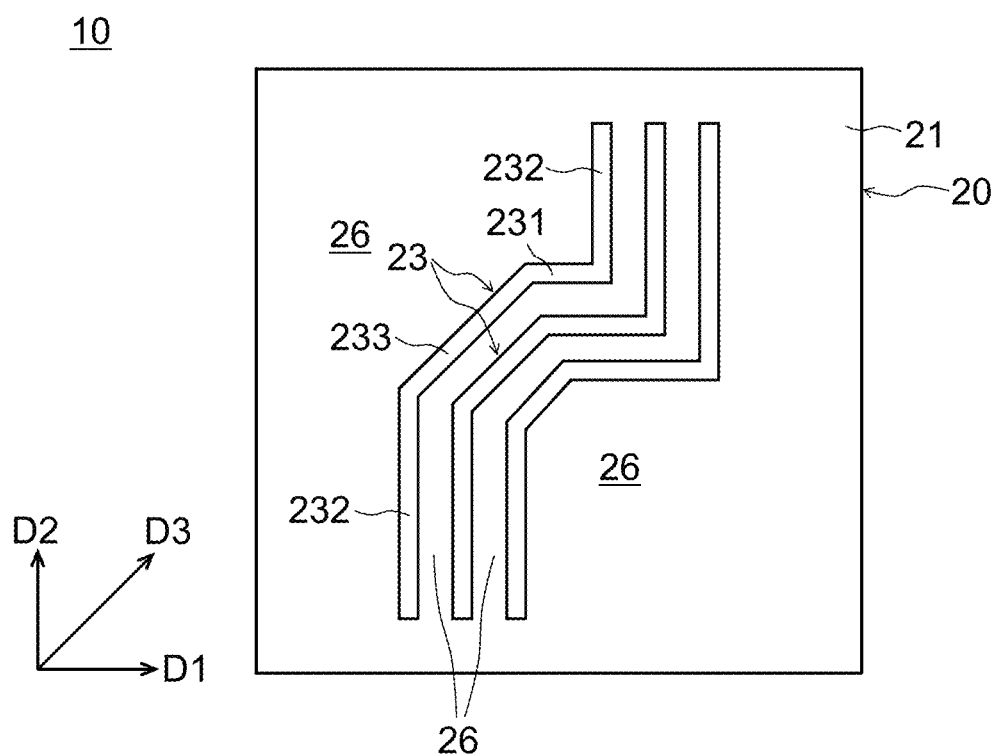
FIG. 15 is a plan view of a wiring board according to a fourth modification.

FIG. 15 is a plan view of the wiring board 10 according to a fourth modification. As illustrated in FIG. 15, a plurality of control regions 23 may be arranged in a direction transverse to the direction in which the control regions 23 extend, the control regions 23 each including portions extending in a plurality of directions, such as the first control region 231, the second control region 232, and the third control region 233. In this case, the region between two adjacent control regions 23 may define the non-control region 26. As a result, each control region 23 can be sandwiched by adjacent portions of the non-control region 26 in a direction orthogonal to the direction in which the control region 23 extends, that is, in a direction orthogonal to the direction in which the wiring 52 extends.

Fifth Modification

Figure 16:
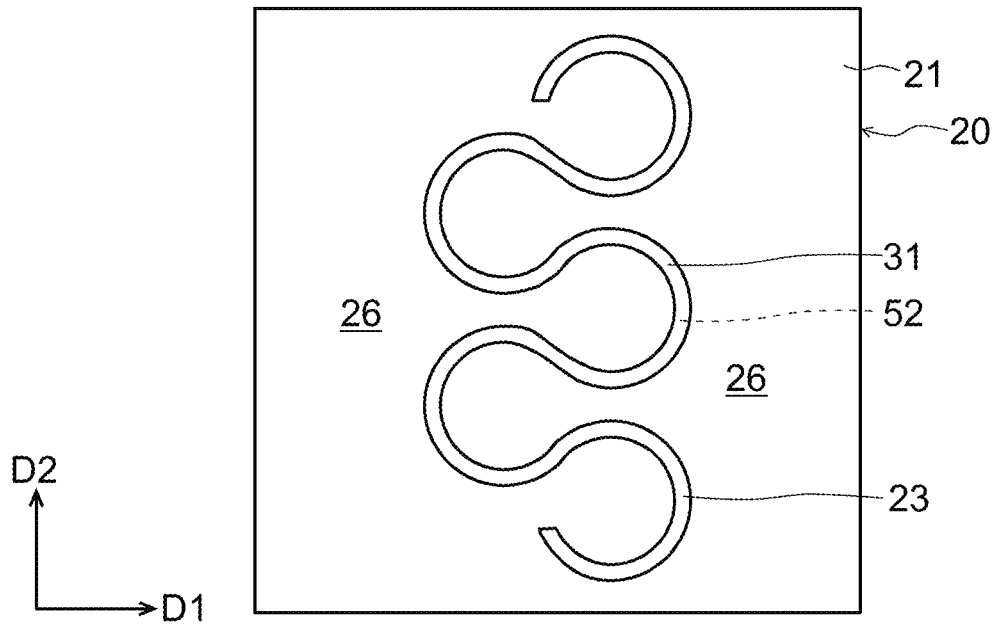
FIG. 16 is an enlarged plan view of control and non-control regions of a wiring board according to a fifth modification.

FIG. 16 is a plan view of the wiring board 10 according to a fifth modification. As illustrated in FIG. 16, the wiring 52, and the reinforcing part 31 overlapping the wiring 52 may each have a curved portion that is curved in plan view. In the example illustrated in FIG. 16, the wiring 52 and the reinforcing part 31 have a so-called horseshoe shape. In this case, elongating the wiring board 10 allows the wiring 52 and the reinforcing part 31 to deform such that their curved portion increases in radius of curvature. This helps to prevent or inhibit the wiring 52 from sustaining damage such as fracturing due to the stretching of the wiring board 10.

Figure 17:
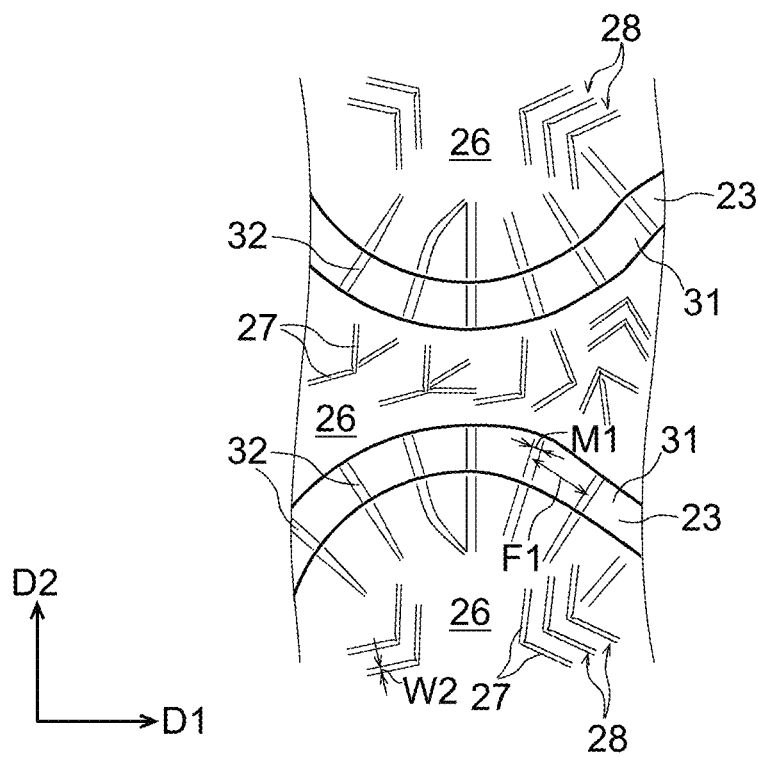
FIG. 17 is an enlarged plan view of the control and non-control regions of the wiring board illustrated in FIG. 16.

FIG. 17 is an enlarged plan view of the control region 23 and the non-control region 26 of the wiring board 10 illustrated in FIG. 16. According to the fifth modification as well, the control region 23 defined by the reinforcing part 31 is sandwiched by adjacent portions of the non-control region 26 in a direction orthogonal to the direction in which the control region 23 extends.

According to the fifth modification as well, in a manufacturing process of the wiring board 10, with the substrate 20 in its elongated state due to tensile stress applied to the substrate 20 in two different directions, the wiring 52 is disposed on the first surface 21 of the substrate 20, and then the tensile stress is removed from the substrate 20. For example, tensile stress is applied to the substrate 20 in the first direction D1 and the second direction D2, and then the tensile stress is removed from the substrate 20. In this case, as with the above-mentioned embodiment, the ridges 27 extending in different directions and crossing each other appear in the non-control region 26 as illustrated in FIG. 17.

The control region 23 is sandwiched by adjacent portions of the non-control region 26 in a direction orthogonal to the direction in which the control region 23 extends. Thus, wrinkles resulting from the contraction of the substrate 20 in the direction orthogonal to the direction in which the control region 23 extends are unlikely to appear in the control region 23. This means that wrinkles resulting from the contraction of the substrate 20 in the direction in which the control region 23 extends appear in the control region 23. For example, as illustrated in FIG. 17, the ridges 32 extending in a direction transverse to the direction in which the control region 23 extends and arranged in the direction in which the control region 23 extends appear in the control region 23. The ridge 32 may extend across the control region 23 in the direction transverse to the direction in which the control region 23 extends.

In the fifth modification as well, by controlling the direction in which wrinkles generated in the control region 23 extend, it is possible to prevent or inhibit appearance, in the control region 23, of the ridges 32 that extend in different directions and cross each other. This helps to prevent or inhibit the ridges 32 appearing in the control region 23 from locally increasing in amplitude. This also helps to prevent or inhibit the ridges 32 appearing in the control region 23 from decreasing in radius of curvature. This helps to prevent or inhibit the wiring 52 located in the control region 23 from sustaining damage such as fracturing.

Sixth Modification

Figure 18:
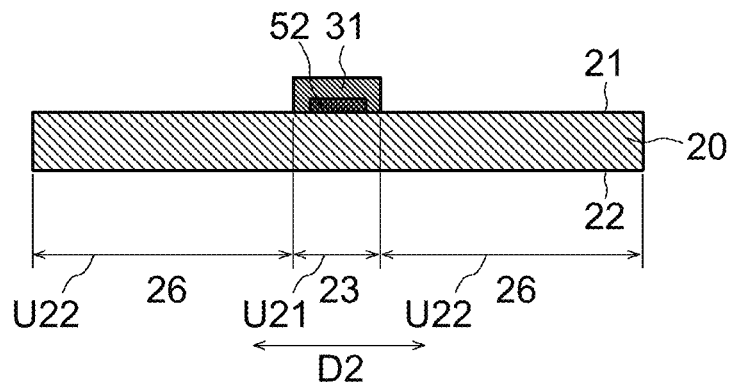
FIG. 18 is a cross-sectional view of a wiring board according to a sixth modification.

FIG. 18 is a cross-sectional view of the wiring board 10 according to a sixth modification. As with FIG. 3 mentioned above, FIG. 18 illustrates a cross-section of the wiring board 10 taken in a direction orthogonal to the direction in which the wiring 52 extends.

As illustrated in FIG. 18, the reinforcing part 31 and the control region 23 may each have a larger dimension than the wiring 52 in the direction orthogonal to the direction in which the wiring 52 extends. In this case, as illustrated in FIG. 18, the wiring 52 may be covered on its surface and sides by the reinforcing part 31.

Seventh Modification

Although the above-mentioned embodiment is directed to a case in which the wiring 52 is disposed on the first surface 21 of the substrate 20, this is not intended to be limiting. A seventh modification is directed to a case in which the wiring 52 is supported by a support substrate.

Figure 19:
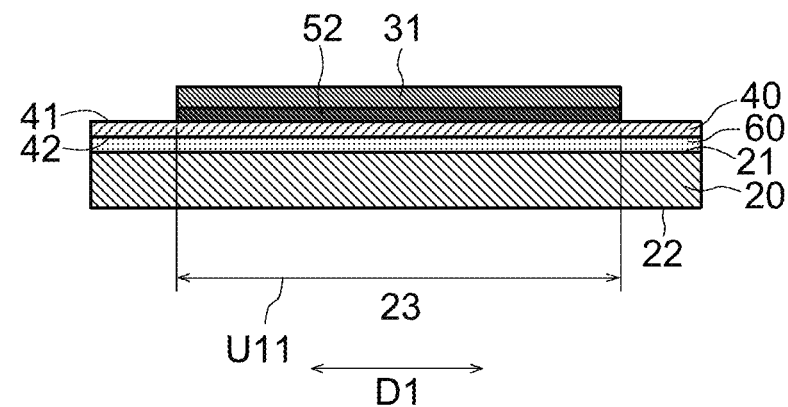
FIG. 19 is a cross-sectional view of the wiring board according to a seventh modification.
Figure 20:
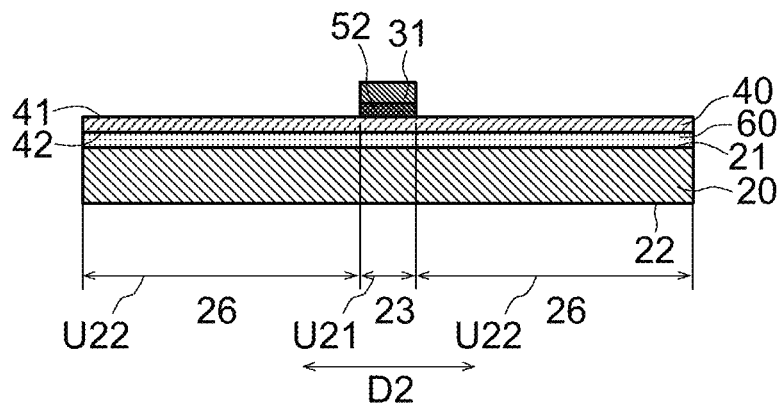
FIG. 20 is a cross-sectional view of a wiring board according to the seventh modification.

FIGS. 19 and 20 are cross-sectional views of the wiring board 10 according to the seventh modification. As with FIG. 2 mentioned above, FIG. 19 illustrates a cross-section of the wiring board 10 taken in a direction in which the wiring 52 extends. As with FIG. 3 mentioned above, FIG. 20 illustrates a cross-section of the wiring board 10 taken in a direction orthogonal to the direction in which the wiring 52 extends. The wiring board 10 includes at least the substrate 20, the support substrate 40, the wiring 52, and the reinforcing part 31.

[Support Substrate]

The support substrate 40 is a part with a lower stretchability than the substrate 20. The support substrate 40 includes a second surface 42 located toward the substrate 20, and a first surface 41 located opposite to the second surface 42. In the example illustrated in FIGS. 19 and 20, the support substrate 40 supports the wiring 52 at the first surface 41 side of the support substrate 40. The support substrate 40 is joined to the first surface of the substrate 20 at the second surface 42 side. For example, an adhesive layer 60 containing an adhesive may be disposed between the substrate 20 and the support substrate 40. The adhesive layer 60 may be made of, for example, an acrylic-based adhesive or a silicone-based adhesive. The adhesive layer 60 has a thickness of, for example, greater than or equal to 5 μm and less than or equal to 200 μm. Although not illustrated, the second surface 42 of the support substrate 40 may be joined to the first surface 21 of the substrate 20 by a method that involves subjecting a non-adhesive surface to molecular modification to achieve molecular adhesive bonding. In this case, no adhesive layer may be disposed between the substrate 20 and the support substrate 40.

According to the seventh modification, the reinforcing part 31 is stacked over the wiring 52 at the first surface 41 side of the support substrate 40. The reinforcing part 31 may be in contact with the wiring 52, or another layer such as an insulating layer may be interposed between the wiring 52 and the reinforcing part 31. Although not illustrated, the reinforcing part 31 may be located at the second surface 42 side of the support substrate 40.

Figure 21:
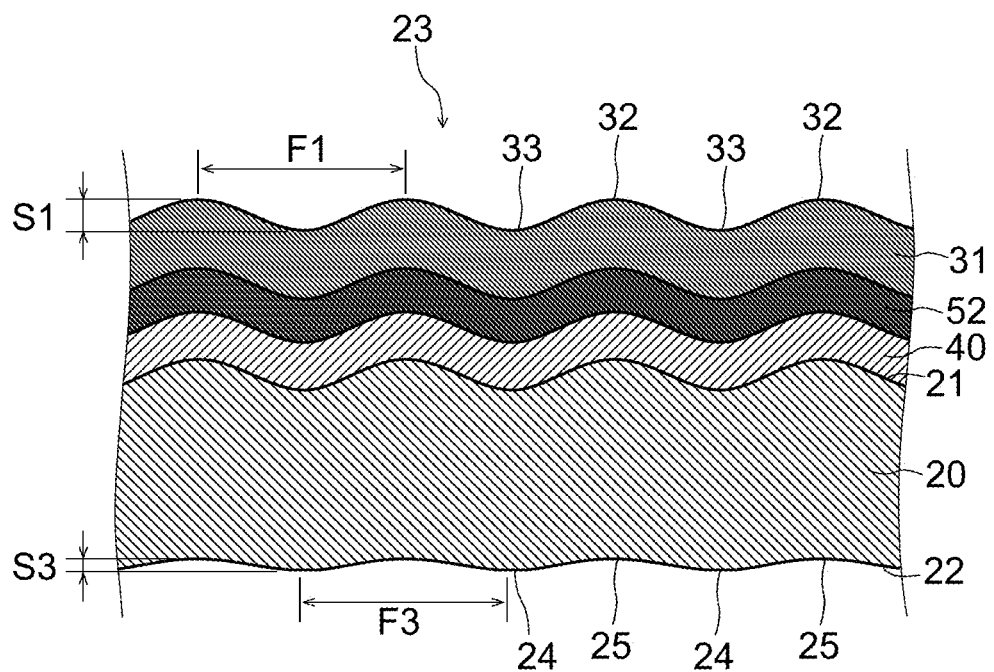
FIG. 21 is a cross-sectional view of a control region of the wiring board according to the seventh modification.

FIG. 21 is an enlarged plan view of the control region 23 of the wiring board 10 illustrated in FIG. 19. According to the seventh modification, as the substrate 20 contracts upon removal of tensile stress from the substrate 20 joined to the support substrate 40, the ridges 32 form on the support substrate 40, the wiring 52, and the reinforcing part 31 as illustrated in FIG. 21. The characteristics and dimensions of the support substrate 40 are designed to facilitate such formation of the ridges 32. For example, the support substrate 40 has an elastic modulus greater than the first elastic modulus of the substrate 20. In the following description, the elastic modulus of the support substrate 40 is sometimes referred to also as third elastic modulus.

Although not illustrated, the support substrate 40 may support the wiring 52 at the second surface 42 side. In this case, the reinforcing part 31 may be disposed at the first surface 41 side of the support substrate 40, or may be disposed at the second surface 42 side of the support substrate 40.

The third elastic modulus of the support substrate 40 is, for example, greater than or equal to 100 MPa, and more preferably greater than or equal to 1 GPa. Further, the third elastic modulus of the support substrate 40 may be greater than or equal to 100 times and less than or equal to 50000 times, and preferably greater than or equal to 1000 times and less than or equal to 10000 times the first elastic modulus of the substrate 20. Setting the third elastic modulus of the support substrate 40 as mentioned above helps to ensure that the cycle F1 of the ridges 32 does not become too small. This also helps to prevent or inhibit local bending in the ridges 32.

An excessively low elastic modulus of the support substrate 40 causes the support substrate 40 to deform easily during formation of the reinforcing part 31, which makes it difficult to align the reinforcing part 31 with respect to the wiring 52. An excessively high elastic modulus of the support substrate 40 makes it difficult for the substrate 20 to restore its original shape when relaxed, and makes the substrate 20 susceptible to cracking or fracturing.

The support substrate 40 has a thickness of, for example, greater than or equal to 500 nm and less than or equal to 10 μm, and more preferably greater than or equal to 1 μm and less than or equal to 5 μm. An excessively small thickness of the support substrate 40 makes handling of the support substrate 40 difficult during manufacture of the support substrate 40 or during formation of a part over the support substrate 40. An excessively large thickness of the support substrate 40 makes it difficult for the substrate 20 to restore its original shape when relaxed, which may make it difficult to achieve desired stretching and contraction of the substrate 20.

Exemplary suitable materials for the support substrate 40 may include polyethylene naphthalate, polyimide, polyethylene terephthalate, polycarbonate, and acrylic resin. Among these, polyethylene naphthalate or polyimide, which exhibits superior durability and thermal resistance, may be preferably used.

The third elastic modulus of the support substrate 40 may be less than or equal to 100 times the first elastic modulus of the substrate 20. The third elastic modulus of the support substrate 40 may be calculated by the same method as that used for calculating the elastic modulus of the substrate 20 or the reinforcing part 31.

(Method for Manufacturing Wiring Board)

A method for manufacturing the wiring board 10 according to the seventh modification is described below with reference to FIG. 22A to FIG. 22D.

Figure 22A:
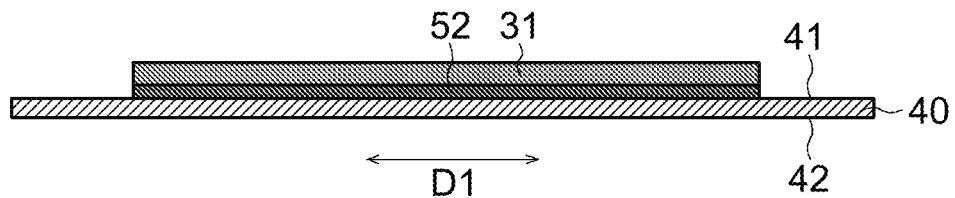
FIG. 22A illustrates a method for manufacturing the wiring board according to the seventh modification.

First, the support substrate 40 is prepared. Subsequently, the wiring 52 is disposed on the first surface 41 of the support substrate 40. For example, a metal layer such as a copper layer is formed by vapor deposition or other methods on the first surface 41 of the support substrate 40. Subsequently, the metal layer is processed by photolithography and etching. The wiring 52 on the first surface 41 is thus obtained. Subsequently, the reinforcing part 31 is disposed at the first surface 41 side of the support substrate 40. For example, a material containing resin that constitutes the reinforcing part 31 is printed onto the wiring 52 by screen printing or other methods. The support substrate 40 with the wiring 52 and the reinforcing part 31 disposed over the first surface 41 is thus obtained as illustrated in FIG. 22A.

Figure 22B:
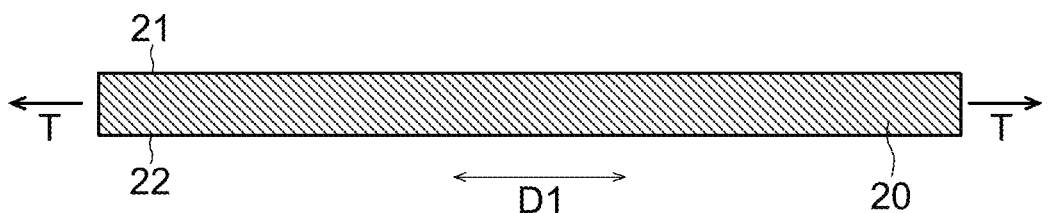
FIG. 22B illustrates a method for manufacturing the wiring board according to the seventh modification.

Subsequently, as illustrated in FIG. 22B, an elongation step is performed. In the elongation step, the substrate 20 is elongated by applying a tensile stress T to the substrate 20 in the first direction D1 and in the second direction D2 transverse to the first direction D1.

Figure 22C:
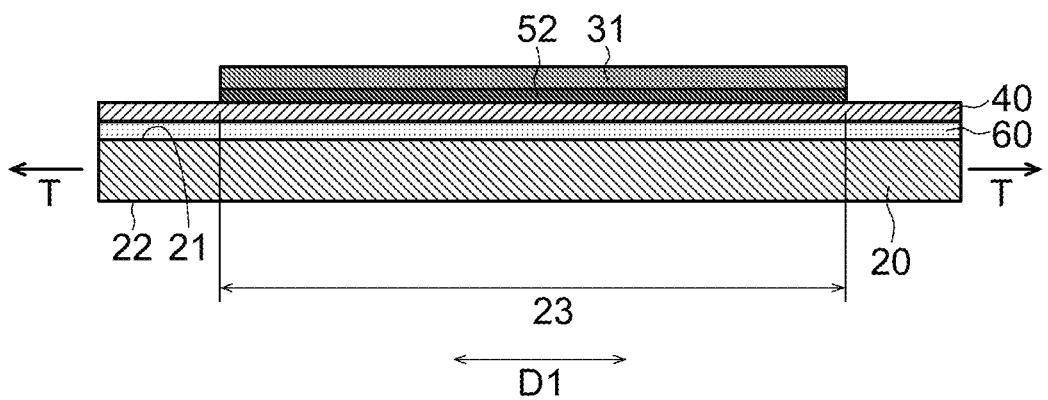
FIG. 22C illustrates a method for manufacturing the wiring board according to the seventh modification.
Figure 22D:
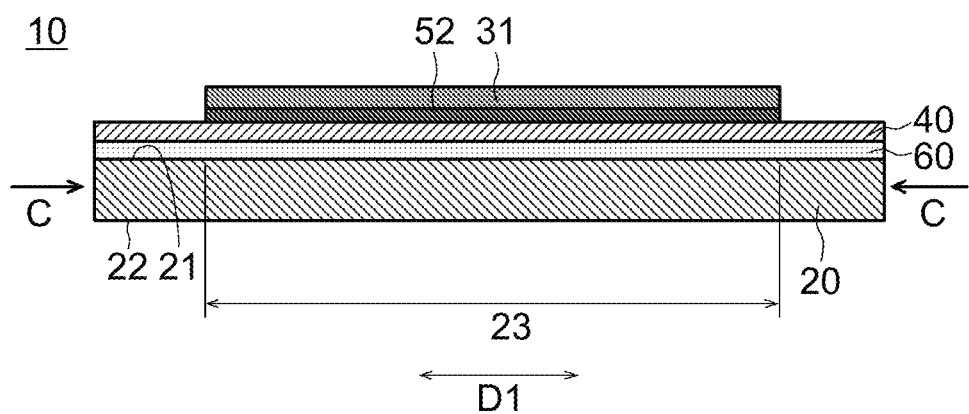
FIG. 22D illustrates a method for manufacturing the wiring board according to the seventh modification.

Subsequently, a wiring step is performed. In the wiring step, the wiring 52 is disposed at a location adjacent to the first surface 21 of the substrate 20 that is being elongated due to the tensile stress T. In the wiring step according to the seventh modification, with the wiring 52 and the reinforcing part 31 disposed over the support substrate 40 as described above, the second surface 42 of the support substrate 40 is joined to the first surface 21 of the substrate 20 as illustrated in FIG. 22C. At this time, the adhesive layer 60 may be disposed between the substrate 20 and the support substrate 40.

Subsequently, a contraction step is performed. In the contraction step, the tensile stress T is removed from the substrate 20. Thus, as indicated by arrows C in FIG. 22D, the substrate 20 contracts in the first direction D1 in which the wiring 52 extends. The substrate 20 also contracts in the second direction D2 transverse to the first direction D1.

According to the seventh modification, as with the embodiment mentioned above, the substrate 20 has the control region 23, which overlaps the reinforcing part 31 overlapping the wiring 52, and the non-control region 26, which does not overlap the reinforcing part 31 and is positioned to sandwich the control region 23 in the second direction D2 orthogonal to the first direction D1 in which the wiring 52 extends. The control region 23 includes the ridges 32 arranged in the direction in which the wiring 52 extends. This means that when the wiring board 10 is subjected during its use to tensile stress in the first direction D1 in which the wiring 52 extends, the support substrate 40, the wiring 52, and the reinforcing part 31 are able to follow the stretching of the substrate 20 by deforming in a manner that reduces the amplitude of the ridges 32, in other words, in a manner that eliminates the ridges 32. This helps to prevent or inhibit the wiring 52 from increasing in overall length or decreasing in cross-sectional area as the substrate 20 is stretched. This in turn helps to prevent or inhibit the resistance of the wiring 52 from increasing due to the stretching of the wiring board 10. It is also possible to prevent or inhibit the wiring 52 from sustaining damage such as cracking.

In the contraction step, with respect to a direction orthogonal to the direction in which the wiring 52 extends, the presence of the reinforcing part 31 helps to prevent or inhibit the support substrate 40 and the wiring 52 from deforming following the contraction of the substrate 20. This makes it possible to prevent or inhibit appearance, in the control region 23, of the ridges 32 extending in different directions and crossing each other. This helps to prevent or inhibit the ridges 32 appearing in the control region 23 from locally increasing in amplitude. This also helps to prevent or inhibit the ridges 32 appearing in the control region 23 from decreasing in radius of curvature. This helps to prevent or inhibit the wiring 52 located in the control region 23 from sustaining damage such as fracturing.

Eighth Modification

Figure 23:
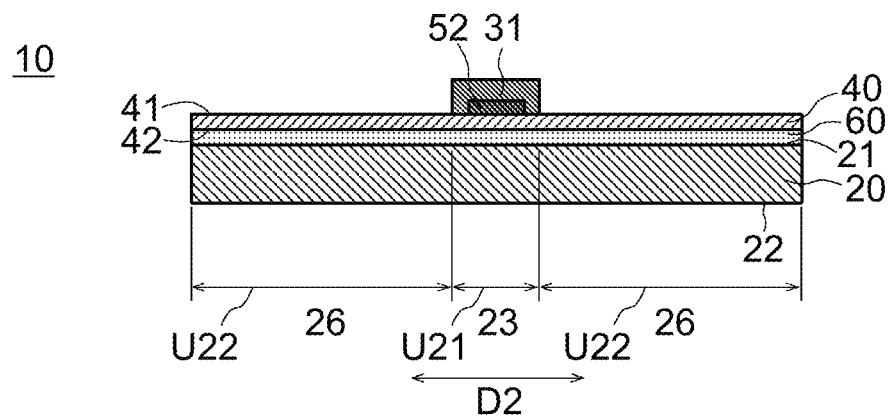
FIG. 23 is a cross-sectional view of a wiring board according to an eighth modification.

FIG. 23 is a cross-sectional view of the wiring board 10 according to an eighth modification. FIG. 23 illustrates a cross-section of the wiring board 10 including the support substrate 40, taken in a direction orthogonal to the direction in which the wiring 52 extends.

As illustrated in FIG. 23, also for a case in which the wiring board 10 includes the support substrate 40, the reinforcing part 31 and the control region 23 may each have a larger dimension than the wiring 52 in a direction orthogonal to the direction in which the wiring 52 extends. In this case, as illustrated in FIG. 23, the wiring 52 may be covered on its surface and sides by the reinforcing part 31.

Ninth Modification

Figure 24:
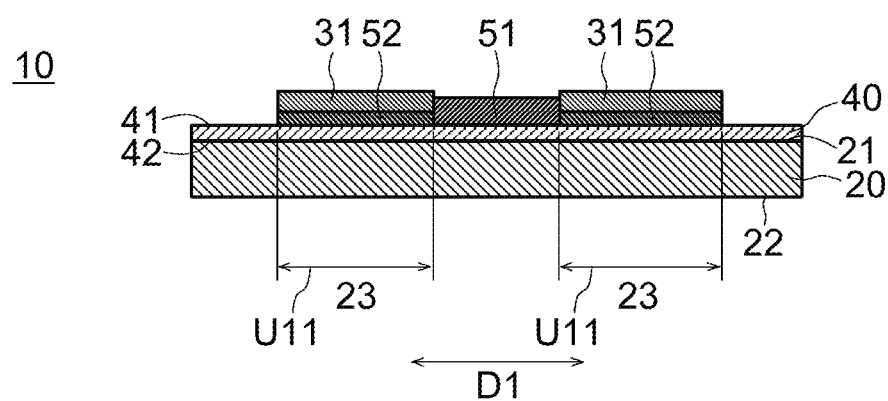
FIG. 24 is a cross-sectional view of a wiring board according to a ninth modification.

FIG. 24 is a cross-sectional view of the wiring board 10 according to a ninth modification. FIG. 24 illustrates a cross-section of the wiring board 10 taken in a direction in which the wiring 52 extends.

As illustrated in FIG. 24, the wiring board 10 may include an electronic component 51 electrically connected to the wiring 52. In the example illustrated in FIG. 24, the electronic component 51 is located at the first surface 41 side of the support substrate 40. Alternatively, the wiring board 10 may be designed to allow mounting of the electronic component 51 that is electrically connected to the wiring 52.

The electronic component 51 may have an electrode that is connected to the wiring 52. In this case, the wiring board 10 has a connection part that is in contact with the electrode of the electronic component 51 and electrically connected to the wiring 52. The connection part is, for example, a pad.

The electronic component 51 may not have an electrode that is connected to the wiring 52. For example, the electronic component 51 may include a part integral with at least one of a plurality of elements constituting the wiring board 10. Examples of such an electronic component 51 may include an electronic component including a conductive layer integral with the conductive layer constituting the wiring 52 of the wiring board 10, and an electronic component including a conductive layer located at a position different from the conductive layer constituting the wiring 52. For example, the electronic component 51 may be a pad formed by a conductive layer that has a greater width than the conductive layer constituting the wiring 52 in plan view. For example, an inspection probe, or a terminal for software rewrites is connected to the pad. The electronic component 51 may be a wiring pattern including a conductive layer extending in helical form in plan view. As described above, a part with a conductive layer patterned and imparted with a predetermined function may also serve as the electronic component 51.

The electronic component 51 may be an active component, may be a passive component, or may be an electromechanical component. Examples of the electronic component 51 may include transistors, large scale integration (LSI), micro electro mechanical systems (MEMS), relays, light-emitting devices such as LEDs, OLEDs, and LCDs, sensors, sound-emitting components such as buzzers, vibrating components that generate vibration, cooling/heat-generating components such as Peltier devices or heating wires that control cooling/heat generation, resistors, capacitors, inductors, piezoelectric elements, switches, and connectors.

Among the above examples of the electronic component 51, sensors are preferably used. Examples of such sensors may include temperature sensors, pressure sensors, light sensors, photoelectric sensors, proximity sensors, shearing force sensors, biometric sensors, laser sensors, microwave sensors, humidity sensors, distortion sensors, gyro sensors, acceleration sensors, displacement sensors, magnetic sensors, gas sensors, GPS sensors, ultrasonic sensors, odor sensors, brain wave sensors, current sensors, vibration sensors, pulse wave sensors, electrocardiogram sensors, and photometric sensors. Among these sensors, biometric sensors are particularly preferred. Biometric sensors are capable of measuring biometric information such as heart rate, pulse, electrocardiogram, blood pressure, body temperature, and blood oxygen level.

Reference is now made to applications of the electronic component 51 that has no electrode. For example, the above-mentioned pad can function as a part to which, for example, an inspection probe, or a terminal for software rewrites is connected. Further, a wiring pattern formed by a helically extending part can function as, for example, an antenna.

As illustrated in FIG. 24, the reinforcing part 31 may overlap the wiring 52 but may not overlap the electronic component 51. Alternatively, although not illustrated, the reinforcing part 31 may at least partially overlap the electronic component 51.

Tenth Modification

Figure 25:
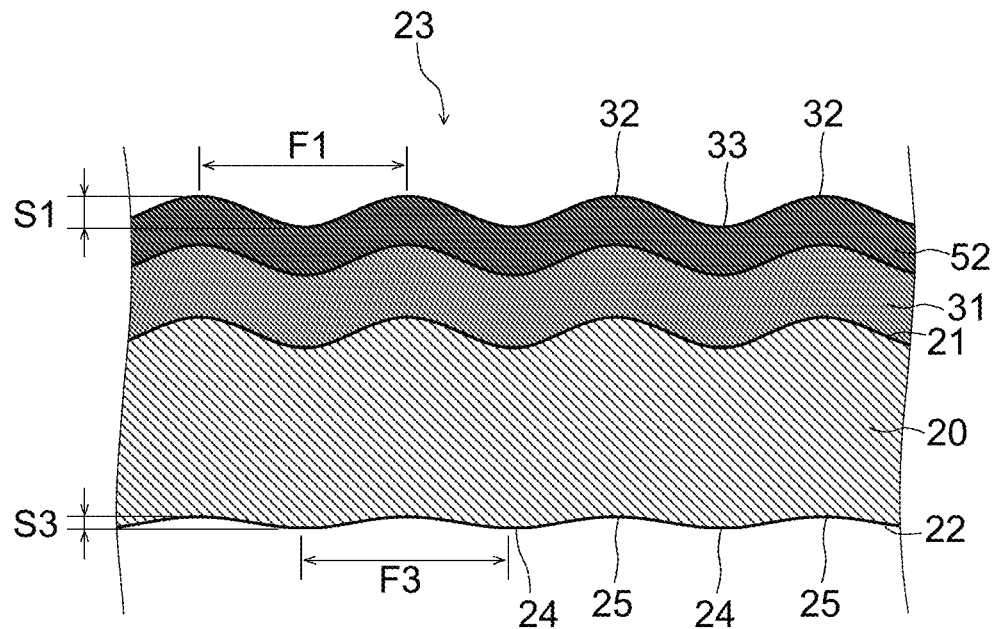
FIG. 25 is a cross-sectional view of a wiring board according to a tenth modification.

FIG. 25 is a cross-sectional view of the wiring board 10 according to a tenth modification. The foregoing description of the embodiment and its modifications is directed to a case in which the reinforcing part 31 covers the wiring 52. In other words, the foregoing description is directed to a case in which the wiring 52 is located between the reinforcing part 31 and the substrate 20. However, this is not intended to be limiting. Alternatively, as illustrated in FIG. 25, the reinforcing part 31 may be located between the substrate 20 and the wiring 52. The wiring board 10 mentioned above can be fabricated by, for example, first forming the wiring 52 and the reinforcing part 31 in this order on a transfer substrate, and then transferring the reinforcing part 31 and the wiring 52 to the first surface 21 of the substrate 20.

Eleventh Modification

Figure 26:
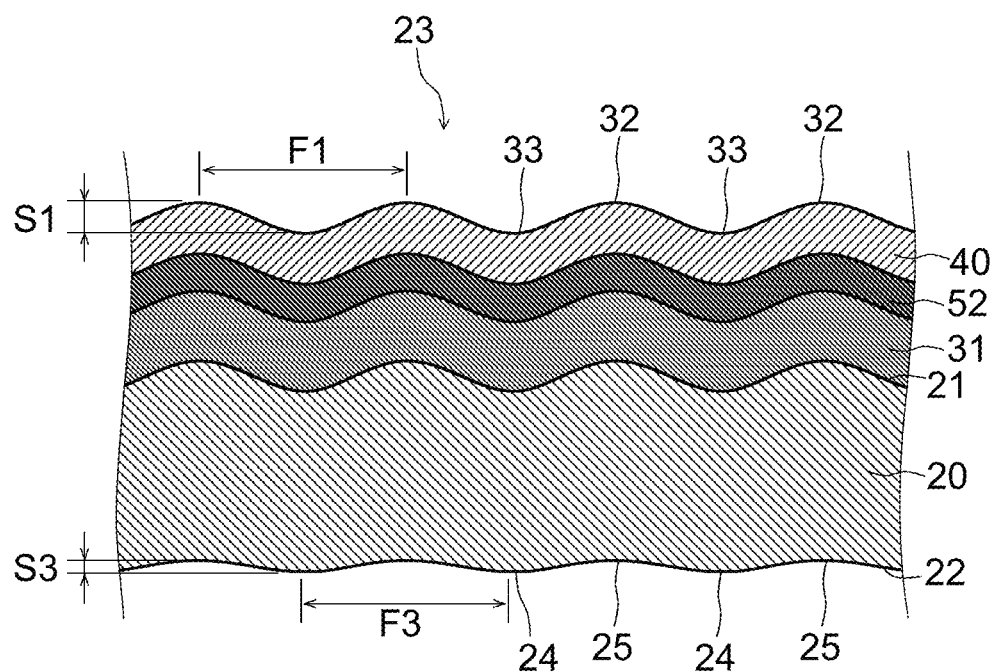
FIG. 26 is a cross-sectional view of an exemplary wiring board according to an eleventh modification.
Figure 27:
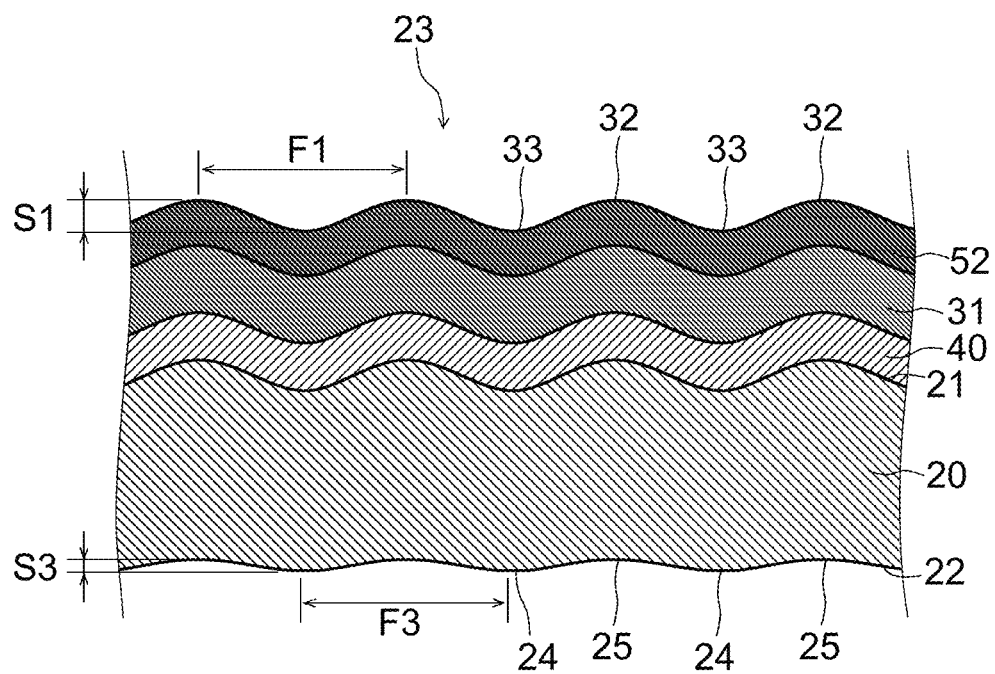
FIG. 27 is a cross-sectional view of an exemplary wiring board according to the eleventh modification.

An eleventh modification is directed to a case in which the wiring board 10 illustrated in FIG. 25 further includes the support substrate 40. In this case, as illustrated in FIG. 26, the reinforcing part 31, the wiring 52, and the support substrate 40 may be arranged in this order as seen from the first surface 21 of the substrate 20. Alternatively, as illustrated in FIG. 27, the support substrate 40, the reinforcing part 31, and the wiring 52 may be arranged in this order as seen from the first surface 21 of the substrate 20.

Twelfth Modification

The foregoing description of the embodiment and its modifications is directed to a case in which the reinforcing part 31 is disposed in the control region 23, and a part that covers the substrate 20 or the support substrate 40, such as the reinforcing part 31, is not disposed in the non-control region 26. The following description of a twelfth modification is directed to a case in which a part that covers the substrate 20 or the support substrate 40 is disposed also in the non-control region 26. Even in this case, if there is an appropriate difference in rigidity between the control region 23 and the non-control region 26, it is possible to prevent or inhibit appearance, in the control region 23, of other ridges that extend in a direction different from that of the ridges 32 arranged in the direction in which the wiring 52 extends.

Figure 28:
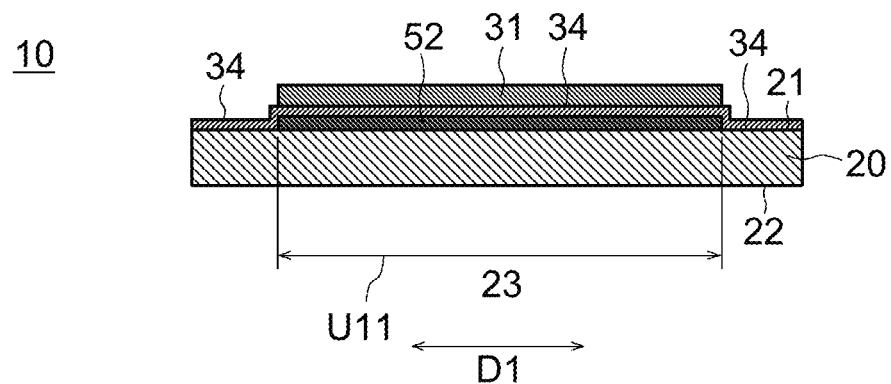
FIG. 28 is a cross-sectional view of a wiring board according to a twelfth modification.
Figure 29:
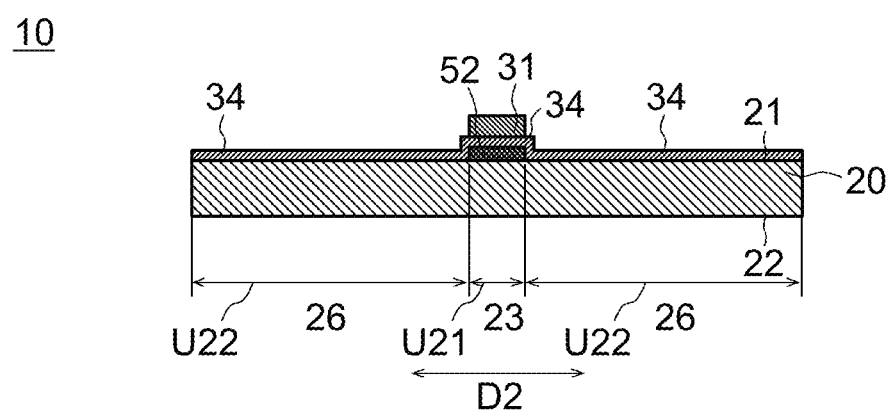
FIG. 29 is a cross-sectional view of the wiring board according to the twelfth modification.

FIGS. 28 and 29 are cross-sectional views of the wiring board 10 according to the twelfth modification. FIG. 28 corresponds to a cross-section of the wiring board illustrated in FIG. 1 taken along the line A-A. FIG. 29 corresponds to a cross-section of the wiring board illustrated in FIG. 1 taken along the line B-B. As illustrated in FIGS. 28 and 29, the wiring board 10 may include a protective layer 34 that covers the substrate 20 from the first surface 21 side. The protective layer 34 is present in both the control region 23 and the non-control region 26. The reinforcing part 31 is also present in the control region 23. In the following description, a part that covers the substrate 20 from the first surface 21 side, such as the reinforcing part 31 or the protective layer 34, is referred to also as covering part 30.

In the control region 23, the reinforcing part 31 is also present in addition to the protective layer 34. The covering part 30 thus has a thickness in the control region 23 that is greater than the thickness of the covering part 30 in the non-control region 26 (to be referred to also as first thickness hereinafter) by an amount corresponding to the thickness of the reinforcing part 31. Consequently, the control region 23 can be increased in rigidity relative to the non-control region 26. This helps to prevent or inhibit appearance, in the control region 23, of other ridges extending in a direction different from the ridges 32 arranged in the direction in which the wiring 52 extends.

Exemplary suitable materials for the protective layer 34 may include common thermoplastic elastomers, and acrylic-based, urethane-based, epoxy-based, polyester-based, vinyl ether-based, polyene thiol-based or silicone-based oligomers and polymers. The protective layer 34 may be made of the same material as the material of the reinforcing part 31. The protective layer 34 has a thickness of, for example, greater than or equal to 10 μm and less than or equal to 1 mm.

Thirteenth Modification

Figure 37:
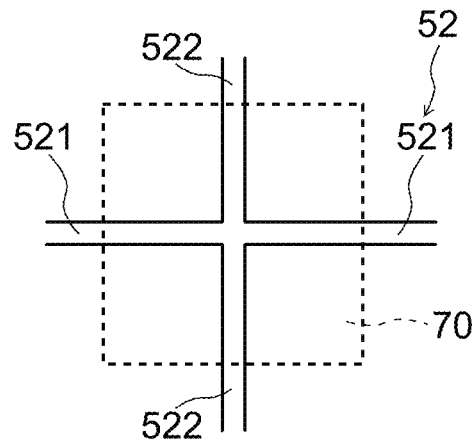
FIG. 37 is an enlarged plan view of a portion of a wiring board according to a thirteenth modification.

FIG. 37 is an enlarged plan view of a portion of the wiring board 10 where two pieces of wiring extending in different directions, for example, the first wiring 521 and the second wiring 522 mentioned above, intersect or cross each other. In the following description, a location where two or more pieces of wiring extending in different directions intersect or cross each other is referred to also as intersection part. It is to be noted that the reinforcing part 31 is not depicted in FIG. 37.

As illustrated in FIG. 37, the wiring board 10 may include a securing part 70 positioned to overlap the intersection part in plan view. The securing part 70 has an elastic modulus greater than the first elastic modulus of the substrate 20. The securing part 70 has an elastic modulus of, for example, greater than or equal to 1 GPa, and more preferably greater than or equal to 10 GPa. The securing part 70 may have an elastic modulus greater than or equal to 100 times, or greater than or equal to 1000 times the first elastic modulus of the substrate 20. Disposing the securing part 70 mentioned above over the intersection part of pieces of the wiring 52 helps to prevent or inhibit stretching or contraction of a portion of the substrate 20 that overlaps the intersection part. This helps to prevent or inhibit deformation from occurring in the intersection part of pieces of the wiring 52. The securing part 70 may be provided before the substrate 20 is elongated in the elongation step, or may be provided after the substrate 20 is elongated in the elongation step.

The elastic modulus of the securing part 70 is calculated by a method suitably determined according to the configuration of the securing part 70. For example, the method for calculating the elastic modulus of the securing part 70 may or may not be the same as the above-mentioned method for calculating the elastic modulus of the reinforcing part 31. One exemplary method that can be used to calculate the elastic modulus of the securing part 70 is to conduct tensile testing in compliance with ASTM D882 by use of a sample of the securing part 70.

Exemplary materials for the securing part 70 may include metal layers containing metallic materials, common thermoplastic elastomers, and acrylic-based, urethane-based, epoxy-based, polyester-based, vinyl ether-based, polyene thiol-based or silicone-based oligomers and polymers. The metallic material may be, for example, copper, aluminum, or stainless steel. The securing part 70 has a thickness of, for example, greater than or equal to 10 μm. Particularly preferred among the above-mentioned materials are metal layers, which exhibit large elastic moduli and allow micromachining by etching or other methods.

Figure 38:
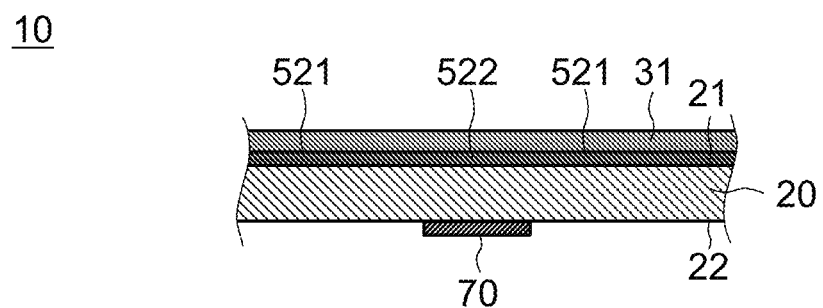
FIG. 38 is an exemplary cross-sectional view of the wiring board according to the thirteenth modification.
Figure 39:
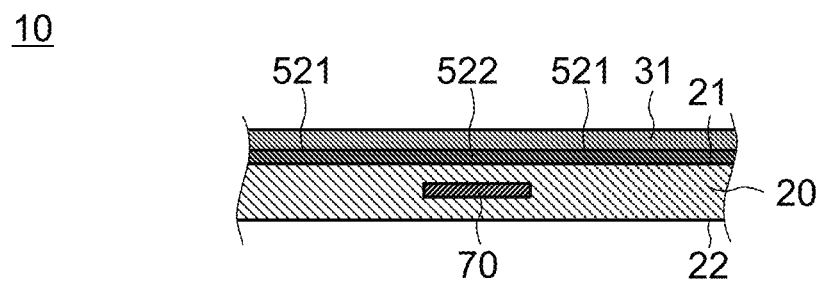
FIG. 39 is an exemplary cross-sectional view of the wiring board according to the thirteenth modification.

FIGS. 38 and 39 are each an exemplary cross-sectional view of a portion of the wiring board 10 that includes the securing part 70. As illustrated in FIG. 38, the securing part 70 may be located at the second surface 22 side of the substrate 20. Alternatively, as illustrated in FIG. 39, the securing part 70 may be embedded in the substrate 20. In this case, as illustrated in FIG. 39, the securing part 70 may be exposed to neither the first surface 21 nor the second surface 22 of the substrate 20. Alternatively, although not illustrated, the securing part 70 may be exposed to the first surface 21 or the second surface 22 of the substrate 20.

Although not illustrated, the securing part 70 may be located at the first surface 21 side of the substrate 20.

Fourteenth Modification

The thirteenth modification is directed to a case in which the securing part 70 overlaps the intersection part of pieces of the wiring 52 in plan view. However, this is not intended to be limiting. As illustrated in FIGS. 40 to 43, the securing part 70 may have a frame-like shape, and the intersection part of pieces of the wiring 52 may be located inside the frame-like securing part 70. According to the fourteenth modification as well, a portion of the substrate 20 located inside the securing part 70 is unlikely to be subjected to tension and the consequent deformation. This helps to prevent or inhibit deformation from occurring in the intersection part of pieces of the wiring 52 that is located inside the securing part 70.

Figure 40:
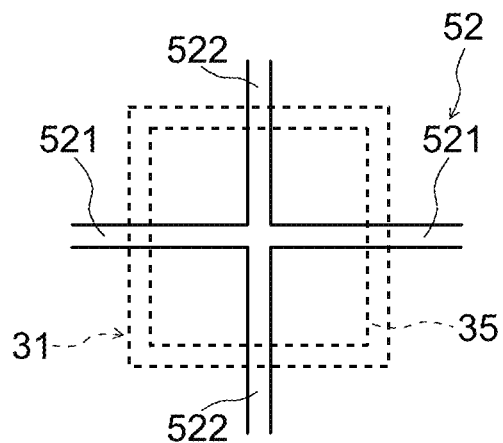
FIG. 40 is a plan view of an exemplary wiring board according to a fourteenth modification.
Figure 41:
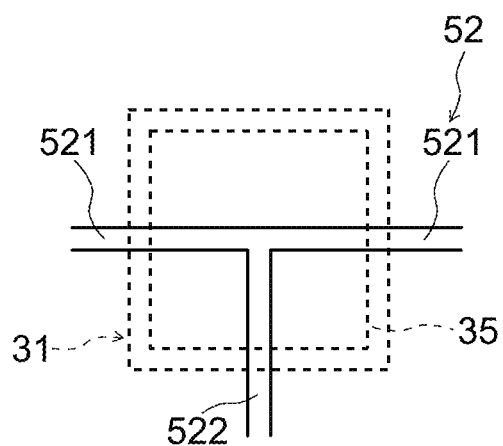
FIG. 41 is a plan view of an exemplary wiring board according to the fourteenth modification.
Figure 42:
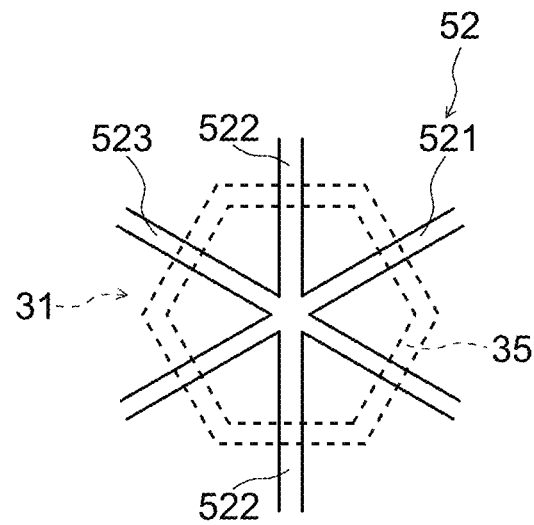
FIG. 42 is a plan view of an exemplary wiring board according to the fourteenth modification.
Figure 43:
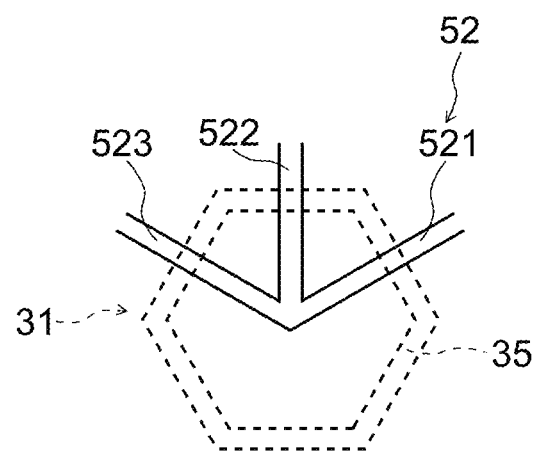
FIG. 43 is a plan view of an exemplary wiring board according to the fourteenth modification.

In FIGS. 40 and 41, a part where pieces of wiring extending in two different directions intersect or cross each other is located inside the frame-like securing part 70 in plan view. In FIGS. 42 and 43, a part where pieces of wiring extending in three different directions intersect or cross each other is located inside the frame-like securing part 70 in plan view. As illustrated in FIGS. 40 to 43, the frame-like securing part 70 may, at a location where the securing part 70 overlaps each piece of the wiring 52 in plan view, extend orthogonally to the direction in which the wiring 52 extends.

Fifteenth Modification

Figure 44:
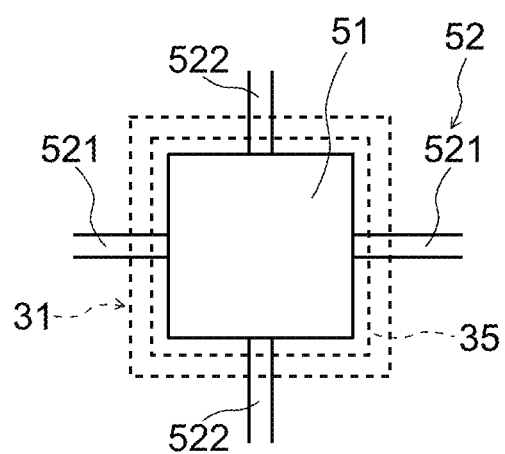
FIG. 44 is a plan view of an exemplary wiring board according to a fifteenth modification.

The foregoing description of the thirteenth and fourteenth modifications is directed to using the securing part 70 for the intersection part of pieces of the wiring 52. However, this is not intended to be limiting. Alternatively, the securing part 70 may be used for the electronic component 51. For example, as illustrated in FIG. 44, the electronic component 51 may be located inside the frame-like securing part 70 in plan view. Although not illustrated, as with the case of FIG. 37, the electronic component 51 may overlap the securing part 70 in plan view. Using the securing part 70 for the electronic component 51 as described above helps to prevent or inhibit stress from being applied to the electronic component 51. This helps to prevent or inhibit, for example, damage to the electronic component 51.

If the securing part 70 has a frame-like shape as illustrated in FIG. 44, the securing part 70 may, at a location where the securing part 70 overlaps each piece of the wiring 52 in plan view, extend orthogonally to the direction in which the wiring 52 connected to the electronic component 51 extends.

Sixteenth Modification

The foregoing description of the embodiment and its modifications is directed to a case in which the reinforcing part 31 is formed on the wiring 52 by printing. However, the method for forming the reinforcing part 31 is not limited as long as the direction of the ridges 32 appearing in the control region 23 overlapping the reinforcing part 31 can be controlled. For example, as with the support substrate 40, the reinforcing part 31 may be a part supplied in the form of a film.

Figure 45:
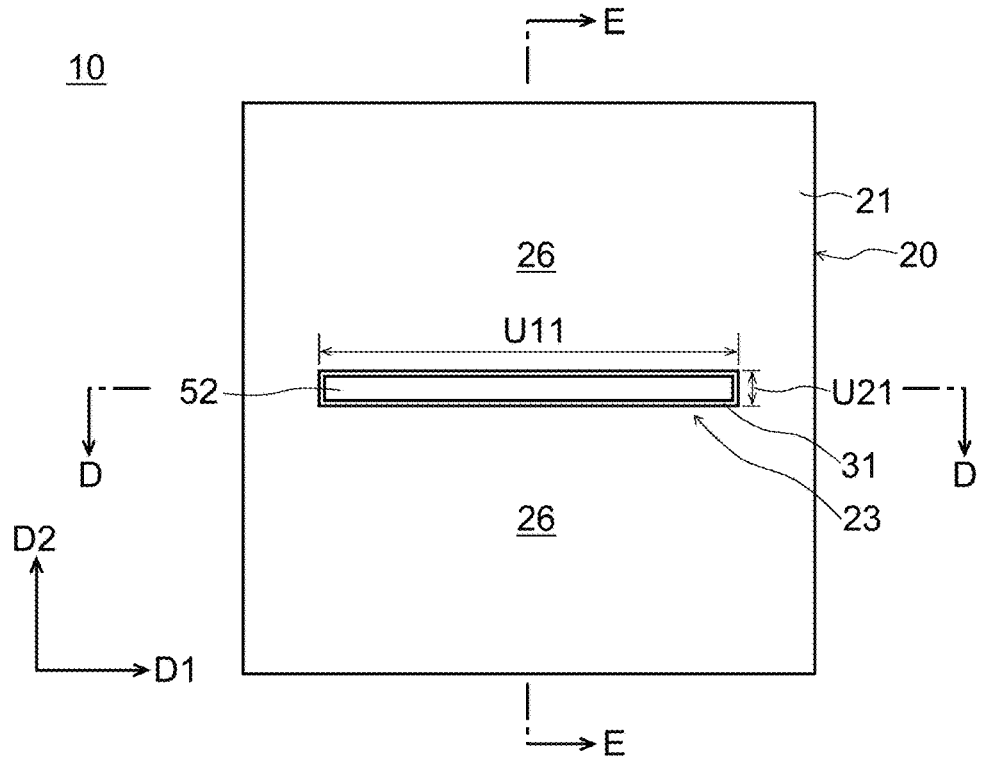
FIG. 45 is a plan view of an exemplary wiring board according to a sixteenth modification.
Figure 46:
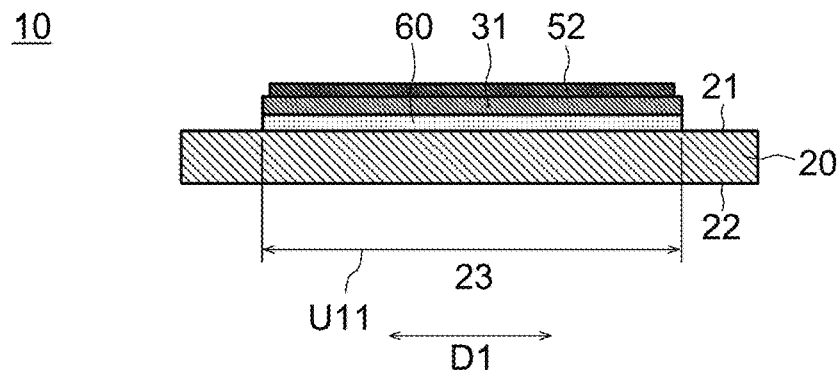
FIG. 46 is a cross-sectional view, taken along a line D-D, of the wiring board illustrated in FIG. 45.
Figure 47:
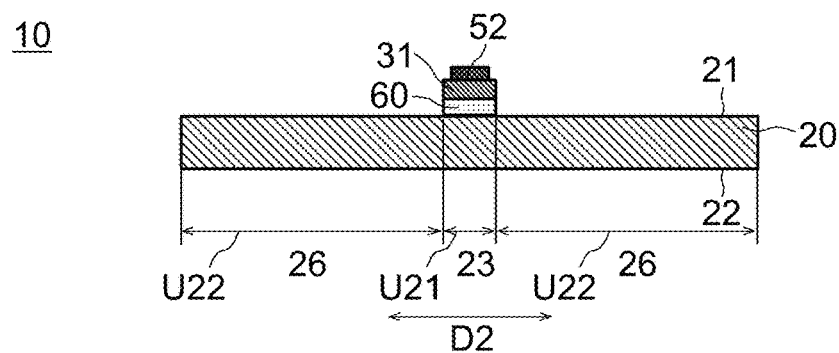
FIG. 47 is a cross-sectional view, taken along a line E-E, of the wiring board illustrated in FIG. 45.

FIG. 45 is a plan view of an exemplary wiring board 10 according to a sixteenth modification. FIG. 46 is a cross-sectional view, taken along a line D-D, of the wiring board 10 illustrated in FIG. 45. FIG. 47 is a cross-sectional view, taken along a line E-E, of the wiring board 10 illustrated in FIG. 45. The wiring board 10 includes the substrate 20, the wiring 52 located at the first surface 21 side of the substrate 20, the reinforcing part 31 that supports the wiring 52, and the adhesive layer 60 located between the substrate 20 and the reinforcing part 31.

As with the support substrate 40 mentioned above, the reinforcing part 31 is a film that supports the wiring 52. Exemplary suitable materials for the reinforcing part 31 may include polyethylene naphthalate, polyimide, polyethylene terephthalate, polycarbonate, and acrylic resin. Among these, polyethylene naphthalate or polyimide, which exhibits superior durability and thermal resistance, may be preferably used. The reinforcing part 31 has a thickness of, for example, greater than or equal to 500 nm and less than or equal to 10 μm, and more preferably greater than or equal to 1 μm and less than or equal to 5 μm.

The reinforcing part 31 has an elastic modulus of, for example, greater than or equal to 100 MPa, and more preferably greater than or equal to 1 GPa. Further, the third elastic modulus of the reinforcing part 31 may be greater than or equal to 100 times and less than or equal to 50000 times, and preferably greater than or equal to 1000 times and less than or equal to 10000 times the elastic modulus of the substrate 20.

(Method for Manufacturing Wiring Board))

A method for manufacturing the wiring board 10 according to the sixteenth modification is described below with reference to FIG. 48A to FIG. 48D.

Figure 48A:
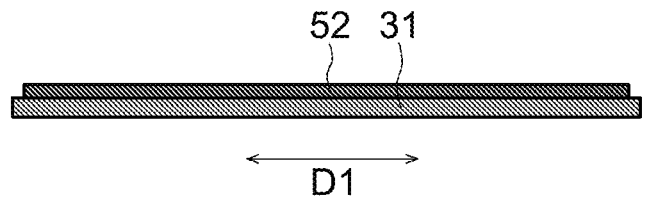
FIG. 48A illustrates a method for manufacturing the wiring board according to the sixteenth modification.

First, the reinforcing part 31 made of, for example, a PEN film is prepared. Subsequently, the wiring 52 is disposed on a surface of the reinforcing part 31. For example, first, a metal layer such as a copper layer is formed by vapor deposition or other methods on a surface of the reinforcing part 31. Subsequently, the metal layer is processed by photolithography and etching. The reinforcing part 31 with the wiring 52 disposed thereon can be thus obtained as illustrated in FIG. 48A.

Figure 48B:
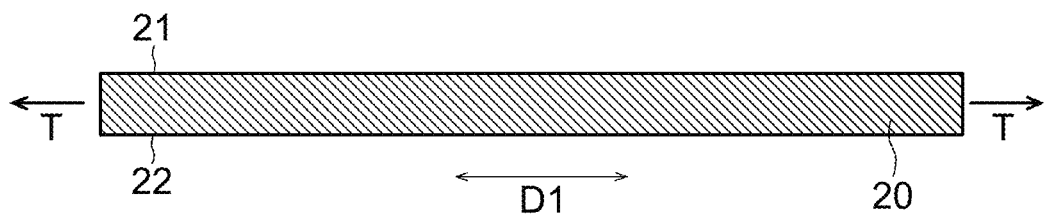
FIG. 48B illustrates a method for manufacturing the wiring board according to the sixteenth modification.

Subsequently, as illustrated in FIG. 48B, an elongation step is performed. In the elongation step, the substrate 20 is elongated by applying a tensile stress T to the substrate 20 in the first direction D1 and in the second direction D2 transverse to the first direction D1.

Figure 48C:
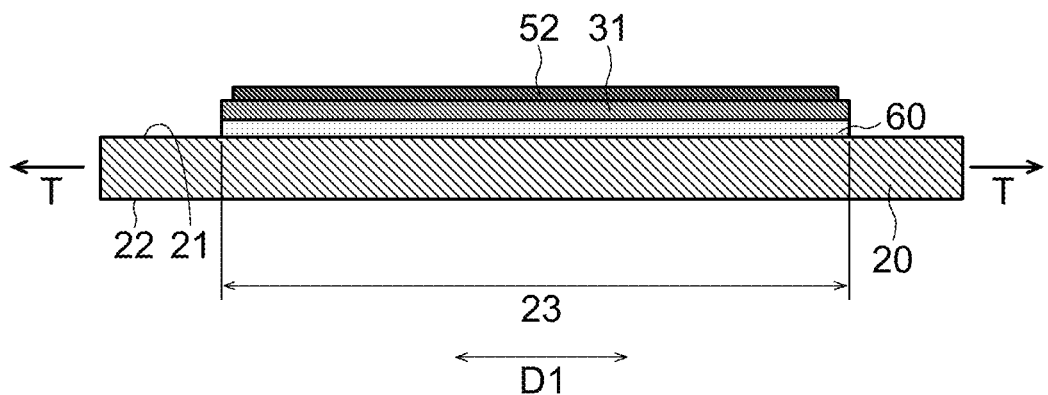
FIG. 48C illustrates a method for manufacturing the wiring board according to the sixteenth modification.
Figure 48D:
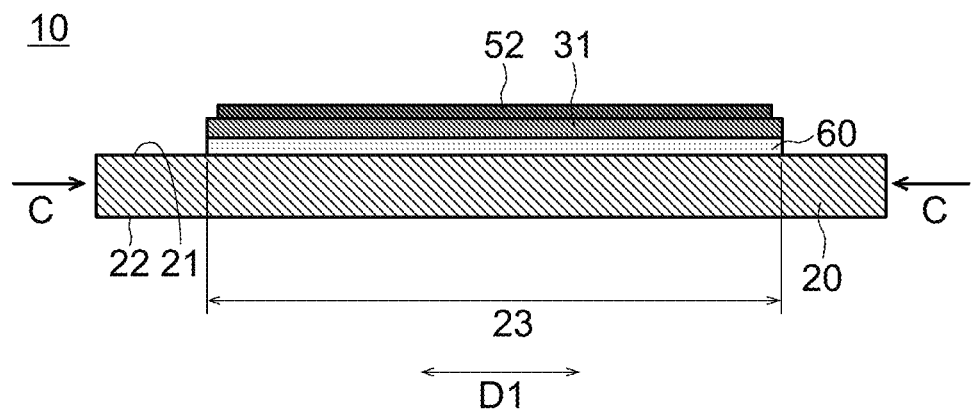
FIG. 48D illustrates a method for manufacturing the wiring board according to the sixteenth modification.

Subsequently, a wiring step is performed. In the wiring step, the wiring 52 is disposed at the first surface 21 side of the substrate 20 that is being elongated due to the tensile stress T. In the wiring step according to the sixteenth modification, as illustrated in FIG. 48C, the reinforcing part 31 with the wiring 52 disposed thereon is joined to the first surface 21 of the substrate 20. At this time, the adhesive layer 60 may be disposed between the substrate 20 and the reinforcing part 31.

Subsequently, a contraction step is performed. In the contraction step, the tensile stress T is removed from the substrate 20. Thus, as indicated by arrows C in FIG. 48D, the substrate 20 contracts in the first direction D1 in which the wiring 52 extends. The substrate 20 also contracts in the second direction D2 transverse to the first direction D1.

According to the sixteenth modification, as with the embodiment mentioned above, the substrate 20 has the control region 23, which overlaps the reinforcing part 31 overlapping the wiring 52, and the non-control region 26, which does not overlap the reinforcing part 31 and is positioned to sandwich the control region 23 in the second direction D2 orthogonal to the first direction D1 in which the wiring 52 extends. The control region 23 includes the ridges 32 arranged in the direction in which the wiring 52 extends. This means that when the wiring board 10 is subjected during its use to tensile stress in the first direction D1 in which the wiring 52 extends, the wiring 52 and the reinforcing part 31 are able to follow the stretching of the substrate 20 by deforming in a manner that reduces the amplitude of the ridges 32, in other words, in a manner that eliminates the ridges 32. This helps to prevent or inhibit the wiring 52 from increasing in overall length or decreasing in cross-sectional area as the substrate 20 is stretched. This in turn helps to prevent or inhibit the resistance of the wiring 52 from increasing due to the stretching of the wiring board 10. It is also possible to prevent or inhibit the wiring 52 from sustaining damage such as cracking.

Figure 49:
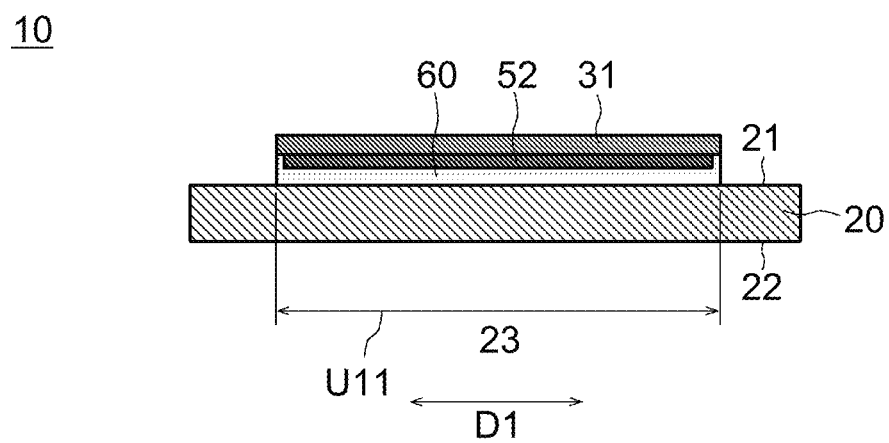
FIG. 49 is a cross-sectional view of an exemplary wiring board.

Although the foregoing description of the sixteenth modification is directed to a case in which the reinforcing part 31 in the form of a film is located between the substrate 20 and the wiring 52, this is not intended to be limiting. For example, as illustrated in FIG. 49, the reinforcing part 31 in the form of a film with the wiring 52 disposed thereon may be joined to the substrate 20 such that the wiring 52 is located between the reinforcing part 31 and the substrate 20.

Seventeenth Modification

The wiring board 10 according to the sixteenth modification illustrated in FIG. 45 may further include a reinforcing part formed on the wiring 52 by printing. According to a seventeenth modification, the reinforcing part 31 illustrated in FIG. 45 that supports the wiring 52 is referred to as first reinforcing part 31A, and the reinforcing part formed on the wiring 52 by printing is referred to as second reinforcing part 31B.

Figure 50:
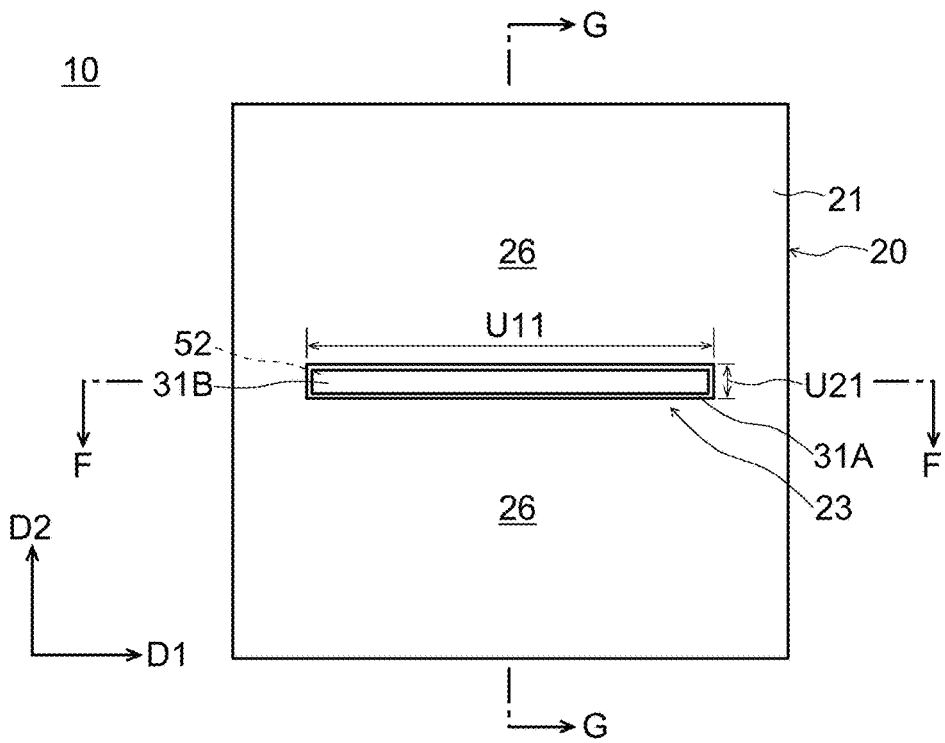
FIG. 50 is a plan view of an exemplary wiring board according to a seventeenth modification.
Figure 51:
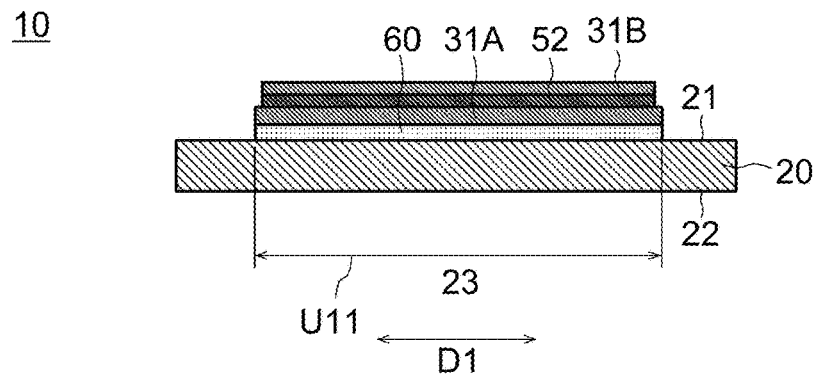
FIG. 51 is a cross-sectional view, taken along a line F-F, of the wiring board illustrated in FIG. 50.
Figure 52:
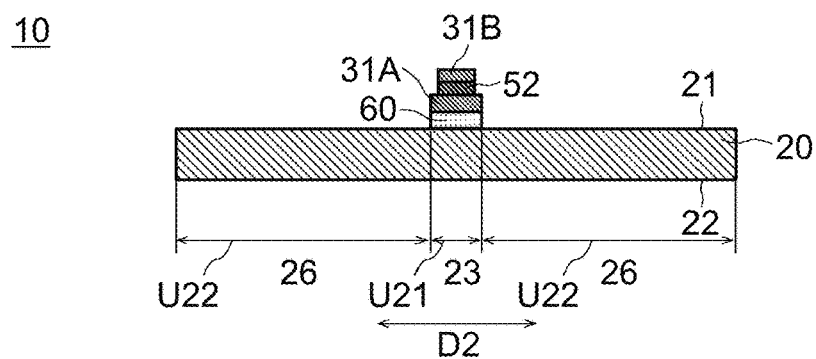
FIG. 52 is a cross-sectional view, taken along a line G-G, of the wiring board illustrated in FIG. 50.

FIG. 50 is a plan view of an exemplary wiring board 10 according to the seventeenth modification. FIG. 51 is a cross-sectional view, taken along a line F-F, of the wiring board 10 illustrated in FIG. 50. FIG. 52 is a cross-sectional view, taken along a line G-G, of the wiring board 10 illustrated in FIG. 50. The wiring board 10 includes the substrate 20, the wiring 52 located at the first surface 21 side of the substrate 20, the first reinforcing part 31A that supports the wiring 52, the adhesive layer 60 located between the substrate 20 and the first reinforcing part 31A, and the second reinforcing part 31B disposed on the wiring 52.

The first reinforcing part 31A and the second reinforcing part 31B both have an anisotropy such that these reinforcing parts extend in a specific direction. In the example illustrated in FIG. 50, the first reinforcing part 31A and the second reinforcing part 31B both extend in the same direction as the wiring 52. According to the seventeenth modification, a region of the substrate 20 that overlaps the first reinforcing part 31A or the second reinforcing part 31B is the control region 23. A region of the substrate 20 that overlaps neither the first reinforcing part 31A nor the second reinforcing part 31B is the non-control region 26.

As with the support substrate 40 mentioned above, the first reinforcing part 31A is a film that supports the wiring 52. Exemplary suitable materials for the first reinforcing part 31A may include polyethylene naphthalate, polyimide, polyethylene terephthalate, polycarbonate, and acrylic resin. Among these, polyethylene naphthalate or polyimide, which exhibits superior durability and thermal resistance, may be preferably used. The first reinforcing part 31A has a thickness of, for example, greater than or equal to 500 nm and less than or equal to 10 μm, and more preferably greater than or equal to 1 μm and less than or equal to 5 μm.

The first reinforcing part 31A has an elastic modulus of, for example, greater than or equal to 100 MPa, and more preferably greater than or equal to 1 GPa. Further, the elastic modulus of the first reinforcing part 31A may be greater than or equal to 100 times and less than or equal to 50000 times, and preferably greater than or equal to 1000 times and less than or equal to 10000 times the elastic modulus of the substrate 20.

Exemplary suitable materials for the second reinforcing part 31B may include common thermoplastic elastomers, and acrylic-based, urethane-based, epoxy-based, polyester-based, vinyl ether-based, polyene thiol-based or silicone-based oligomers and polymers. If any one of these resins is used as a material for the second reinforcing part 31B, the second reinforcing part 31B may have transparency. The second reinforcing part 31B may have light blocking property, for example, ultraviolet blocking property. For example, the second reinforcing part 31B may be black. The second reinforcing part 31B may have the same color as the substrate 20. The second reinforcing part 31B has a thickness of, for example, greater than or equal to 1 μm and less than or equal to 3 mm, and more preferably greater than or equal to 10 μm and less than or equal to 500 μm.

The second reinforcing part 31B has an elastic modulus of, for example, greater than or equal to 100 MPa, and more preferably greater than or equal to 1 GPa. Further, the elastic modulus of the second reinforcing part 31B may be greater than or equal to 100 times and less than or equal to 50000 times, and preferably greater than or equal to 1000 times and less than or equal to 10000 times the elastic modulus of the substrate 20.

The wiring board 10 according to the seventeenth modification is similar to that according to the seventh modification mentioned above, except that the support substrate 40 is designed to have anisotropy to thereby function as the first reinforcing part 31A. Accordingly, the method for manufacturing the wiring board 10 is not described in further detail below.

According to the seventeenth modification, the wiring board 10 includes the first reinforcing part 31A and the second reinforcing part 31B. This helps to more reliably prevent or inhibit appearance, in the control region 23, of the ridges 32 extending in different directions and crossing each other.

Although several modifications of the embodiment mentioned above have been described, it is of course also possible to suitably use a plurality of modifications in combination.

EXAMPLE

The present invention is now described in more specific detail by way of Examples and Comparative Examples. It is to be understood that the present invention is not limited to the specific details set forth in Examples below insofar as there is no departure from the scope of the present invention.

Example 1

<<Preparation of Substrate and Adhesive Layer>>

A pressure-sensitive adhesive sheet serving as the adhesive layer 60 was placed on a support base. Subsequently, polydimethylsiloxane (PDMS) for two-liquid adduct condensation was applied on the pressure-sensitive adhesive sheet at a thickness of 1.5 mm, and the PDMS was allowed to cure. A stack of the adhesive layer 60 and the substrate 20 was thus formed on the support base. The dimension of the substrate 20 in the first direction D1 was 80 mm, and the dimension of the substrate 20 in the second direction D2 was 80 mm. Subsequently, a portion of the stack was removed as a sample, and the elastic modulus of the substrate 20 was measured through tensile testing conducted in compliance with JIS K6251. The elastic modulus of the substrate 20 obtained as a result was 0.05 MPa.

<<Preparation of Support Substrate>>

A polyethylene naphthalate (PEN) film with a thickness of 2.5 μm was prepared as the support substrate 40. The dimension of the support substrate 40 in the first direction D1 was 30 mm, and the dimension of the support substrate 40 in the second direction D2 was 60 mm. Subsequently, a copper layer with a thickness of 1 μm was formed by vapor deposition on the first surface 41 of the support substrate 40. Subsequently, the copper layer was processed by photolithography and etching. The wiring 52 extending in the second direction D2 was thus obtained. The dimension of the wiring 52 in the second direction D2 was 40 mm. The dimension of the wiring 52 in the first direction D1 orthogonal to the second direction D2 was 500 μm.

Further, a portion of the support substrate 40 was removed as a sample, and the elastic modulus of the support substrate 40 was measured by tensile tensing that complies with ASTM D882. The elastic modulus of the support substrate 40 obtained as a result was 5.2 GPa.

Subsequently, ink containing dissolved urethane resin was applied onto the wiring 52 by screen printing to thereby form the reinforcing part 31 on the wiring 52. The resulting reinforcing part 31 was identical in shape to the wiring 52 in plan view. That is, the dimension of the reinforcing part 31 in the second direction D2 was 40 mm. The dimension of the reinforcing part 31 in the first direction D1 was 500 μm. Further, a portion of the reinforcing part 31 was removed as a sample, and the elastic modulus of the reinforcing part 31 was measured by tensile tensing that complies with ASTM D882. The elastic modulus of the reinforcing part 31 obtained as a result was 6.2 MPa.

<<Joining Step>>

Subsequently, the substrate 20 was elongated by 1.5 times along two axes corresponding to the first direction D1 and the second direction D2. Further, the substrate 20 that is being elongated by 1.5 times, and the support substrate 40 with the wiring 52 and the reinforcing part 31 being disposed over the support substrate 40 were joined to each other. More specifically, the adhesive layer 60 stacked on the substrate 20 was bonded onto a surface of the support substrate 40 over which the wiring 52 and the reinforcing part 31 are not disposed.

Subsequently, tensile stress was removed from the substrate 20 to contract the substrate 20 and the support substrate 40 joined to the substrate 20. As a result, the ridges 32 and the valleys 33 arranged in the second direction D2 in which the wiring 52 extends appeared on the wiring 52, the reinforcing part 31, and the support substrate 40 overlapping the reinforcing part 31. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Comparative Example

The wiring board 10 was fabricated in the same manner as with Example 1, except that the wiring 52 and the reinforcing part 31 were not disposed over the support substrate 40. In this case, ridges and valleys extending in irregular directions appeared irregularly on the wiring board 10. In other words, it was possible to control neither the direction in which ridges and valleys extend, nor the direction in which ridges and valleys are arranged.

Example 2

The wiring board 10 was fabricated in the same manner as with Example 1, except that the substrate 20 was made by using PDMS with an elastic modulus of 0.2 MPa. In this case, as with Example 1, the ridges 32 and the valleys 33 arranged in the second direction D2 in which the wiring 52 extends appeared on the wiring 52, the reinforcing part 31, and the support substrate 40 overlapping the reinforcing part 31. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Example 3

The wiring board 10 was fabricated in the same manner as with Example 1, except that the wiring 52 extending in the first direction D1 was formed on the first surface 41 of the support substrate 40, and then the reinforcing part 31 was formed on the wiring 52. The dimension of each of the wiring 52 and the reinforcing part 31 in the first direction D1 was 40 mm. The dimension of each of the wiring 52 and the reinforcing part 31 in the second direction D2 was 500 μm.

The ridges 32 and the valleys 33 arranged in the first direction D1 in which the wiring 52 extends appeared on the wiring 52, the reinforcing part 31, and the support substrate 40 overlapping the reinforcing part 31. The ridges 32 and the valleys 33 extended in a direction transverse to the first direction D1. The angle formed by the direction in which the ridges 32 and the valleys 33 extend, and the first direction D1 was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Example 4

The wiring board 10 was fabricated in the same manner as with Example 1, except that the wiring 52 and the reinforcing part 31 extend in a grid-like arrangement as illustrated in FIG. 11. The wiring 52 and the reinforcing part 31 each had a dimension of 1 mm in a direction orthogonal to the direction in which the wiring 52 and the reinforcing part 31 extend. The spacing T between two parallel portions of the wiring 52 (see FIG. 11) was 5 mm.

Figure 30:
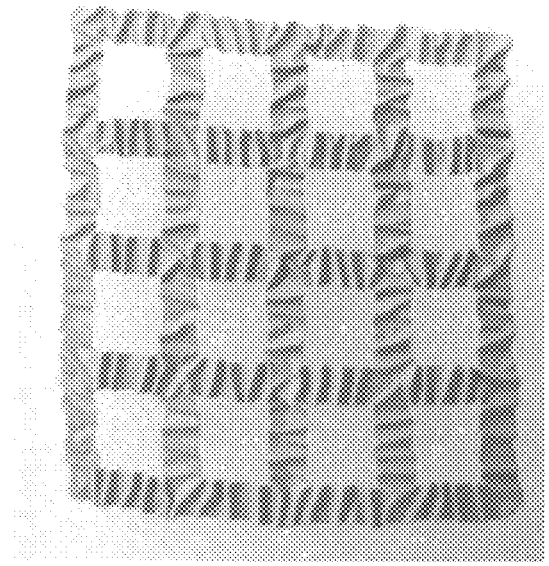
FIG. 30 is a photograph of the observation of a wiring board according to Example 4.
Figure 31:
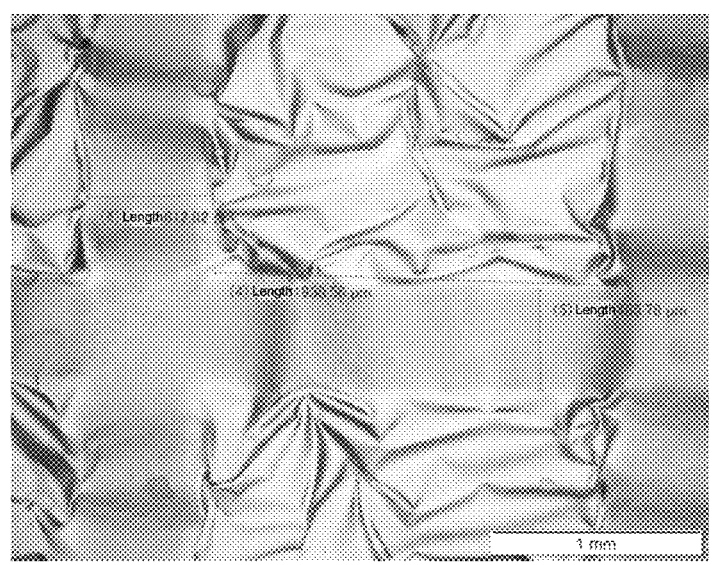
FIG. 31 is a magnified photograph of the wiring board according to Example 4.

FIG. 30 is a photograph of the observation of the wiring board 10, and FIG. 31 is a magnified photograph of the wiring board 10. The ridges 32 and the valleys 33 arranged in the direction in which the wiring 52 extends appeared on the wiring 52, the reinforcing part 31, and the support substrate 40 overlapping the reinforcing part 31. The angle formed by the direction in which the ridges 32 and the valleys 33 extend, and the direction in which the wiring 52 extends was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Example 5

The wiring board 10 was fabricated in the same manner as with Example 1, except that, as illustrated in FIG. 13, the wiring 52 and the reinforcing part 31 each include a portion extending in the first direction D1, a portion extending in the second direction D2, which is orthogonal to the first direction D1, and a portion located between the two portions mentioned above and extending in the third direction D3, which forms an angle of 45 degrees with the first direction D1 and the second direction D2. The portion extending in the first direction D1 had a length of 20 mm, and a width of 500 μm. The portion extending in the second direction D2 had a length of 20 mm, and a width of 500 μm. The portion extending in the third direction D3 had a length of 20 mm, and a width of 500 μm.

Figure 32:
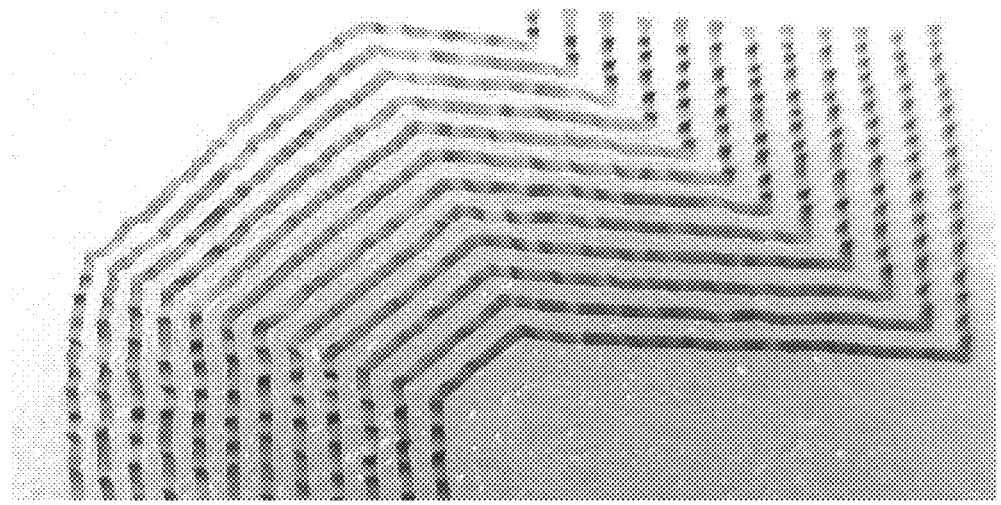
FIG. 32 is a photograph of the observation of a wiring board according to Example 5.
Figure 33:
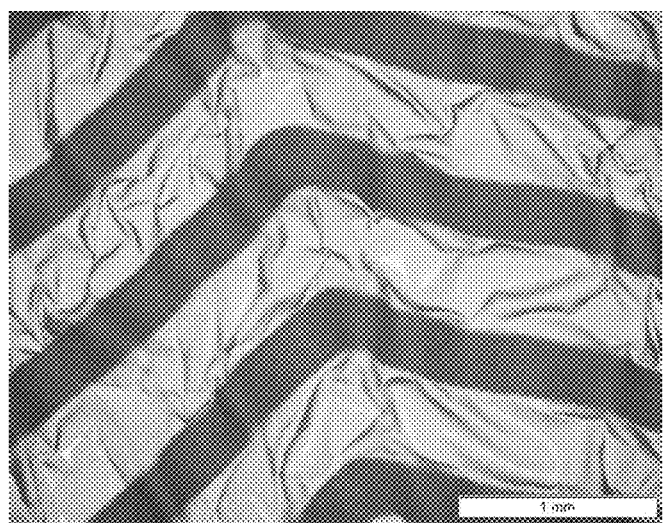
FIG. 33 is a magnified photograph of the wiring board according to Example 5.

FIG. 32 is a photograph of the observation of the wiring board 10, and FIG. 33 is a magnified photograph of the wiring board 10. The ridges 32 and the valleys 33 arranged in the direction in which the wiring 52 extends appeared on the wiring 52, the reinforcing part 31, and the support substrate 40 overlapping the reinforcing part 31. The angle formed by the direction in which the ridges 32 and the valleys 33 extend, and the direction in which the wiring 52 extends was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Example 6

The wiring board 10 was fabricated in the same manner as with Example 1, except that the wiring 52 and the reinforcing part 31 each have a horseshoe shape. The curved portion of the horseshoe shape had a radius of curvature of 5 mm. The wiring 52 and the reinforcing part 31 each had a dimension in a direction orthogonal to the direction in which the wiring 52 and the reinforcing part 31 extend, that is, a width of 200 μm.

Figure 34:
FIG. 34 is a photograph of the observation of a wiring board according to Example 6.
Figure 35:
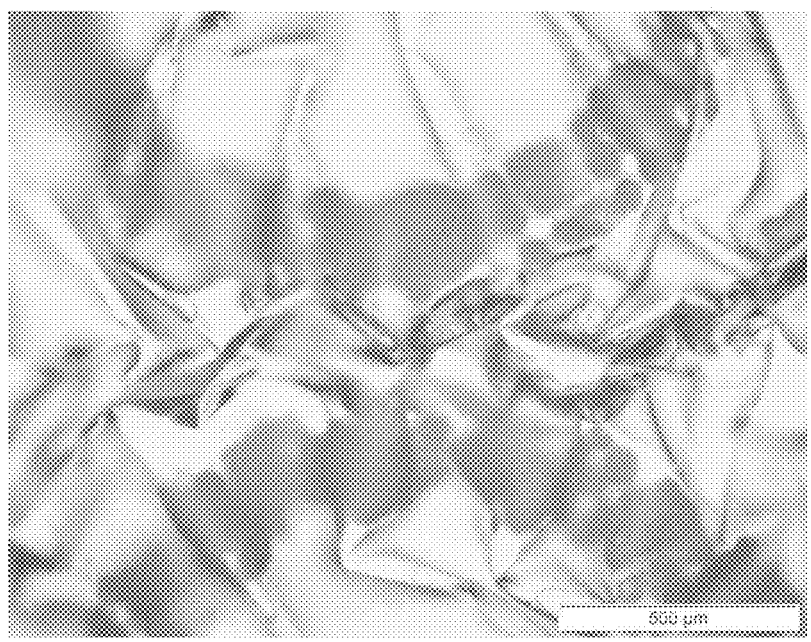
FIG. 35 is a magnified photograph of the wiring board according to Example 6.

FIG. 34 is a photograph of the observation of the wiring board 10, and FIG. 35 is a magnified photograph of the wiring board 10. The ridges 32 and the valleys 33 arranged in the direction in which the wiring 52 extends appeared on the wiring 52, the reinforcing part 31, and the support substrate 40 overlapping the reinforcing part 31. The angle formed by the direction in which the ridges 32 and the valleys 33 extend, and the direction in which the wiring 52 extends was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

Example 7

The wiring board 10 was fabricated in the same manner as with Example 1, except that as the reinforcing part 31 to be disposed on the support substrate 40, a reinforcing part was used that has, irrespective of its location in the second direction D2, a dimension of 400 μm in the first direction D1 orthogonal to the second direction D2 in which the wiring 52 extends.

For the wiring board 10, ridges and valleys arranged in the second direction D2 in which the wiring 52 extends and extending in a direction orthogonal to the second direction D2 appeared on the wiring 52, the reinforcing part 31, and a portion of the support substrate 40 overlapping the reinforcing part 31. As for the ridges appearing on the surface of the wiring board 10, each two adjacent ridges were separated by distances in the second direction D2 of 915 μm, 252 μm, 698 μm, 364 μm, and 830 μm. The mean distance between two adjacent ridges was 611 μm, and the standard deviation was 259 μm. In a region of the substrate 20 that does not overlap the reinforcing part 31, the ridges and the valleys extended in irregular directions.

Example 8

The wiring board 10 was fabricated in the same manner as with Example 1, except that the substrate 20 was made by using PDMS with an elastic modulus of 0.2 MPa, and a polyethylene terephthalate (PET) film with a thickness of 2.0 μm was used as the support substrate 40. In this case, as with Example 1, the ridges 32 and the valleys 33 arranged in the second direction D2 in which the wiring 52 extends appeared on the wiring 52, the reinforcing part 31, and the support substrate 40 overlapping the reinforcing part 31. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

The mean and standard deviation of the cycles of the ridges 32 on the wiring 52 were calculated. More specifically, at each of 40 locations on the wiring 52, the distance between two adjacent ridges 32 in the second direction D2 was measured. Then, the mean and standard deviation of the distances between the ridges 32 at the 40 locations were calculated. As a result, the mean distance was 750 μm, and the standard deviation was 247 μm. As the measuring instrument, NEXIV VMZ-H3030, which is a CNC image measuring system manufactured by Nikon Corporation, is usable. The following provides the specifications of the measurement instrument.

Magnification: 81 times
Field of view: 3 mm×3 mm

Example 9

The substrate 20 was fabricated in the same manner as with Example 2 by using PDMS with an elastic modulus of 0.2 MPa. The dimension of the substrate 20 in the first direction D1 was 80 mm, and the dimension of the substrate 20 in the second direction D2 was 80 mm.

As with the sixteenth modification mentioned above illustrated in FIGS. 45 to 47, wiring was formed on the reinforcing part 31 that is in the form of a film. More specifically, a polyethylene terephthalate (PET) film with a thickness of 2.0 μm was prepared as the reinforcing part 31. The dimension of the reinforcing part 31 in the first direction D1 was 30 mm, and the dimension of the reinforcing part 31 in the second direction D2 was 60 mm. Subsequently, a copper layer with a thickness of 1 μm was formed by vapor deposition on a surface of the reinforcing part 31. Subsequently, the copper layer was processed by photolithography and etching. The wiring 52 extending in the second direction D2 was thus obtained. The dimension of the wiring 52 in the second direction D2 was 40 mm. The dimension of the wiring 52 in the first direction D1 orthogonal to the second direction D2 was 500 μm. Subsequently, the reinforcing part 31 was cut in the second direction D2 such that the resulting reinforcing part 31 has a dimension of 900 μm in the first direction D1, and that the wiring 52 is located at the center of the reinforcing part 31 in the first direction D1. The distance in the first direction D1 from the wiring 52 to the outer edge of the reinforcing part 31 was 200 μm on each side of the wiring 52.

Subsequently, the substrate 20 was elongated by 1.5 times along two axes corresponding to the first direction D1 and the second direction D2. Further, the substrate 20 that is being elongated by 1.5 times, and the reinforcing part 31 with the wiring 52 disposed thereon were joined to each other. More specifically, the adhesive layer 60 stacked on the substrate 20 was bonded onto a surface of the reinforcing part 31 on which the wiring 52 is not disposed.

Subsequently, tensile stress was removed from the substrate 20 to contract the substrate 20 and the reinforcing part 31 joined to the substrate 20. As a result, the ridges 32 and the valleys 33 arranged in the second direction D2 in which the wiring 52 extends appeared on the wiring 52 and the reinforcing part 31. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees. No ridges 32 extending in different directions and crossing each other appeared on the wiring 52 and the reinforcing part 31. In a region of the substrate 20 that does not overlap the reinforcing part 31, the ridges and the valleys extended in irregular directions.

In the same manner as with Example 8, the mean and standard deviation of the cycles of the ridges 32 on the wiring 52 were calculated. As a result, the mean distance was 660 µm, and the standard deviation was 230 µm.

Example 10

In the same manner as with Example 9, the substrate 20, and the reinforcing part 31 with the wiring 52 disposed thereon were prepared. The reinforcing part 31 was cut in various ways under the condition in which the wiring 52 is located at the center of the reinforcing part 31 in the first direction D1, and thus 20 kinds of samples, Samples 1 to 20, illustrated in FIG. 53 were prepared. In FIG. 53, the "First Direction" and "Second Direction" fields in "Before Joining" respectively represent the dimension in the first direction D1 and the dimension in the second direction D2 of the reinforcing part 31 before the reinforcing part 31 is joined to the substrate 20. The "Ratio" field represents the dimension of the reinforcing part 31 in the second direction D2 divided by the dimension of the reinforcing part 31 in the first direction D1.

Subsequently, in the same manner as with Example 9, the substrate 20 was elongated by 1.5 times along two axes corresponding to the first direction D1 and the second direction D2. Further, the substrate 20 that is being elongated by 1.5 times, and the reinforcing part 31 with the wiring 52 disposed thereon were joined to each other. Subsequently, tensile stress was removed from the substrate 20 to contract the substrate 20 and the reinforcing part 31 joined to the substrate 20. Then, the dimensions in the first and second directions D1 and D2 of the reinforcing part 31 in plan view in its contracted state were measured. The results are given in the "First Direction" and "Second Direction" fields in "After Joining and Contraction" in FIG. 53. The "Ratio" field represents the dimension of the reinforcing part 31 in the second direction D2 divided by the dimension of the reinforcing part 31 in the first direction D1.

For Samples 1 and 5 for which the ratio after contraction is less than 1.1, the ridges and valleys extended in irregular directions. By contrast, for other samples for which the ratio after contraction is greater than or equal to 1.1, the ridges 32 and the valleys 33 arranged in the second direction D2 in which the wiring 52 extends appeared. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees.

Example 11

The substrate 20 was fabricated in the same manner as with Example 2 by using PDMS with an elastic modulus of 0.2 MPa. The dimension of the substrate 20 in the first direction D1 was 80 mm, and the dimension of the substrate 20 in the second direction D2 was 80 mm.

A polyethylene terephthalate (PET) film with a thickness of 2.0 µm was prepared as the first reinforcing part 31A. The dimension of the first reinforcing part 31A in the first direction D1 was 30 mm, and the dimension of the first reinforcing part 31A in the second direction D2 was 60 mm. Subsequently, in the same manner as with Example 9, the wiring 52 extending in the second direction D2 was formed on the first reinforcing part 31A. The dimension of the wiring 52 in the second direction D2 was 40 mm. The dimension of the wiring 52 in the first direction D1 orthogonal to the second direction D2 was 500 µm. Subsequently, in the same manner as with Example 1, ink containing dissolved urethane resin was applied onto the wiring 52 by screen printing to thereby form the second reinforcing part 31B on the wiring 52. Subsequently, the first reinforcing part 31A was cut in the second direction D2 such that the resulting first reinforcing part 31A has a dimension of 900 µm in the first direction D1, and that the wiring 52 is located at the center of the first reinforcing part 31A in the first direction D1. The distance in the first direction D1 from the wiring 52 to the outer edge of the first reinforcing part 31A was 200 µm on each side of the wiring 52.

Subsequently, the substrate 20 was elongated by 1.5 times along two axes corresponding to the first direction D1 and the second direction D2. Further, the substrate 20 that is being elongated by 1.5 times, and the first reinforcing part 31A with the wiring 52 and the second reinforcing part 31B being disposed over the first reinforcing part 31A were joined to each other. More specifically, the adhesive layer 60 stacked on the substrate 20 was bonded onto a surface of the first reinforcing part 31A over which the wiring 52 and the second reinforcing part 31B are not disposed.

Subsequently, tensile stress was removed from the substrate 20 to contract the substrate 20 and the first reinforcing part 31A joined to the substrate 20. As a result, the ridges 32 and the valleys 33 arranged in the second direction D2 in which the wiring 52 extends appeared on the wiring 52 and the first reinforcing part 31A. The ridges 32 and the valleys 33 extended in a direction transverse to the second direction D2. The angle formed by the direction in which the ridges 32 and the valleys 33 extend, and the second direction D2 was greater than or equal to 50 degrees and less than or equal to 140 degrees. No ridges 32 extending in different directions and crossing each other appeared on the wiring 52 and the first reinforcing part 31A. In a region of the substrate 20 that does not overlap the first reinforcing part 31A, the ridges and the valleys extended in irregular directions.

In the same manner as with Example 8, the mean and standard deviation of the cycles of the ridges 32 on the wiring 52 were calculated. As a result, the mean distance was 750 µm, and the standard deviation was 247 µm.

REFERENCE SIGNS LIST 10 wiring board
20 substrate
21 first surface
22 second surface
23 control region
231 first control region
232 second control region
233 third control region
26 non-control region
27 ridge
28 intersecting ridge group 30 covering part
31 reinforcing part
32 ridge
33 valley
34 protective layer
40 support substrate
41 first surface
42 second surface
51 electronic component
52 wiring
70 securing part

The invention claimed is:

1. A wiring board comprising:
a substrate that is stretchable, the substrate including a first surface and a second surface located opposite to the first surface;
wiring located at the first surface side of the substrate;
a reinforcing part that overlaps the wiring when viewed in a direction normal to the first surface of the substrate; and
a support substrate including polyethylene naphthalate, polyimide, polycarbonate, acrylic resin, or polyethylene terephthalate, wherein
the substrate includes a control region that overlaps the reinforcing part and the support substrate, and a non-control region that overlaps the support substrate but that does not overlap the reinforcing part, the non-control region being positioned to sandwich the control region in a direction orthogonal to a direction in which the wiring extends,
the control region includes a plurality of ridges located at the first surface side of the substrate, the plurality of ridges extending across the control region in a direction transverse to the direction in which the wiring extends, the plurality of ridges being arranged in the direction in which the wiring extends,
the non-control region includes a plurality of intersecting ridge groups located at the first surface side of the substrate, the plurality of intersecting ridge groups each including a plurality of ridges that extend in different directions and cross each other, and
the ridges in the control region have a width greater than a width of the ridges in the non-control region.

2. The wiring board according to claim 1, wherein the reinforcing part has a greater flexural rigidity or a greater elastic modulus than the substrate.

3. The wiring board according to claim 1, wherein the reinforcing part is located at the first surface side of the substrate.

4. The wiring board according to claim 2, wherein the wiring is located between the substrate and the reinforcing part.

5. The wiring board according to claim 2, wherein the reinforcing part is located between the substrate and the wiring.

6. The wiring board according to claim 1, wherein a dimension of the control region in the direction in which the wiring extends is greater than a dimension of the control region in the direction orthogonal to the direction in which the wiring extends.

7. The wiring board according to claim 1, wherein a dimension of the control region in the direction in which the wiring extends is greater than or equal to 1.5 times a dimension of the control region in the direction orthogonal to the direction in which the wiring extends.

8. A wiring board comprising:
a substrate that is stretchable, the substrate including a first surface and a second surface located opposite to the first surface;
wiring located at the first surface side of the substrate;
a reinforcing part that overlaps the wiring when viewed in a direction normal to the first surface of the substrate, and
a support substrate including polyethylene naphthalate, polyimide, polycarbonate, acrylic resin, or polyethylene terephthalate, wherein
the substrate includes a control region that overlaps the reinforcing part and the support substrate, and a non-control region that overlaps the support substrate but that does not overlap the reinforcing part, the non-control region being positioned to sandwich the control region in a direction orthogonal to a direction in which the wiring extends,
the control region includes a plurality of ridges located at the first surface side of the substrate, the plurality of ridges extending across the control region in a direction transverse to the direction in which the wiring extends, the plurality of ridges being arranged in the direction in which the wiring extends,
the non-control region includes a plurality of intersecting ridge groups located at the first surface side of the substrate, the plurality of intersecting ridge groups each including a plurality of ridges that extend in different directions and cross each other, and
the ridges in the control region have an amplitude greater than an amplitude of the ridges in the non-control region.

9. A wiring board comprising:
a substrate that is stretchable, the substrate including a first surface and a second surface located opposite to the first surface;
wiring located at the first surface side of the substrate;
a reinforcing part that overlaps the wiring when viewed in a direction normal to the first surface of the substrate, and
a support substrate including polyethylene naphthalate, polyimide, polycarbonate, acrylic resin, or polyethylene terephthalate, wherein
the substrate includes a control region that overlaps the reinforcing part and the support substrate, and a non-control region that overlaps the support substrate but that does not overlap the reinforcing part, the non-control region being positioned to sandwich the control region in a direction orthogonal to a direction in which the wiring extends,
the control region includes a plurality of ridges located at the first surface side of the substrate, the plurality of ridges extending across the control region in a direction transverse to the direction in which the wiring extends, the plurality of ridges being arranged in the direction in which the wiring extends,
the non-control region includes a plurality of intersecting ridge groups located at the first surface side of the substrate, the plurality of intersecting ridge groups each including a plurality of ridges that extend in different directions and cross each other,
the control region includes a plurality of ridges located at the second surface side of the substrate, and
the ridge located at the second surface side of the substrate has an amplitude smaller than an amplitude of the ridge located at the first surface side of the substrate.

10. The wiring board according to claim 1, wherein the substrate includes a thermoplastic elastomer, a silicone rubber, a urethane gel, or a silicone gel.

11. The wiring board according to claim 1, wherein the support substrate has a greater elastic modulus than the substrate, and supports the wiring.

12. The wiring board according to claim 1, wherein the support substrate is located between the wiring and the first surface of the substrate, and supports the wiring.

13. The wiring board according to claim 1, wherein the support substrate is located between the substrate and the reinforcing part.

14. The wiring board according to claim 1, further comprising an electronic component electrically connected to the wiring.

15. A method for manufacturing a wiring board, comprising: an elongation step of elongating a substrate by applying tensile stress to the substrate in a first direction and in a second direction transverse to the first direction, the substrate being stretchable; a wiring step of disposing wiring at a location adjacent to a first surface of the substrate that is in an elongated state; and a contraction step of removing the tensile stress from the substrate, wherein the wiring board includes a reinforcing part, the reinforcing part overlapping the wiring when viewed in a direction normal to the first surface of the substrate, and a support substrate including polyethylene naphthalate, polyimide, polycarbonate, acrylic resin, or polyethylene terephthalate, wherein the substrate includes a control region that overlaps the reinforcing part, support substrate and the wiring, and a non-control region that overlaps the support substrate but that does not overlap the reinforcing part, the non-control region being positioned to sandwich the control region in a direction orthogonal to a direction in which the wiring extends, the control region includes a plurality of ridges located at the first surface side of the substrate, the plurality of ridges extending across the control region in a direction transverse to the direction in which the wiring extends, the plurality of ridges being arranged in the direction in which the wiring extends, the non-control region includes a plurality of intersecting ridge groups located at the first surface side of the substrate, the plurality of intersecting ridge groups each including a plurality of ridges that extend in different directions and cross each other, and the ridges in the control region have a width greater than a width of the ridges in the non-control region.

16. The method according to claim 15 for manufacturing a wiring board, wherein the reinforcing part has a greater flexural rigidity or a greater elastic modulus than the substrate.

17. The method according to claim 15 for manufacturing a wiring board, wherein a dimension of the control region in the direction in which the wiring extends is greater than a dimension of the control region in the direction orthogonal to the direction in which the wiring extends.

18. The method according to claim 15 for manufacturing a wiring board, wherein a dimension of the control region in the direction in which the wiring extends is greater than or equal to 1.5 times a dimension of the control region in the direction orthogonal to the direction in which the wiring extends.

19. The method according to claim 15 for manufacturing a wiring board, further comprising
a wiring preparation step of disposing the wiring on a support substrate,
wherein the wiring step includes a joining step of joining the support substrate on which the wiring is disposed, to the substrate in its elongated state from the first surface side.

20. The wiring board according to claim 1, wherein the non-control region has a dimension that is greater than a dimension of the control region in the direction orthogonal to the direction in which the wiring extends.

* * * * *